(12) United States Patent
Sakata et al.

(10) Patent No.: US 6,289,469 B1
(45) Date of Patent: *Sep. 11, 2001

(54) SEMICONDUCTOR INTEGRATED CIRCUIT HAVING A PLURALITY OF PROCESSING CIRCUITS RESPECTIVELY EXECUTING NECESSARY PROCESSES AND A PLURALITY OF DATA HOLDING CIRCUITS CORRESPONDING TO THE PROCESSING CIRCUITS

(75) Inventors: Yoshio Sakata; Yoshio Tokuno; Junichi Tamura; Yumiko Uehara, all of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,328

(22) Filed: Aug. 25, 1998

(30) Foreign Application Priority Data

Sep. 4, 1997 (JP) .................................................. 9-239816

(51) Int. Cl.[7] .................................................. G06F 1/04
(52) U.S. Cl. .......................... 713/600; 713/300; 713/601; 711/167

(58) Field of Search .................................... 713/600, 601, 713/300, 310, 320, 322, 323, 324, 330; 711/118, 167

(56) References Cited

U.S. PATENT DOCUMENTS

| 5,418,933 | * | 5/1995 | Kimura et al. | 395/550 |
| 5,894,548 | * | 4/1999 | Horie | 395/183.06 |
| 5,917,832 | * | 6/1999 | Baeg et al. | 371/21.1 |
| 5,941,990 | * | 8/1999 | Hiiragizawa | 713/310 |
| 5,978,944 | * | 11/1999 | Parvathala et al. | 714/726 |
| 6,047,394 | * | 4/2000 | Matsuzawa | 714/729 |

FOREIGN PATENT DOCUMENTS 5-150003   6/1993   (JP) .

* cited by examiner

Primary Examiner—Thomas Lee
Assistant Examiner—Thuan Du
(74) Attorney, Agent, or Firm—Jones Volentine, PLLC

(57) ABSTRACT

A control signal generating circuit for generating control signals, based on a first clock signal, a second clock signal and a mode setting signal, and a plurality of scanpath circuits. Operation of each of the scanpath circuits is controlled according to the generated control signals. The control signal generating circuit and scanpath circuits are provided in a semiconductor integrated circuit having reduced size.

18 Claims, 34 Drawing Sheets

SEMICONDUCTOR INTEGRATED CIRCUIT HAVING A PLURALITY OF PROCESSING CIRCUITS RESPECTIVELY EXECUTING NECESSARY PROCESSES AND A PLURALITY OF DATA HOLDING CIRCUITS CORRESPONDING TO THE PROCESSING CIRCUITS

BACKGROUND OF THE INVENTION

1. Field of the Invention

This invention relates to a semiconductor integrated circuit such as a digital signal processor (DSP), a microprocessor or the like, which incorporates a plurality of processing circuits for performing necessary processes therein, and particularly to a semiconductor integrated circuit having a plurality of data holding circuits for respectively effecting logic verification on processing circuits.

2. Description of the Related Art

A semiconductor integrated circuit such as a DSP or a microprocessor has a plurality of processing circuits incorporated therein for respectively performing necessary processes. In the present semiconductor integrated circuit, each of the processing circuits indicates a combinational logic circuit comprised of a combination of logic circuits such as an AND circuit, an OR circuit, etc. A logical level of a signal outputted from the processing circuit is determined to a predetermined logical level according to a logical level of a signal inputted thereto. However, when defects or defective conditions due to a variation with time occur in the processing circuit, the output signal results in a logical level different from a desired logical level with respect to the logical level of the input signal. It is thus of importance that logic verification is effected on the semiconductor integrated circuit having such processing circuits to verify whether or not the processing circuit functions normally.

A plurality of scanpath circuits (also called "scanpath registers") are used in the semiconductor integrated circuit with the objective of executing such logic verification. The scanpath circuits are made up of data holding circuits and the like respectively. Upon a normal operation (i.e., which means the performance of the original processing operation on the signal inputted from the outside of the semiconductor integrated circuit) of the semiconductor integrated circuit, each of the scanpath circuits operates so as to transfer the received input signal to its corresponding processing circuit or output a signal outputted from the corresponding processing circuit to the next-stage circuit. Here, the next-stage circuit is a circuit for receiving the signal outputted from the processing circuit therein and effecting desired processing on it. Upon operation for effecting the logic verification on the corresponding processing circuit, the scanpath circuits constitute shift registers provided in cascade connections.

As a circuit configuration of each scanpath circuit, one is known which has heretofore been disclosed in the following reference:

Japanese Patent Application Laid-Open No. 05-150003.

Various demands have recently been made to the semiconductor integrated circuit. It is desired to bring the semiconductor integrated circuit into less size as one of the demands. One method of achieving this object or purpose is to reduce the scale of circuits incorporated into the semiconductor integrated circuit.

It is also desirable to reduce power consumption as another demand.

It is desired to make a reduction in clock skew (timing shift of a clock signal) as a further demand. Namely, since a plurality of scanpath circuits are connected in tandem so as to constitute shift registers, it is necessary to activate all the scanpath circuits in synchronism with each other.

As a still further demand, the storage of a predetermined initial value in a control register or a flag register or the like upon resetting of hardware is essential for the semiconductor integrated circuit if the semiconductor integrated circuit is the DSP or the microprocessor or the like.

There is often a still further demand for always supplying a clock signal to each scanpath circuit and storing therein a data signal inputted as needed.

The scanpath circuit disclosed in the above-described reference did not necessarily meet these demands. It has therefore been desired to allow the advent of a scanpath circuit for satisfying the above-described demands.

SUMMARY OF THE INVENTION

In order to solve the foregoing problems, there is provided a semiconductor integrated circuit including, a plurality of processing circuits for respectively executing necessary processes;

a plurality of data holding circuits respectively provided so as to correspond to the plurality of processing circuits, the plurality of data holding circuits being respectively activated independently upon a first operating mode and activated as shift registers by being cascade-connected upon a second operating mode;

each data holding circuit including, a first data input terminal supplied with a signal outputted from the corresponding processing circuit;

a second data input terminal supplied with a signal or desired data outputted from the other data holding circuit;

a first output terminal; and a clock input terminal supplied with a clock signal, each data holding circuit permitting either the input of the signal from the first data input terminal or the input of the signal from the second data input terminal in response to first and second control signals, storing therein the signal inputted from the data input terminal subjected to the input permission, in response to the clock signal and outputting the signal from the first output terminal;

a first clock input terminal supplied with a first clock signal employed in a first operating mode;

a second clock input terminal supplied with a second clock signal employed in a second operating mode;

an operating mode input terminal supplied with an operating mode setting signal for performing switching between the first operating mode and the second operating mode; and a control signal generating circuit for generating and outputting at least the first and second control signals, based on states of the signals inputted to the respective input terminals and outputting either the first or second clock signal as the clock signal received by each data holding circuit. The above object can be achieved by this construction.

According to a semiconductor integrated circuit as defined in a further embodiment, each data holding circuit has a second output terminal separated from the output terminal, for outputting a signal similar to that outputted from the output terminal. The above object can be achieved even by this construction.

According to a semiconductor integrated circuit as defined in another embodiment, each data holding circuit has a circuit for prohibiting the output of a signal from the first output terminal or the second output terminal in response to the operating mode setting signal. The above object can be achieved even by this construction.

According to a semiconductor integrated circuit as defined in another embodiment, the signals outputted from the control signal generating circuit are commonly inputted to the plurality of data holding circuits. The above object can be achieved even by this construction.

According to a semiconductor integrated circuit as defined in another embodiment, each data holding circuit has a setting circuit capable of setting an initial value according to a setting signal. The above object can be achieved even by this construction.

According to a semiconductor integrated circuit as defined in another embodiment, each data holding circuit has a data holding control circuit for prohibiting the input of the signals from the first and second data input terminals and holding the prestored data according to a holding signal. The above object can be achieved even by this construction.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

(First Embodiment)

Figure 1:
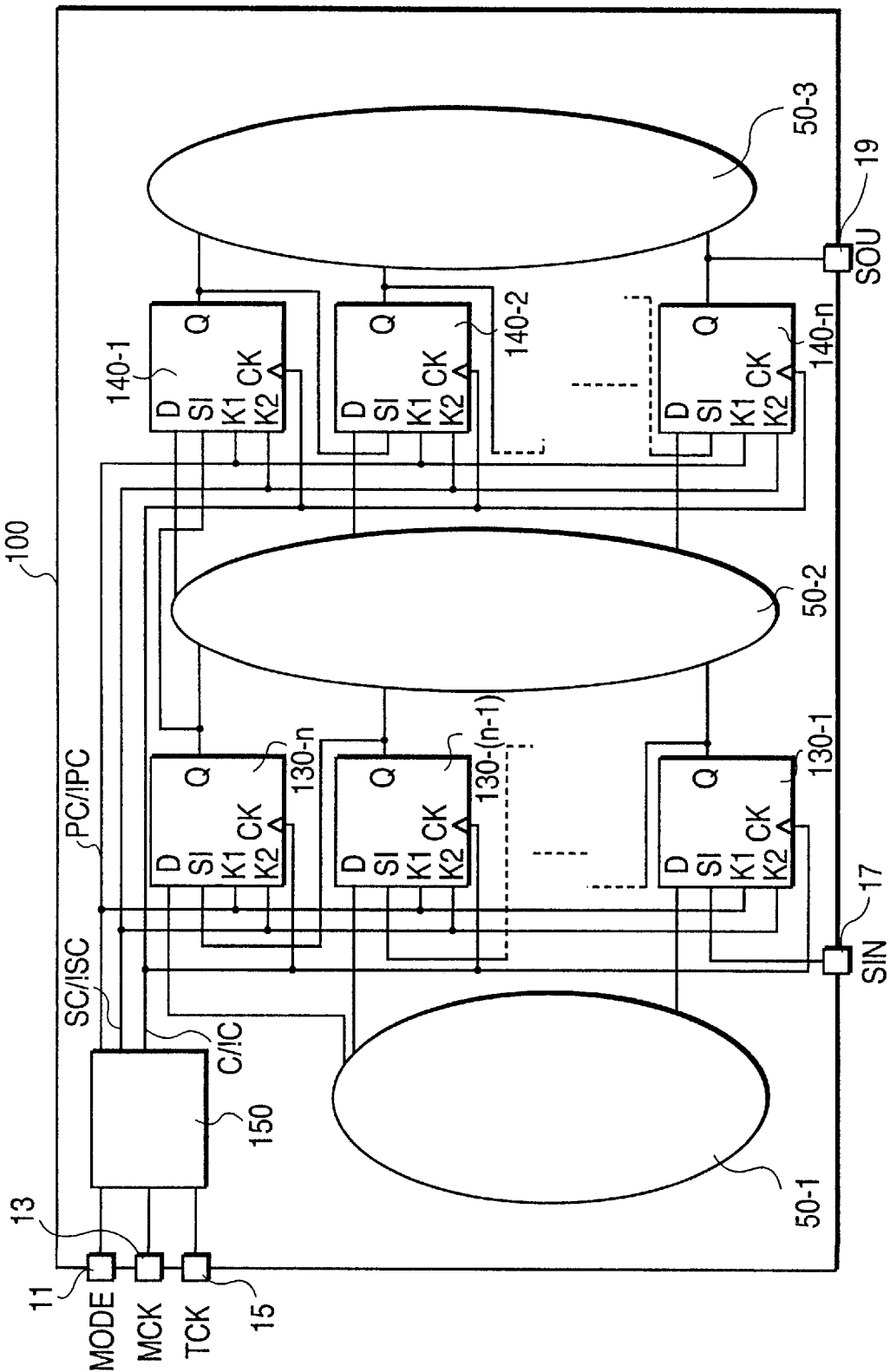
FIG. 1 is a block diagram showing a configuration of a semiconductor integrated circuit with scanpath circuits incorporated therein, according to a first embodiment of the present invention.

FIG. 1 is a block diagram showing a configuration of a semiconductor integrated circuit illustrating a first embodiment of the present invention.

Referring to FIG. 1, a semiconductor integrated circuit 100 has a plurality of processing circuits 50-1 through 50-3. The semiconductor integrated circuit 100 has a mode setting signal input terminal 11, a first clock input terminal 13, a second clock input terminal 15, a scanpath data input terminal 17 and a scanpath data output terminal 19 as signal terminals used for transferring signals between the semiconductor integrated circuit 100 and the outside. The mode setting signal input terminal 11 is inputted or supplied with a mode setting signal MODE for providing switching between serial and parallel operations of each of scanpath circuits to be described later. The first clock input terminal 13 is supplied with a first clock signal MCK employed upon a normal operation corresponding to a first operating state. The second clock input terminal 15 is supplied with a second clock signal TCK employed upon a logic verifying operation corresponding to a second operating state. The scanpath data input terminal 17 is supplied with a data signal SIN used for logic verification upon the logic verifying operation. The scanpath data output terminal 19 outputs a data signal SOU corresponding to the result of logic verification therefrom.

The semiconductor integrated circuit 100 according to the present invention further includes scanpath circuits 130-1 through 130-n (n: positive integer) and 140-1 through 140-n each indicative of a holding circuit, and a control signal generating circuit 150.

The scanpath circuit 130 (or 140)-K (K: positive integer, 1_K_n) has a clock input terminal CK, a first data input terminal D, a second data input terminal SI, a first control signal input terminal K1, a second control signal input terminal K2 and an output terminal Q. The control signal generating circuit 150 is electrically connected to the mode setting signal input terminal 11, the first clock input terminal 13 and the second clock input terminal 15. Further, the control signal generating circuit 150 generates a plurality of control signals (such as a control signal C/!C, a control signal PC/!PC and a control signal SC/!SC). Here, the control signal C/!C indicates either one or both of a control signal C and an inverse control signal !C having a logic level complementary to a logic level of the control signal C. The control signal PC/!PC and the control signal SC/!SC are similar to the control signal C/!C. Symbol "!" indicates a signal having a complementary logic level. In the description of the present embodiment, the present symbol indicates both control signals (e.g., the control signal PC/!PC indicates a control signal PC and an inverse control signal !PC). Thus, the number of signal lines for respectively transmitting the control signal C/!C, the control signal PC/!PC and the control signal SC/!SC is represented as only one in FIG. 1. In the present embodiment, however, two signal lines for respectively transmitting the control signal and the inverse control signal will be represented as one.

The control signal C/!C is inputted to the clock input terminal CK of the scanpath circuit 130 (or 140)-K. The control signal PC/!PC is inputted to the first control signal input terminal K1 of the scanpath circuit 130 (or 140)-K. The control signal SC/!SC is inputted to the second control signal input terminal K2 of the scanpath circuit 130 (or 140)-K. The number of the control signals inputted to the individual terminals are two. Thus, the clock input terminal CK, the first control signal input terminal K1 and the second control signal input terminal K2 of the scanpath circuit 130 (or 140)-K will be defined respectively so that two terminals are represented as one terminal.

A signal outputted from the processing circuit 50-1 is inputted to the first data input terminal D of the scanpath circuit 130-K. A signal outputted from the processing circuit 50-2 is inputted to the first data input terminal D of the scanpath circuit 140-K. The second data input terminal SI of the scanpath circuit 130-K is electrically connected to the output terminal Q of its corresponding scanpath circuit 130-(K−1). However, if K=1, then the second data input terminal SI is electrically connected to the scanpath data input terminal 17. The second data input terminal SI of the scanpath circuit 140-K is electrically connected to the output terminal Q of its corresponding scanpath circuit 140-(K−1). However, if K=1, then the second data input terminal SI is electrically connected to the output terminal Q of the scanpath circuit 130-n. Further, the output terminal Q of the scanpath circuit 130-K is electrically connected also to the processing circuit 50-2 and the output terminal Q of the scanpath circuit 140-K is electrically connected also to the processing circuit 50-3. However, if K=n, then the output terminal Q is electrically connected also to the scanpath data output terminal 19.

Now, a procedure for effecting logic verification on each processing circuit by using the scanpath circuit is as follows:

(1) Test serial input operation:

Data (hereinafter also called "test vector") SIN for logic verification is serially inputted from the scanpath data input terminal 17. Further, the test vector SIN is stored in all the scanpath circuits 130-1 through 130-n and 140-1 through 140-n in accordance with a shift operation. This is performed according to the second clock signal TCK.

(2) Test parallel operation:

The test vector SIN stored in each of the scanpath circuits disposed on the input side of the processing circuit intended for logic verification is inputted to its corresponding processing circuit. An output produced from the processing circuit corresponding to the test vector SIN is stored in the corresponding scanpath circuit disposed on the output side of the processing circuit intended for logic verification. This is carried out according to the second clock signal TCK. Namely, if the processing circuit intended for logic verification is regarded as the processing circuit 50-2 in FIG. 1, then the scanpath circuits on the input side thereof are found to be the scanpath circuits 130-1 through 130-n and the scanpath circuits on the output side thereof are found to be the scanpath circuits 140-1 through 140-n. If the processing circuit intended for logic verification is regarded as the processing circuit 50-1, then unillustrated scanpath circuits exist as the scanpath circuits on the input side thereof and the scanpath circuits on the output side thereof are found to be the scanpath circuits 130-1 through 130-n. Similarly, if the processing circuit intended for logic verification is regarded as the processing circuit 50-3, then the scanpath circuits on the input side thereof are found to be the scanpath circuits 140-1 through 140-n and unillustrated scanpath circuits exist as the scanpath circuits on the output side thereof.

(3) Test serial output operation:

An output result SOU of the processing circuit, which has been stored in the scanpath circuit on the output side, is serially outputted from the scanpath data output terminal 19 in accordance with a shift operation. This is performed according to the second clock signal TCK.

(4) Comparison with expected value:

A comparison is performed between data outputted from the scanpath data output terminal 19 and an expected value. The expected value indicates data to be outputted where the processing circuit 50-2 is properly operated when the test vector SIN stored in each of the scanpath circuits 130-1 through 130-n is inputted to the processing circuit 50-2. Namely, when the data SOU outputted from the scanpath data output terminal 19 and the expected value are all coincident with each other, the processing circuit 50-2 can be determined to be normal. When, on the other hand, the data SOU outputted from the scanpath data output terminal 19 and the expected value do not coincide with each other, the processing circuit 50-2 can be judged to be improper or abnormal.

Figure 2:
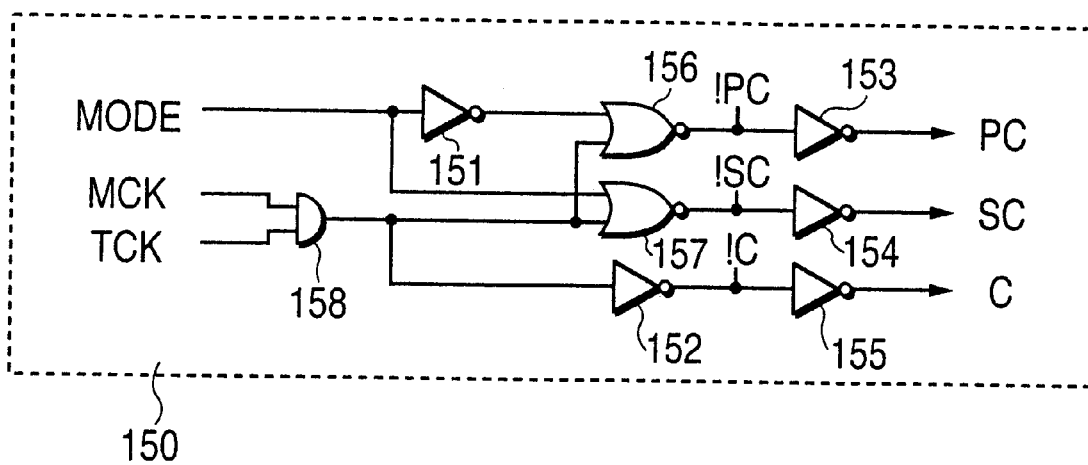
FIG. 2 is a diagram showing a configuration of a control signal generating circuit 150 employed in the first embodiment of the present invention.
Figure 3:
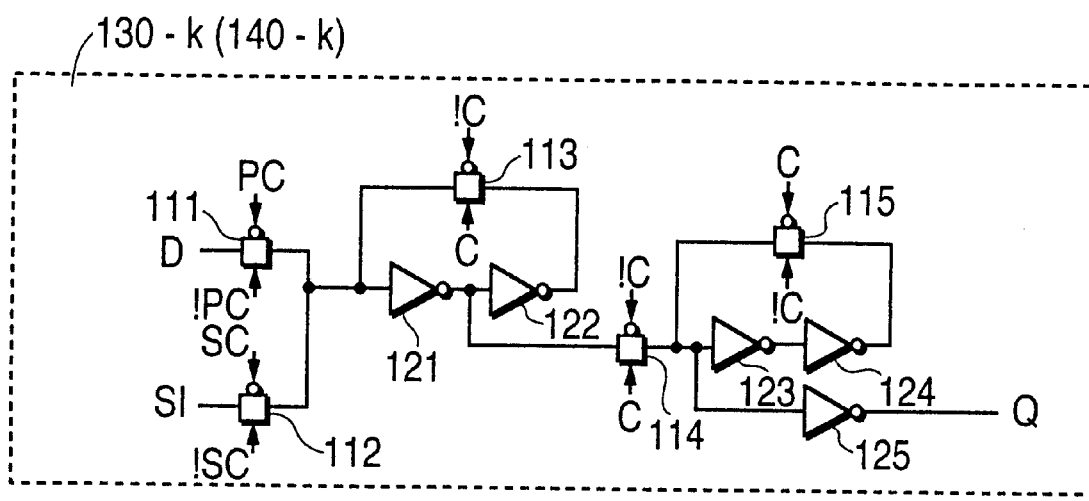
FIG. 3 is a diagram illustrating a configuration of a scanpath circuit 130 (or 140)-K employed in the first embodiment of the present invention.

Detailed circuit configurations of the control signal generating circuit 150 and the scanpath circuit 130 (or 140)-K will now be described with reference to the drawings. FIG. 2 is a circuit diagram showing the control signal generating circuit 150 and FIG. 3 is a circuit diagram illustrating the scanpath circuit 130 (or 140)-K.

Referring to FIG. 2, the control signal generating circuit 150 comprises five inverters 151 through 155, two two-input NOR gates 156 and 157, and one two-input AND gate 158 (the two-input NOR gate and the two-input AND gate will hereinafter be called "NOR" and "AND" respectively). A mode setting signal MODE is connected or inputted to an input terminal of the inverter 151 and a first input terminal of the NOR 157. An output of the inverter 151 is inputted to a first input terminal of the NOR 156. A first clock signal MCK for the normal operation and a second clock signal TCK for the logic verifying operation are inputted to first and second input terminals of the AND 158, respectively. An output of the AND 158 is inputted to a second input terminal of the NOR 157, a second input terminal of the NOR 156 and an input terminal of the inverter 152. An output of the NOR 156 is outputted as a first control signal PC/!PC. Namely, the output of the NOR 156 is outputted as the control signal !PC as it is and is outputted as the control signal PC through the inverter 153. An output of the NOR 157 is outputted as a second control signal SC/!SC. Namely, the output of the NOR 157 is outputted as the control signal !SC as it is and is outputted as the control signal SC through the inverter 154. An output of the inverter 152 is outputted as a third control signal C/!C. Namely, the output of the inverter 152 is outputted as the control signal !C and is outputted as the control signal C through the inverter 155.

The control signal generating circuit 150 constructed in this way is activated as follows: As described above, the mode setting signal MODE is a signal for selecting either of the serial and parallel operations of the scanpath circuit. When the mode setting signal MODE is of a low potential level (hereinafter called "L level"), the serial operation is selected. When, on the otherhand, themode setting signal MODE is of a high potential level (hereinafter called "H level"), the parallel operation is selected. When the mode setting signal MODE is of the L level, an H level signal is inputted to the first input terminal of the NOR 156 through the inverter 151 and an L level signal is inputted to the first input terminal of the NOR 157. Therefore, the output signal of the NOR 156 is fixed to the L level. Thus, the control signal !PC is brought to the L level and the control signal PC is brought to the H level as the output of the inverter 153. Either one of the first clock signal MCK and the second clock signal TCK inputted to the AND 158 is fixed to the H level. If the first clock signal MCK is fixed to the H level, for example, then the output signal of the AND 158 becomes similar to the second clock signal TCK. If the second clock signal TCK is fixed to the H level, then the output signal of the AND 158 becomes similar to the first clock signal MCK. Therefore, the output of the NOR 157 results in a signal having a potential level which is obtained by inverting the output signal of the AND 158 and is outputted as the control signal !SC. The control signal SC results in a signal having a potential level similar to that at the AND 158 through the inverter 154. Further, the control signal !C also results in a signal having a potential level which is obtained by inverting the output signal of the AND 158 through the inverter 152. Moreover, the control signal C results in a signal having a potential level similar to that at the AND 158 through the inverter 155.

Next, when the mode setting signal MODE is of the H level, an L level signal is inputted to the first input terminal of the NOR 156 through the inverter 151 and an H level signal is inputted to the first input terminal of the NOR 157. Therefore, the output signal of the NOR 157 is fixed to the L level. Thus, the control signal !SC is brought to the L level and the control signal SC is brought to the H level through the inverter 154. In a manner similar to the above, either one of the first clock signal MCK and the second clock signal TCK inputted to the AND 158 is fixed to the H level. Therefore, the output of the NOR 156 results in a signal having a potential level which is obtained by inverting the output signal of the AND 158 and is outputted as the control signal !PC. The control signal PC results in a signal having a potential level similar to that at the AND 158 through the inverter 153. Further, the control signal !C also results in a signal having a potential level which is obtained by inverting the output signal of the AND 158 through the inverter 152. Moreover, the control signal C results in a signal having a potential level similar to that at the AND 158 through the inverter 155.

Referring to FIG. 3, the scanpath circuit 130 (or 140)-K comprises five transfer gates 111 through 115 and five inverters 121 through 125. A data signal D inputted from a first data signal input terminal D is connected or inputted to an input terminal of the inverter 121 through the transfer gate 111. Data SI inputted from a second data signal input terminal SI is inputted to the input terminal of the inverter 121 through the transfer gate 112. The output of the inverter 121 is connected to an input terminal of the inverter 122. The output of the inverter 122 is connected to the input terminal of the inverter 121 through the transfer gate 113. The output of the inverter 121 is connected to an input terminal of the inverter 123 through the transfer gate 114 and outputted from an output terminal Q through the inverter 125 as a data output signal Q. The output of the inverter 123 is connected to an input terminal of the inverter 124. The output of the inverter 124 is connected to the input terminal of the inverter 123 through the transfer gate 115. The transfer gates 111 through 115 are respectively comprised of P channel MOS transistors (hereinafter called "PMOS") and N channel MOS transistors (hereinafter called "NMOS") electrically connected in a parallel combination. The control signal PC of the respective control signals outputted from the control signal generating circuit 150 is inputted to the gate of the PMOS of the transfer gate 111, whereas the control signal !PC is inputted to the gate of the NMOS thereof. The control signal SC is inputted to the gate of the PMOS of the transfer gate 112, whereas the control signal !SC is inputted to the gate of the NMOS thereof. Further, the control signal C is inputted to the gate of the NMOS of the transfer gate 113, the gate of the NMOS of the transfer gate 114 and the gate of the PMOS of the transfer gate 115. Similarly, the control signal !C is inputted to the gate of the PMOS of the transfer gate 113, the gate of the PMOS of the transfer gate 114 and the gate of the NMOS of the transfer gate 115.

The scanpath circuit 130 (or 140)-K constructed in this way is activated as follows: When the mode setting signal is of the L level, the control signal PC is brought to the H level and the control signal !PC is brought to the L level as described above. Thus, the transfer gate 111 is brought to an off state. Therefore, the input data signal D is not brought to the scanpath circuit 130 (or 140)-K. The control signal SC and the control signal !SC are repeatedly turned on and off according to one clock signal outputted from the AND 158. Namely, the scanpath circuit 130 (or 140)-K successively captures the successively input data signals SI in response to the turning on/off operation of the transfer gate 112. Now, a first latch unit is made up of the inverter 121, the inverter 122 and the transfer gate 113 and a second latch unit comprises the inverter 123, the inverter 124 and the transfer gate 115. The transfer gate 113 and the transfer gate 115 are controlled according to the control signals C and !C but their on/off operations are complementary. Thus, operations for holding data signals in the first and second latch units are also complementary.

Let's now assume that data A and B are successively inputted as data signals SI to provide clear understanding of the description of the operation referred to above. When the control signal SC is brought to the L level and the control signal !SC becomes the H level, the transfer gate 112 is first turned on so as to receive the data A therein. Since, at this time, the control signal C is brought to the L level and the control signal !C is brought to the H level, the transfer gates 113 and 114 are turned off and the transfer gate 115 is turned on. Thus, the data signal A is inputted via the inverters 121 and 122 and is not transferred to the second latch unit.

Next, when the control signal SC is brought to the H level and the control signal !SC is brought to the L level, the transfer gate 112 is turned off so as to prohibit the input of the data signals SI. Since, at this time, the control signal C reaches the H level and the control signal !C reaches the L level, the transfer gate 113 and the transfer gate 114 are turned on and the transfer gate 115 is turned off. Thus, the first latch unit holds the data A therein. The output of the inverter 121 is outputted as the output signal Q through the transfer gate 114 and the inverter 125. The output signal Q has a potential level similar to that of the data A. Further, the output of the inverter 121 is transferred even to the second latch unit.

Next, when the control signal SC and the control signal !SC are respectively brought to the L and H levels again, the transfer gate 112 is turned on so as to receive the data B therein. Since, at this time, the control signal C is brought to the L level and the control signal !C is brought to the H level, the transfer gates 113 and 114 are turned off and the transfer gate 115 is turned on. Therefore, the transferred data A is fed back to the input terminal of the inverter 123 through the inverters 123 and 124 and the transfer gate 115 in the second latch unit. This state is maintained in the second latch unit. Thus, the second latch unit holds the previous data A therein. On the other hand, the data signal B is not transferred to the second latch unit because the transfer gate 114 is in an off state. Incidentally, the data A held in the second latch unit is outputted from the output terminal Q. The same operation as described above is hereafter performed as data C and D are successively input.

When the mode setting signal is H in level, the control signal SC is brought to the H level and the control signal !SC is brought to the L level as described above. Thus, the transfer gate 112 is turned off. Therefore, the input data signal SI is not brought to the scanpath circuit 130 (or 140)-K. The control signal PC and the control signal !PC are repeatedly turned on and off according to one clock signal outputted from the AND 158. Namely, the scanpath circuit 130 (or 140)-K successively takes in the successively input data signals D in response to the on/off operation of the transfer gate 111.

Incidentally, the operation of a portion composed of the transfer gates 113 through 115 and the inverters 121 through 125 is identical to that at the time that the mode setting signal is L in level. Namely, in the above description, the control signal SC and the control signal !SC may be read by being replaced with the control signal PC and the control signal !PC, whereas the input data signal SI may be read by being replaced with the input data signal D.

Figure 4:
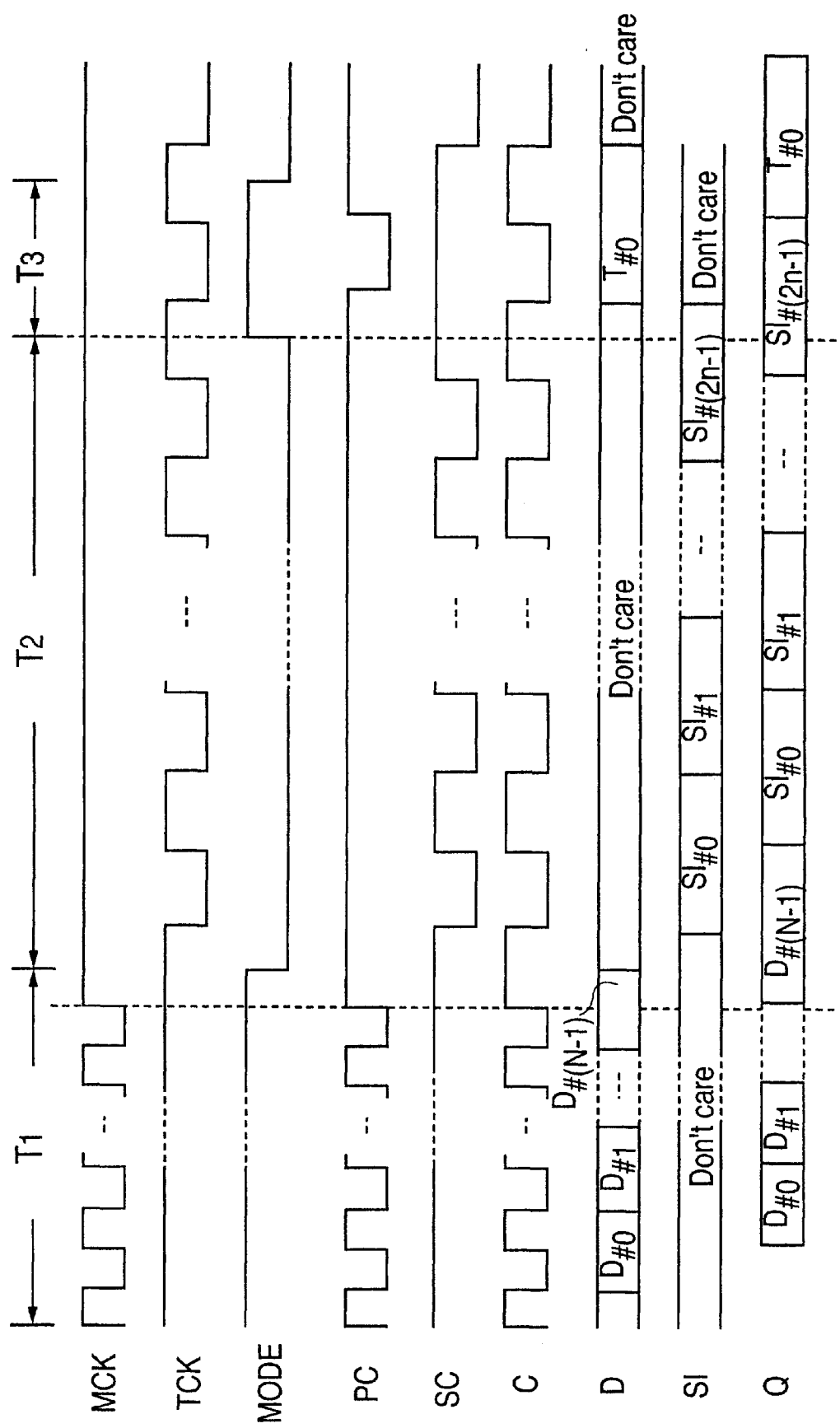
FIG. 4 is a timing chart for describing the operation of the semiconductor integrated circuit according to the first embodiment of the present invention.

The normal operation and logic verifying operation of the semiconductor integrated circuit 100 having the control signal generating circuit 150 and the scanpath circuits 130-1 through 130-n and 140-1 through 140-n described above in detail will be explained. Incidentally, the frequency of the first clock signal MCK will be defined as being greater than that of the second clock signal TCK. FIG. 4 is a timing chart for describing the operations of the control signal generating circuit 150 and the scanpath circuit 130 (or 140)-K in the semiconductor integrated circuit 100.

(a) Normal operation (also called "normal parallel operation": a period indicated by T1 in FIG. 4):

Upon the normal operation, a mode setting signal MODE is set to an H level and the second clock signal input terminal 15 is set to an H level. A first clock signal MCK whose potential level varies in a predetermined period or cycle is inputted from the first clock signal input terminal 13. The control signal generating circuit 150 outputs control signals PC/!PC, SC/!SC and C/!C, based on these signals. Each of the control signal PC and the control signal C results in a signal having a potential level similar to that of the first clock signal MCK. The control signal SC results in a signal having an H level. It is needless to say that the control signals !PC, !SC and !C each corresponding to the inverse of each of these control signals become signals having potential levels obtained by inverting the potential levels of the control signals PC, SC and C. While the description of the potential levels of the inverse control signals !PC, !SC and !C is omitted, they may be understood as the signals having the potential levels obtained by inverting the potential levels of the control signals PC, SC and C.

By doing so, each data signal outputted from the processing circuit 50-1 (or 50-2) is stored in the scanpath circuit 130 (or 140)-K through the first data input terminal D thereof. This means that the control signal C/!C based on the first clock signal MCK is stored as a clock signal. Further, the scanpath circuit 130 (or 140)-K outputs the data signal stored therein from the output terminal Q.

Thus, the data signals D#0 through D# (N−1) inputted to the first data input terminal D during the period of the normal operation (i.e., during the period T1 in FIG. 4) are successively outputted from the output terminal Q in input order.

(b) Logic verifying operation:

As described above, the logic verifying operation is executed from the (1) test serial input operation through the (4) operation for the comparison with the expected value. The timing chart shown in FIG. 4 indicates the (1) test serial input operation and the (2) test parallel operation. Since the (3) test serial output operation is similar to the (1) test serial input operation, it is omitted. Thus, the potential levels of the mode setting signal MODE, first clock signal MCK, second clock signal TCK and control signals PC/!PC, SC/!SC and C/!C at the (3) test serial output operation may be interpreted as being similar to the (1) test serial input operation.

(1) Test serial input operation (corresponding to a period indicated by T2 in FIG. 4):

The test serial input operation corresponds to the operation for storing a data signal SIN for logic verification in the scanpath circuit 130 (or 140)-K from the outside of the semiconductor integrated circuit 100 upon logic verification of the semiconductor integrated circuit 100. The test serial input operation corresponds to the operation for bringing a data signal SIN corresponding to a test vector inputted from the scanpath data input terminal 17 in synchronism with the second clock signal TCK to the scanpath circuit 130 (or 140)-K.

First of all, the mode setting signal MODE is set to an L level and the first clock signal MCK is set to an H level. Further, a second clock signal TCK whose potential level varies in a predetermined cycle, is inputted. The control signal generating circuit 150 outputs control signals PC/!PC, SC/!SC and C/!C, based on these signals. The control signals SC and C result in signals each having a potential level similar to that of the second clock signal TCK. The control signal PC results in a signal having an H level.

By doing so, the data signal SIN outputted from the scanpath circuit 130 (or 140)-(K−1) is stored in the scanpath circuit 130 (or 140)-K through the second input terminal SI of the scanpath circuit 130 (or 140)-K. Incidentally, the scanpath circuit 130-1 stores therein a test vector inputted from the scanpath data input terminal 17 and the scanpath circuit 140-1 stores therein a data signal outputted from the scanpath circuit 130-n.

This storage is performed such that the control signal C/!C based on the second clock signal TCK is stored as a clock signal. Further, the scanpath circuit 130 (or 140)-K outputs the stored data signal from the output terminal Q. Namely, the scanpath circuits 130-1 through 130-n and 140-1 through 140-n are cascade-connected to each other. Thus, shift registers are made up of the scanpath circuits 130-1 through 130-n and the 140-1 through 140-n respectively. Namely, data signals SI#0 through SI# (2n−1) corresponding to test vectors, for example, are successively inputted from the scanpath data input terminal 17. The data signal SI#0 firstly inputted from the scanpath data input terminal 17 is stored in the scanpath circuit 130-1 according to the initial clock pulse of the second clock signal TCK during the period T2 in FIG. 4. Next, the data signal SI#1 inputted as a second from the scanpath data input terminal 17 is stored in the scanpath circuit 130-1 according to a second clock pulse of the second clock signal TCK during the period T2 in FIG. 4. At this time, the data signal SI#0 outputted from the scanpath circuit 130-1 is stored in the scanpath circuit 130-2. The data signals SI#0 through SI# (n−1) inputted from the scanpath data input terminal 17 are hereafter stored in their corresponding scanpath circuits 130-n through 130-1 according to n clock pulses of the second clock signal TCK during the period T2 in FIG. 4 in the same manner as described above. Further, a data signal SI#n inputted as an (n+1)th from the scanpath data input terminal 17 is stored in the scanpath circuit 130-1 according to an nth clock pulse of the second clock signal TCK during the period T2 in FIG. 4. At this time, the data signal SI#0 outputted from the scanpath circuit 130-n is stored in the scanpath circuit 140-1. Subsequently to the above in the same manner as described above, the data signals SI#0 through SI#(2n−1) inputted from the scanpath data input terminal 17 are stored in their corresponding scanpath circuits 130-1 through 130-n and 140-1 through 140-n according to 2n clock pulses of the second clock signal TCK during the period T2 in FIG. 4. Namely, the data signals SI#0 through SI#(n−1) of the data signals SI#0 through SI#(2n−1) are stored in their corresponding scanpath circuits 140-n through 140-1 and the data signals SI#n through SI#(2n−1) are stored in their corresponding scanpath circuits 130-n through 130-1. The output signal Q shown in FIG. 4 indicates one produced from the scanpath circuit 130-1.

(2) Test parallel operation (corresponding to a period indicated by T3 in FIG. 4):

The test parallel operation indicates an operation to be executed subsequent to the aforementioned test serial input operation upon the logic verification of the semiconductor integrated circuit 100. The test parallel operation corresponds to an operation to be carried out after the completion of the test serial input operation. The test parallel operation corresponds to an operation for inputting the test vector stored in the corresponding scanpath circuit on the input side to be intended for logic verification to the processing circuit 50 to be intended for logic verification in synchronism with the second clock signal TCK upon the test serial input operation and bringing the data signal outputted from the processing circuit 50 based on the test vector to the corresponding scanpath circuit on the output side.

The mode setting signal MODE is first set to an H level. The first clock signal MCK and the second clock signal TCK are similar to those at the test serial input operation. The control signal generating circuit 150 outputs control signals PC/!PC, SC/!SC and C/!C based on these signals. The control signals PC and the control signal C result in signals each having a potential level similar to that of the second clock signal TCK. The control signal SC becomes a signal having an H level.

By doing so, the data signals respectively stored in and outputted from the scanpath circuits 130-1 through 130-n and 140-1 through 140-n are inputted to their corresponding processing circuits 50. In other words, data signals SI#n through SI#(2n−1) outputted from the scanpath circuits 130-1 through 130-n located on the input side of the processing circuit 50-2 are transferred to the processing circuit 50-2, whereas data signals SI#0 through SI#(n−1) outputted from the scanpath circuits 140-1 through 140-n located on the input side of the processing circuit 50-3 are transferred to the processing circuit 50-3.

As shown in FIG. 4, the mode setting signal MODE is defined as a period in which the second clock signal TCK changes from an H level state to an L level state and reaches the H level state again. This is done to perform the following operation. When the test parallel operation is first started (i.e., when the mode setting signal MODE changes from the L level to the H level), data signals outputted from the scanpath circuits 130-1 through 130-n are transferred to the processing circuit 50-2 and data signals outputted from the scanpath circuits 140-1 through 140-n are transferred to the processing circuit 50-3. Data signals are transferred to the processing circuit 50-1 from the unillustrated scanpath circuits. Thereafter, the processing circuits 50-1, 50-2 and 50-3 effect predetermined processing on the transferred data signals and output data signals corresponding to the results of their processing therefrom, respectively. The processing made till here is to be completed during a period in which the second clock signal TCK is being L in level. The data signal outputted from either the processing circuit 50-2 or 50-3 is processed based on a change of the second clock signal TCK from an L level to an H level. Thus, the scanpath circuits 130-1 through 130-n store the data signals outputted from the processing circuit 50-1 therein and the scanpath circuits 140-1 through 140-n store the data signals outputted from the processing circuit 50-2 therein. Further, the unillustrated scanpath circuits store the data signals outputted from the processing circuit 50-3.

Upon the test parallel operation as described above, the scanpath circuit 130 (or 140)-K transfers the stored data signal to the processing circuit for receiving the data signal therein and stores therein a desired data signal from the processing circuit for transmitting a data signal to be newly stored. For example, the scanpath circuits 130-1 through 130-n store data signals T#0 through T#(n−1) outputted from the processing circuit 50-1 therein and the scanpath circuits 140-1 through 140-n store data signals T#n through T#(2n−1) outputted from the processing circuit 50-2 therein.

Thus, the scanpath circuit 130-1 shown in FIG. 4 outputs the data signal SI#(2n−1) stored therein and stores a new data signal T#0 therein.

(3) Test serial output operation:

The test serial output operation corresponds to an operation for taking out data signals indicative of results of logic verification stored in the scanpath circuit 130 (or 140)-K to the outside of the semiconductor integrated circuit 100 upon logic verification of the semiconductor integrated circuit 100. The test serial output operation is equivalent to an operation for successively extracting data signals SOU stored in the scanpath circuits 130-1 through 130-n and 140-1 through 140-n from the scanpath data output terminal 19 in synchronism with the second clock signal TCK.

As described above, the states of the respective signals supplied to the control signal generating circuit 150 are similar to those at the test serial input operation. Therefore, the operation of the control signal generating circuit 150 and the operation of the scanpath circuit 130 (or 140)-K are similar to those at the test serial input operation.

Thus, the data signals T#(2n−1) through T#n and T#(n−1) through T#0 respectively stored in the scanpath circuits 140-n through 140-1 and 130-n through 130-1 are successively outputted from the scanpath data output terminal 19 in accordance with clock pulses of the second clock signal TCK.

(4) Comparison with expected value:

Comparisons are successively made between the data signals T#(2n−1) through T#n and T#(n−1) through T#0 outputted from the scanpath data output terminal 19 and expected values. This comparison processing is done by an unillustrated comparing means provided outside the semiconductor integrated circuit 100. Namely, when the data outputted from the scanpath data output terminal 19 and the expected values are all coincident with each other, the processing circuit 50-2 is judged as proper. When, on the other hand, the data outputted from the scanpath data output terminal 19 and the expected values are all inconsistent with each other, the processing circuit 50-2 is judged to be improper.

According to the semiconductor integrated circuit 100 of the first embodiment, as has been described above in detail, the control signal generating circuit 150 generates the control signals for controlling the plurality of scanpath circuits incorporated therein from the first clock signal MCK, the second clock signal TCK and the mode setting signal MODE. Therefore, the respective scanpath circuits are activated in synchronism with the common control signals. Thus, the signals outputted from the respective scanpath circuits having circuit configurations similar to each other result in more synchronized ones. Accordingly, a clock skew developed in the semiconductor integrated circuit can be reduced.

Further, one control signal generating circuit 150 is used in common to the plurality of scanpath circuits. Thus, since no control circuits are required every scanpath circuits, the semiconductor integrated circuit 100 can be expected to be reduced in size.

Since the respective control signals generated from the control signal generating circuit 150 are generated based on the first and second clock signals and mode setting signal which have heretofore been used, no particular signals are additionally required.

(Second Embodiment)

Figure 5:
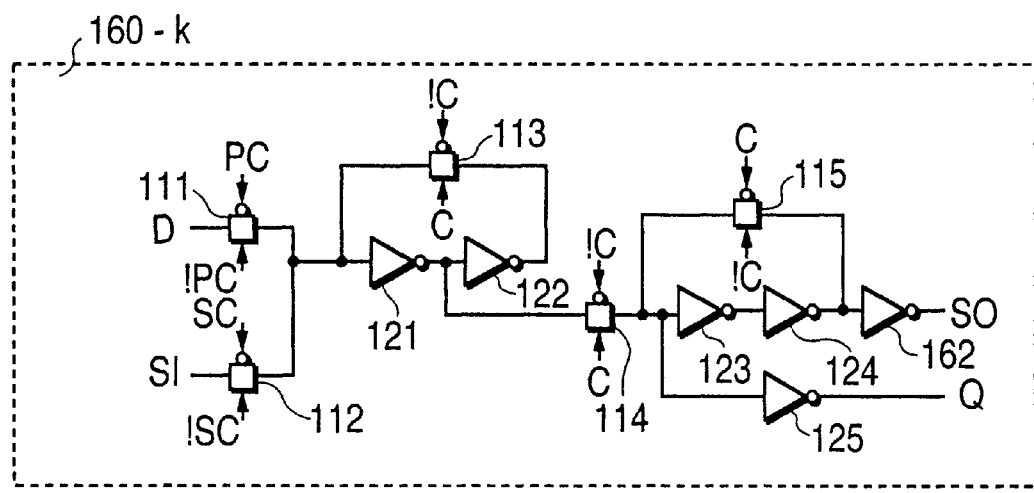
FIG. 5 is a diagram showing a configuration of a scanpath circuit 160-K employed in a second embodiment of the present invention.

FIG. 5 is a diagram showing a circuit configuration of a scanpath circuit 160-K shown in a second embodiment of the present invention. The same elements of structure as those employed in the scanpath circuit 130 (or 140)-K illustrated in the first embodiment are identified by the same reference numerals. Incidentally, the control signal generating circuit 150 shown in FIG. 2 is used in the second embodiment.

The scanpath circuit 160-K shown in FIG. 5 is additionally provided with an inverter 162. An output terminal SO used as the output of the inverter 162 is added to the scanpath circuit 160-K. The scanpath circuit 160-K is identical in other configurations to the scanpath circuit 130 (or 140)-K shown in FIG. 3. The output of an inverter 124 is electrically connected to an input terminal of the inverter 162.

Owing to such a construction, the second embodiment can obtain the following advantageous effect as well as the advantageous effect obtained in the first embodiment. A signal having a potential level similar to that of a signal outputted from an output terminal Q is outputted from the output terminal SO. Thus, when the output terminal SO is used as a data output terminal dedicated to logic verification, a scanpath interconnection coupled to a data output signal Q can be connected to the output terminal SO. As a result, a load on the data output signal Q by the scanpath interconnection can be lessened. It is therefore possible to reduce the rounding and delay of each signal outputted from the output terminal Q. Further, no scanpath interconnection is electrically connected to the output terminal Q. It is therefore necessary to expect and design a load corresponding to the scanpath interconnection upon logic design of the semiconductor integrated circuit.

(Third Embodiment)

Figure 6:
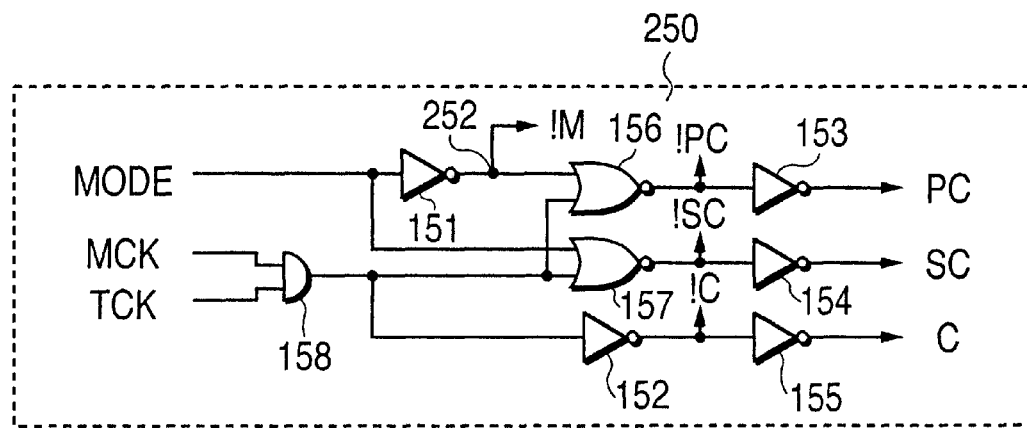
FIG. 6 is a diagram illustrating a configuration of a control signal generating circuit 250 employed in a third embodiment of the present invention.

FIG. 6 is a diagram showing a circuit configuration of a control signal generating circuit 250 shown in a third embodiment of the present invention. The same elements of structure as those shown in the control signal generating circuit 150 employed in the first embodiment are identified by like reference numerals.

In the control signal generating circuit 250 shown in FIG. 6, an inverse signal !M having a potential level obtained by inverting a potential level of a mode setting signal MODE is outputted from a node 252 provided between the output of an inverter 151 and an NOR 156. Therefore, the control signal generating circuit 250 is provided with an output terminal for outputting the inverse signal !M. The control signal generating circuit 250 is identical in other configurations to the control signal generating circuit 150 shown in FIG. 2.

Figure 7:
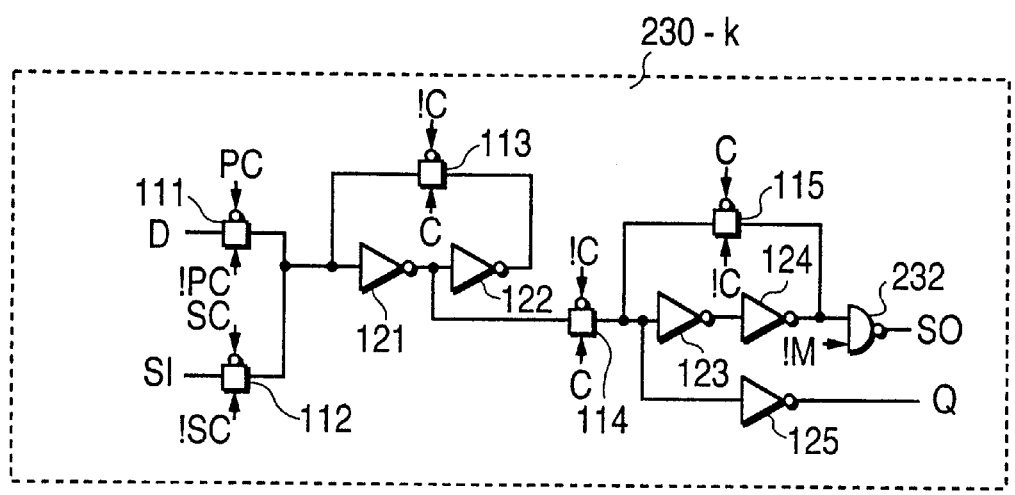
FIG. 7 is a diagram depicting a configuration of a scanpath circuit 230-K employed in the third embodiment of the present invention.

FIG. 7 is a diagram showing a circuit configuration of a scanpath circuit 230-K illustrated in the third embodiment of the present invention. The scanpath circuit 230-K is an improved one of the scanpath circuit 160-K shown in the second embodiment. The same elements of structure as those employed in the second embodiment are identified by the same reference numerals.

The scanpath circuit 230-K shown in FIG. 7 is additionally provided with a NAND gate (hereinafter called "NAND") 232 in place of the inverter 162. An output o f the NAND 232 is outputted from an output terminal SO. The scanpath circuit 230-K is identical in other configurations to the scanpath circuit 160-K shown in FIG. 5. The output of an inverter 124 is electrically connected to one input terminal of the NAND 232. Further, the inverse signal !M obtained from the node 252 of the control signal generating circuit 250 is inputted to the other input terminal of the NAND 232.

Figure 8:
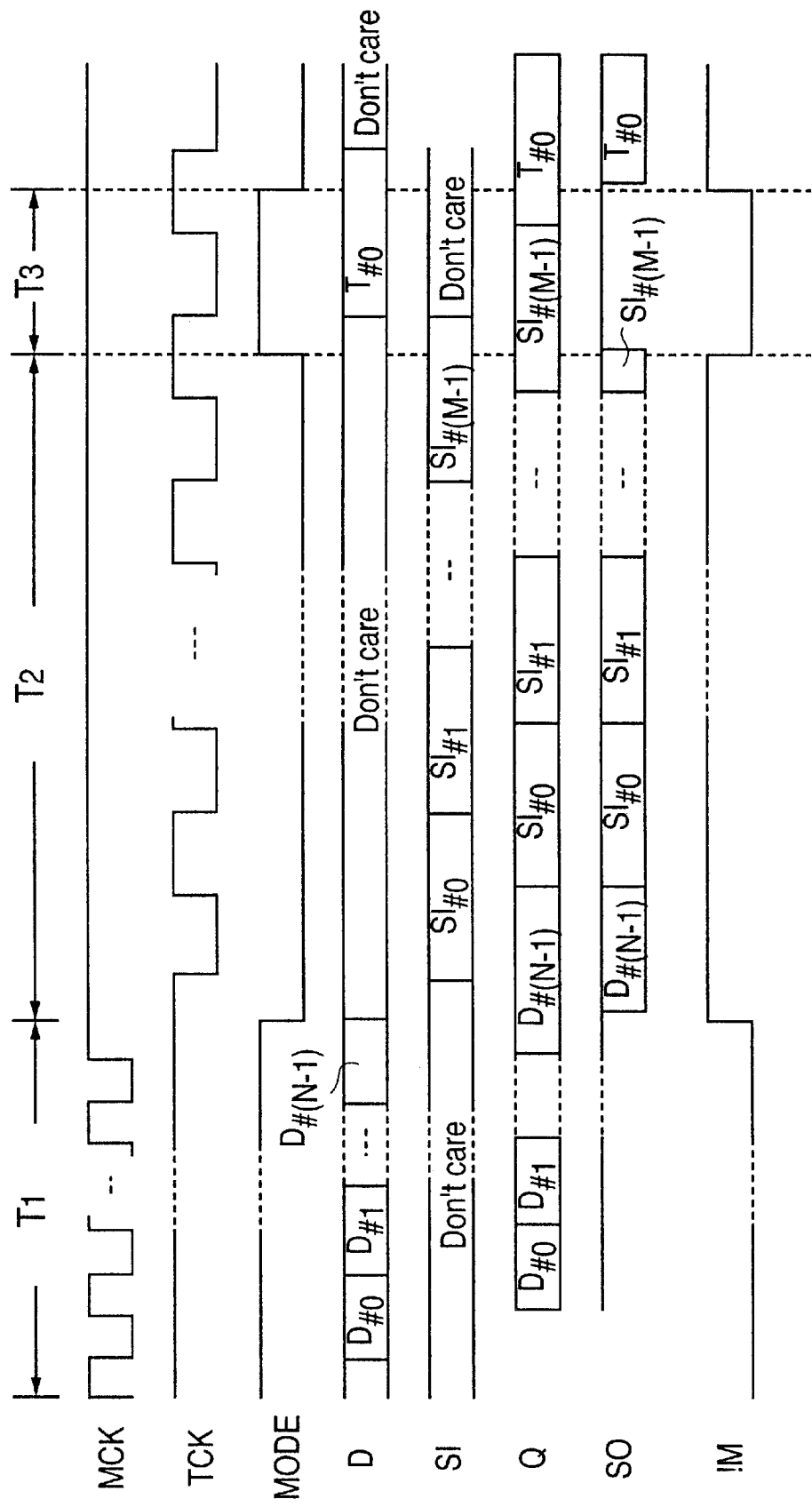
FIG. 8 is a timing chart for describing the operation of the third embodiment of the present invention.

Operations of the control signal generating circuit 250 and the scanpath circuit 230-K constructed in this way will be explained below. FIG. 8 is a timing chart for describing the operation of a semiconductor integrated circuit according to the third embodiment.

Referring to FIG. 8, waveforms of a first clock signal MCK, a second clock signal TCK and a mode setting signal MODE and waveforms at a first input terminal D, a second input terminal SI and an output terminal Q of the scanpath circuit 230-K are similar to those employed in the first embodiment.

In the third embodiment shown in FIG. 8, the signal outputted from the output terminal SO added to the scanpath circuit 230-K is controlled by the inverse signal !M outputted from the control signal generating circuit 250. Namely, when the inverse signal !M is of an H level, a signal similar to that at the output terminal Q is outputted from the output terminal SO as the output produced from the NAND 232. Since the NAND 232 is prohibited from producing an output when the inverse signal !M is of an L level, the output terminal SO is fixed to an H level signal (during periods T1 and T3 in FIG. 8). Therefore, the signal similar to that at the output terminal Q is outputted from the output terminal SO of the scanpath circuit 230-K upon a test serial input operation (corresponding to a period T2 in FIG. 8) and a test serial output operation (corresponding to a period subsequent to the period T3 in FIG. 8).

Owing to the above construction, the third embodiment can obtain the following advantageous effect in addition to the advantageous effect obtained in the second embodiment. Namely, when the output obtained from the output terminal SO is not required except for when the mode setting signal MODE specifies the serial operation (upon the test serial input operation and the test serial output operation), the operation of the NAND 232 is fixed so that the output terminal SO of the scanpath circuit 230-K is fixed to the H level. Thus, the NAND 232 is activated so that nothing is wasted, thereby avoiding the output of a needless signal from the output terminal SO. As a result, the third embodiment can reduce power consumption as compared with the second embodiment.

(Fourth Embodiment)

Figure 9:
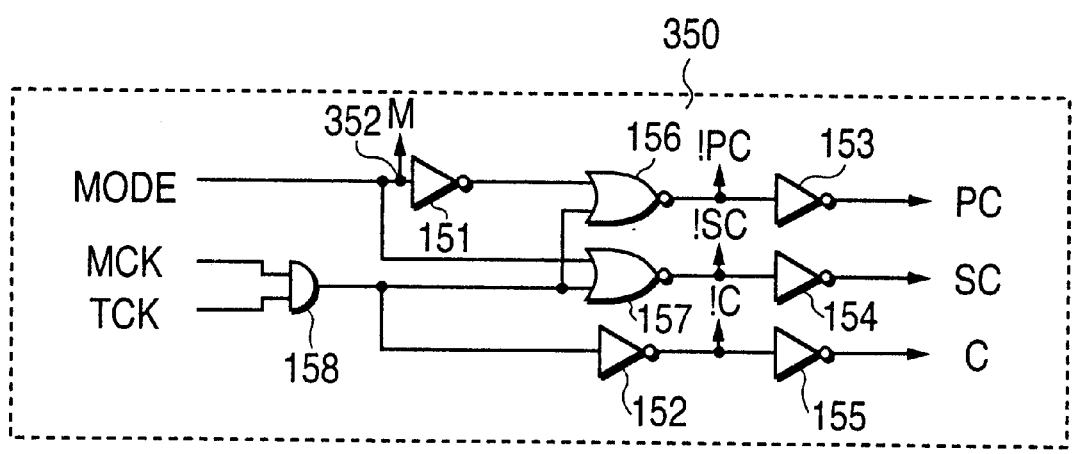
FIG. 9 is a diagram showing a configuration of a control signal generating circuit 350 employed in a fourth embodiment of the present invention.

FIG. 9 is a diagram showing a circuit configuration of a control signal generating circuit 350 illustrated in a fourth embodiment of the present invention. The same elements of structure as those employed in the control signal generating circuit 150 shown in the first embodiment are identified by the same reference numerals.

In the control signal generating circuit 350 shown in FIG. 9, a control signal M having a potential level similar to that of a mode setting signal MODE is outputted from a node 352 at an input terminal of an inverter 151. Therefore, the control signal generating circuit 350 is provided with an output terminal for outputting the control signal M. The control signal generating circuit 350 is identical in other configurations to the control signal generating circuit 150 shown in FIG. 2.

Figure 10:
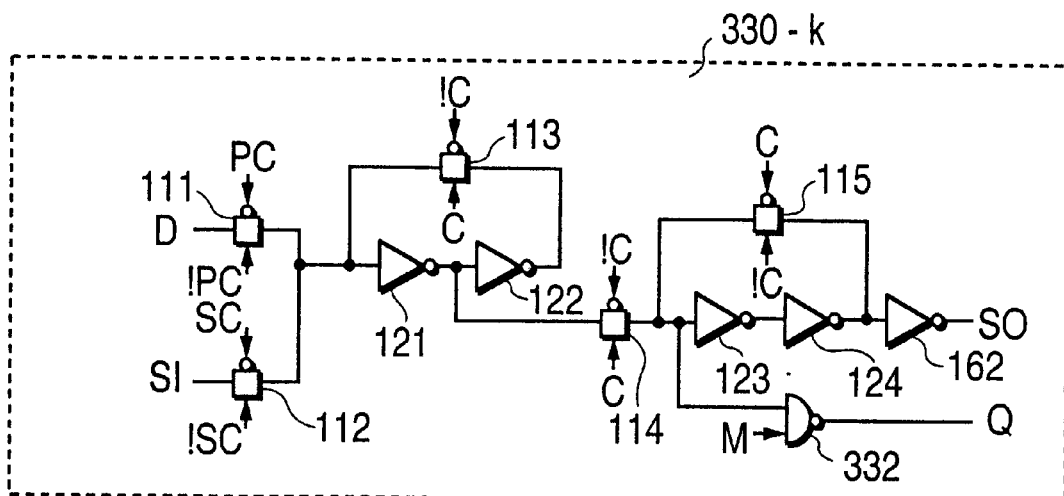
FIG. 10 is a diagram illustrating a configuration of a scanpath circuit 330-K employed in the fourth embodiment of the present invention.

FIG. 10 is a diagram showing a circuit configuration of a scanpath circuit 330-K illustrated in the third embodiment of the present invention. The scanpath circuit 330-K is an improved one of the scanpath circuit 160-K shown in the second embodiment. Thus, the same elements of structure as those employed in the second embodiment are identified by the same reference numerals.

The scanpath circuit 330-K shown in FIG. 10 is additionally provided with a NAND 332 in place of the inverter 125. The scanpath circuit 330-K is identical in other configurations to the scanpath circuit 160-K shown in FIG. 5. The output of an inverter 121 is electrically connected to one input terminal of the NAND 332 through a transfer gate 114. Further, the control signal M obtained from the node 352 of the control signal generating circuit 350 is inputted to the other input terminal of the NAND 332. An output produced from the NAND 332 is outputted from an output terminal Q.

Figure 11:
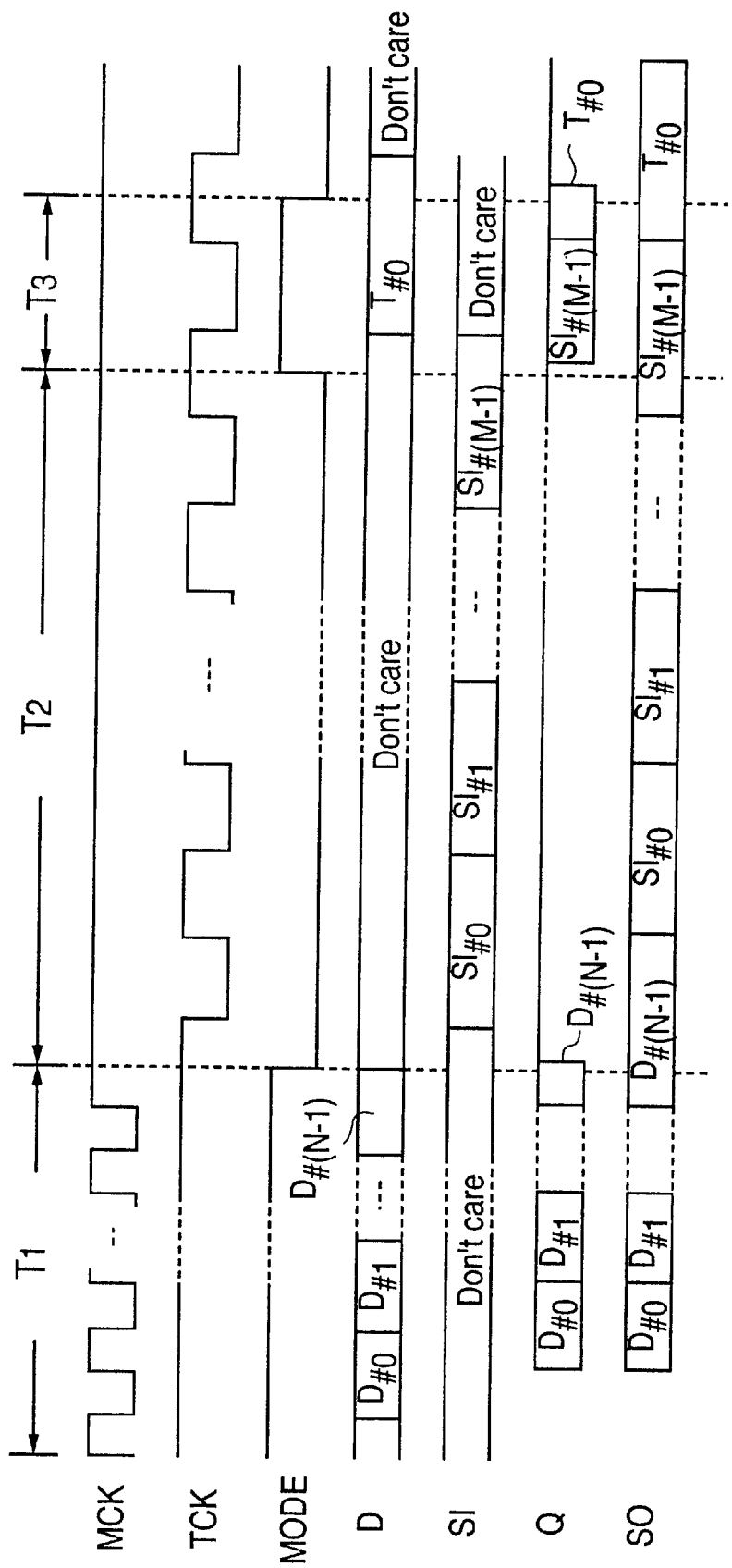
FIG. 11 is a timing chart for describing the operation of the fourth embodiment of the present invention.

Operations of the control signal generating circuit 350 and the scanpath circuit 330-K constructed in this way will be explained below. FIG. 11 is a timing chart for describing the operation of a semiconductor integrated circuit according to the fourth embodiment.

Referring to FIG. 11, waveforms of a first clock signal MCK, a second clock signal TCK and a mode setting signal MODE and waveforms at a first input terminal D and a second input terminal SI of the scanpath circuit 330-K are similar to those employed in the first embodiment. Further, the waveform of the control signal M is similar to that of the mode setting signal MODE. Thus, the potential level of the control signal M will refer to the waveform of the mode setting signal MODE in FIG. 11.

In the fourth embodiment shown in FIG. 11, the output from the output terminal Q of the scanpath circuit 330-K is controlled by the control signal M outputted from the control signal generating circuit 350. Namely, when the control signal is of an H level, a signal similar to that at an output terminal SO is outputted from the output terminal Q as the output produced from the NAND 332. Since the NAND 332 is prohibited from producing an output when the control signal M is of an L level, the output terminal Q is fixed to an H level signal (during a period T2 in FIG. 11). Therefore, the signal similar to that at the output terminal SO is outputted from the output terminal Q of the scanpath circuit 330-K upon a normal operation (normal parallel operation) (corresponding to a period T1 in FIG. 11) and a test parallel output operation (corresponding to a period T3 in FIG. 11).

Owing to the above construction, the fourth embodiment can obtain the following advantageous effect in addition to the advantageous effect obtained in the second embodiment. Namely, when the output obtained from the output terminal Q is not required except for when the mode setting signal MODE specifies the parallel operation (upon the normal operation and the test parallel output operation), the operation of the NAND 332 is fixed so that the output terminal Q of the scanpath circuit 330-K is fixed to the H level. Thus, the NAND 332 is activated so that nothing is wasted, whereby the output of a needless signal from the output terminal Q is avoided. As a result, the fourth embodiment can reduce power consumption as compared with the second embodiment.

(Fifth Embodiment)

Figure 12:
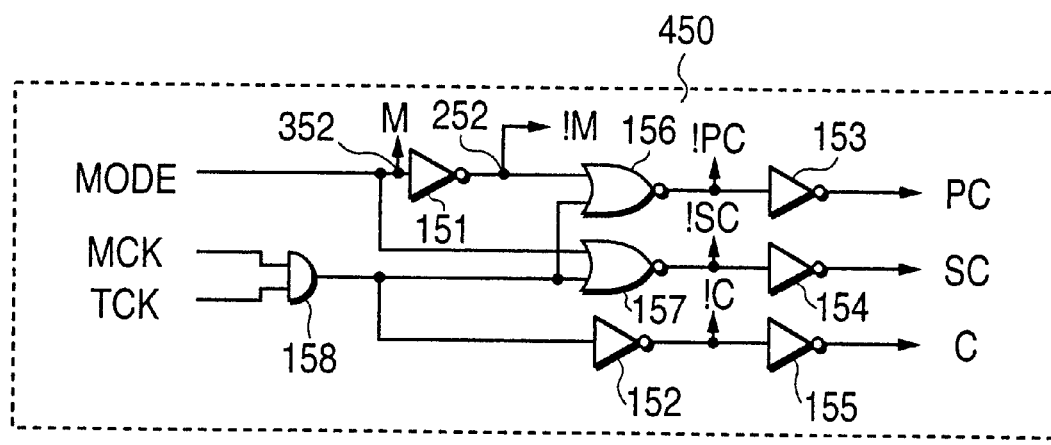
FIG. 12 is a diagram depicting a configuration of a control signal generating circuit 450 employed in a fifth embodiment of the present invention.

FIG. 12 is a diagram showing a circuit configuration of a control signal generating circuit 450 illustrated in a fifth embodiment of the present invention. The control signal generating circuit 450 comprises a combination of the control signal generating circuits 250 and 350 shown in the third and fourth embodiments. The same elements of structure as those employed in the control signal generating circuits 250 and 350 illustrated in the third and fourth embodiments are identified by the same reference numerals.

In the control signal generating circuit 450 shown in FIG. 12, a control signal M having a potential level similar to that of a mode setting signal MODE is outputted from a node 352 at an input terminal of an inverter 151. Therefore, the control signal generating circuit 450 is provided with an output terminal for outputting the control signal M. Further, an inverse signal !M having a potential level obtained by inverting the potential level of the mode setting signal MODE is outputted from a node 252 provided between the output of the inverter 151 and a first input terminal of an NOR 156. Therefore, the control signal generating circuit 450 is provided with the output terminals for respectively outputting the control signal M and the inverse signal !M. The control signal generating circuit 450 is identical in other configurations to the control signal generating circuit 150 shown in FIG. 2.

Figure 13:
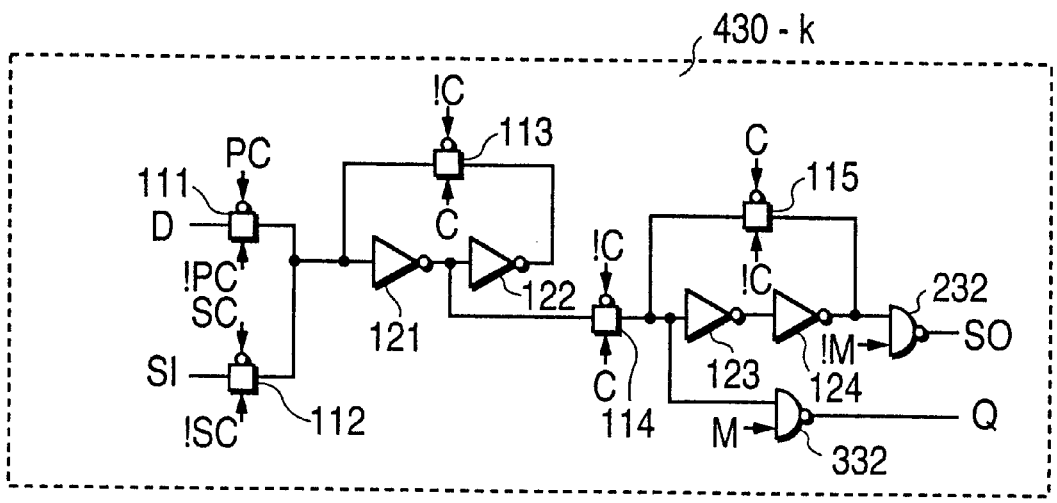
FIG. 13 is a diagram showing a configuration of a scanpath circuit 430-K employed in the fifth embodiment of the present invention.

FIG. 13 is a diagram showing a circuit configuration of a scanpath circuit 430-K shown in the fifth embodiment of the present invention. The scanpath circuit 430-K is also comprised of a combination of the scanpath circuits 230-K and 330-K shown in the third and fourth embodiments. The same elements of structure as those shown in the third and fourth embodiments are identified by like reference numerals.

The scanpath circuit 430-K shown in FIG. 13 is additionally provided with a NAND 332 in place of the inverter 125. Further, a NAND 232 is added to the scanpath circuit 430-K in place of the inverter 162. The scanpath circuit 430-K is similar in other configurations to the scanpath circuits 230-K and 330-K. The output of an inverter 121 is electrically connected to a first input terminal of the NAND 332 through a transfer gate 114. The control signal M obtained from the node 352 of the control signal generating circuit 450 is inputted to a second input terminal of the NAND 332. An output of the NAND 332 is outputted from an output terminal Q. The output of the inverter 124 is electrically connected to a first input terminal of the NAND 232. The inverse signal !M obtained from the node 252 of the control signal generating circuit 450 is inputted to a second input terminal of the NAND 232.

Figure 14:
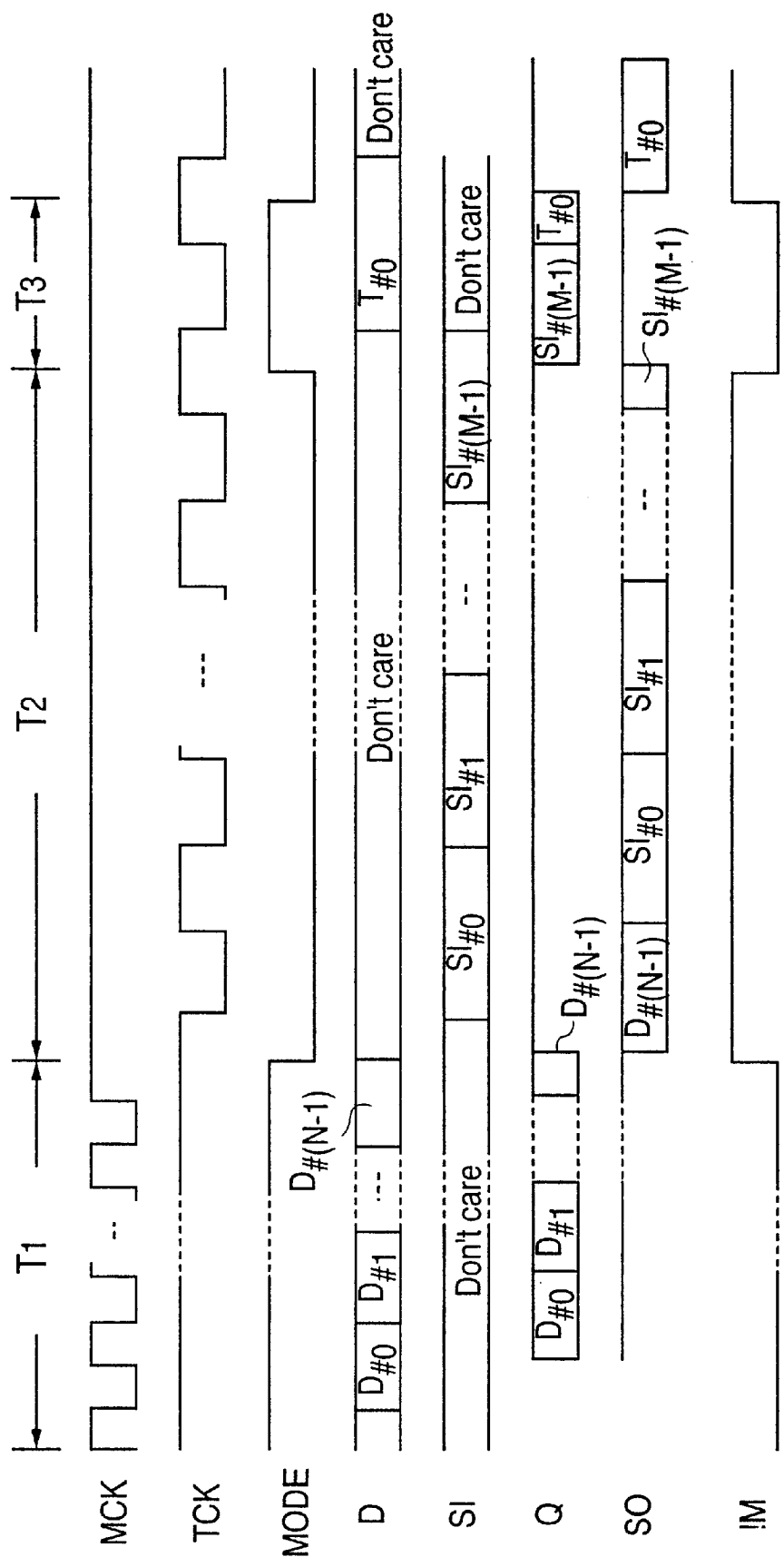
FIG. 14 is a timing chart for describing the operation of the fifth embodiment of the present invention.

Operations of the control signal generating circuit 450 and the scanpath circuit 430-K constructed in this way will be described below. FIG. 14 is a timing chart for describing the operation of a semiconductor integrated circuit according to the fifth embodiment.

Referring to FIG. 14, waveforms of a first clock signal MCK, a second clock signal TCK and a mode setting signal MODE and waveforms at a first input terminal D and a second input terminal SI of the scanpath circuit 430-K are similar to those employed in the first embodiment. Further, the waveform of the control signal M is similar to that of the mode setting signal MODE and the inverse signal !M indicates a waveform having a potential level obtained by inverting the potential level of the mode setting signal MODE.

In the fifth embodiment shown in FIG. 14, the output from the output terminal Q of the scanpath circuit 430-K is controlled by the control signal M outputted from the control signal generating circuit 450. Further, the output from the output terminal SO of the scanpath circuit 430-K is controlled by the inverse signal !M outputted from the control signal generating circuit 450.

Namely, when the control signal M is of an H level, the NAND 232 is prohibited from producing an output. Therefore, the output signal obtained from the scanpath circuit 430-K is outputted from the output terminal Q as the output produced from the NAND 332, and the output terminal SO is fixed to an H level. When, on the other hand, the control signal M is of an L level, the NAND 332 is prohibited from producing an output. Therefore, the output signal obtained from the scanpath circuit 430-K is outputted from the output terminal SO as the output produced from the NAND 232, and the output terminal Q is fixed to the H level.

Owing to the above construction, the fifth embodiment has both the advantageous effects obtained in the third and fourth embodiments. Namely, when the output obtained from the output terminal SO is unnecessary, i.e., when the mode setting signal MODE specifies a parallel operation (upon a normal operation indicated by a period T1 in FIG. 14 and a test parallel operation indicated by a period T3 in FIG. 14), the operation of the NAND 232 is fixed so that the output terminal SO of the scanpath circuit 430-K is fixed to the H level. When, on the other hand, the output obtained from the output terminal Q is not required, i.e., when the mode setting signal MODE specifies a serial operation (upon a test serial input operation indicated by a period T2 in FIG. 14 and a test serial output operation subsequent to the period T3 in FIG. 14), the operation of the NAND 332 is fixed so that the output terminal Q of the scanpath circuit 430-K is fixed to the H level. Thus, the NANDs 232 and 332 are activated so that nothing is wasted, whereby no needless signals are outputted from the output terminals Q and SO. As a result, the fifth embodiment can reduce power consumption.

(Sixth Embodiment)

Figure 15:
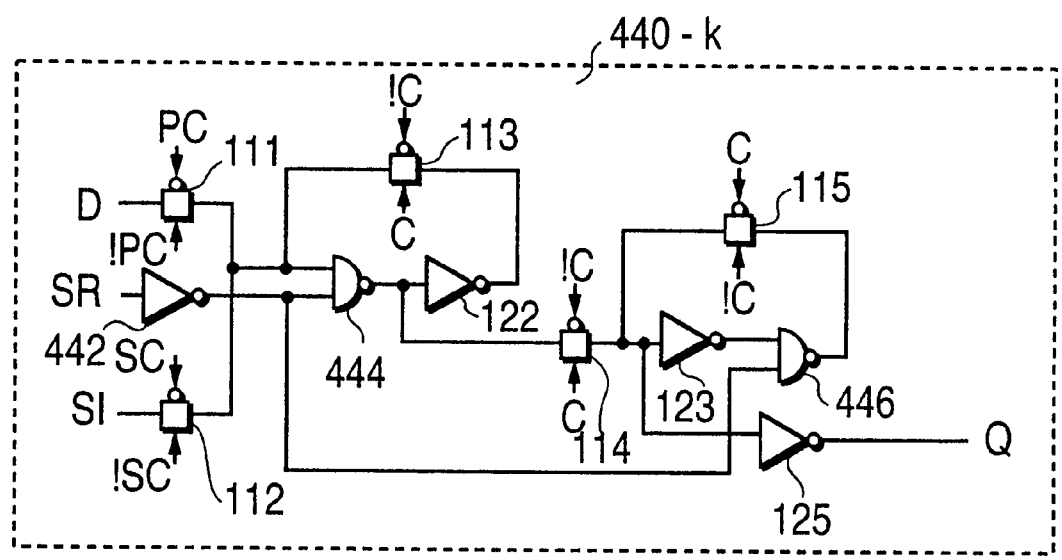
FIG. 15 is a diagram illustrating a configuration of a scanpath circuit 440-K employed in a sixth embodiment of the present invention.

FIG. 15 is a diagram showing a circuit configuration of a scanpath circuit 440-K shown in a sixth embodiment of the present invention. The scanpath circuit 440-K is an improved one of the scanpath circuit 130 (or 140)-K shown in the first embodiment. Thus, the same elements of structure as those shown in the first embodiment are identified by the same reference numerals. Incidentally, the control signal generating circuit 150 shown in FIG. 2 is used in the sixth embodiment.

A NAND 444 is added to the scanpath circuit 440-K shown in FIG. 15 in place of the inverter 121 and a NAND 446 is added thereto in place of the inverter 124. Further, an inverter 442 is newly added to the scanpath circuit 440-K. The scanpath circuit 440-K is similar in other configurations to the scanpath circuit 130 (or 140)-K. Outputs produced from transfer gates Ill and 112 are inputted to a first input terminal of the NAND 444. The output of the inverter 442 is electrically connected to a second input terminal of the NAND 444. The output of the NAND 444 is electrically connected to an input terminal of an inverter 122 and also electrically connected to an input terminal of an inverter 123 through a transfer gate 114. The output of the inverter 123 is electrically connected to a first input terminal of the NAND 446. Further, the output of the inverter 442 is electrically connected to a second input terminal of the NAND 446. The output of the NAND 446 is electrically connected to the input of the inverter 123 through a transfer gate 115. An input terminal of the inverter 442 receives an initial set signal SR corresponding to a set signal for initial setup or initialization.

Figure 16:
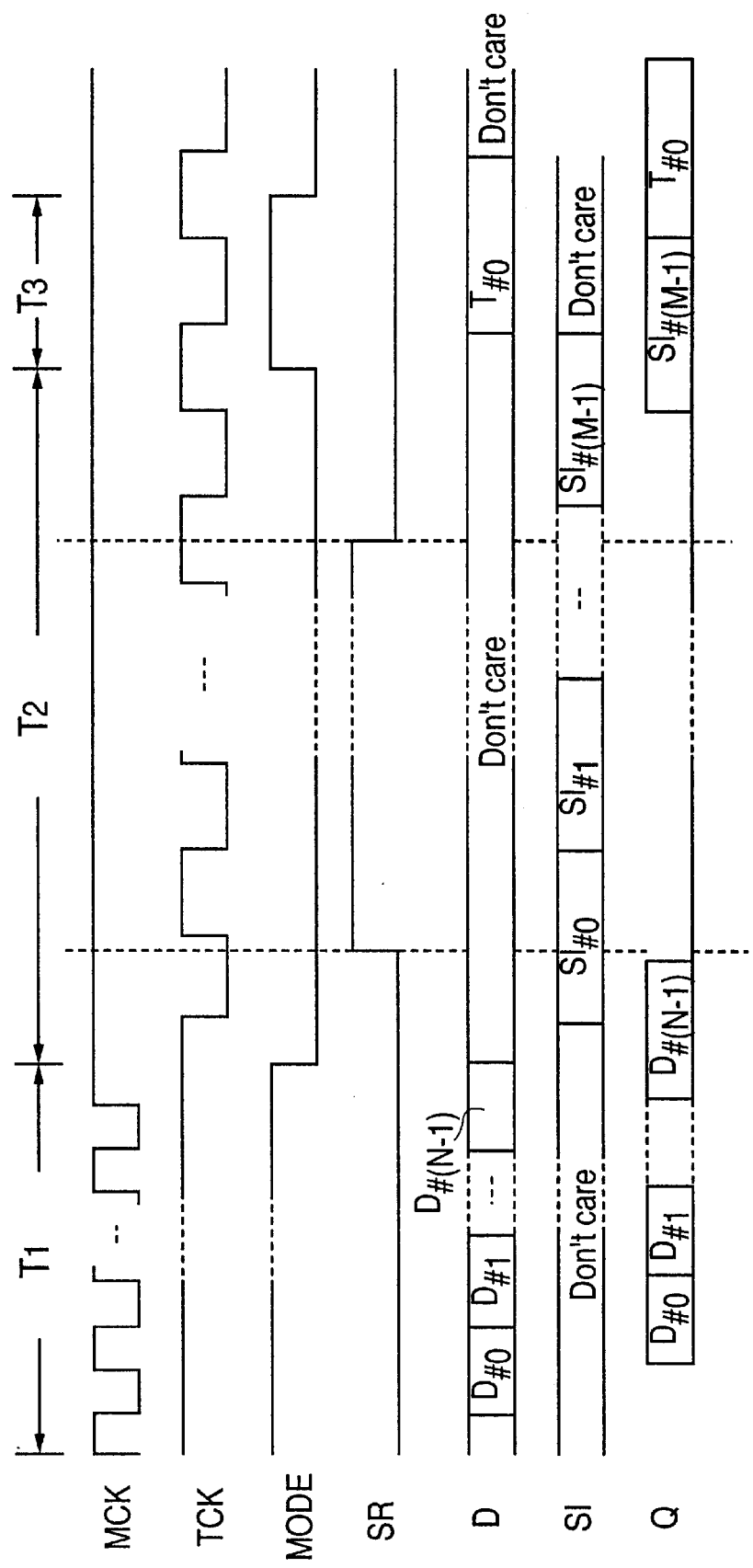
FIG. 16 is a timing chart for describing the operation of the sixth embodiment of the present invention.

The operation of the scanpath circuit 440-K constructed in this way will be explained below. FIG. 16 is a timing chart for describing the operation of a semiconductor integrated circuit according to the sixth embodiment.

Referring to FIG. 16, waveforms of a first clock signal MCK, a second clock signal TCK and a mode setting signal MODE and waveforms at a first input terminal D and a second input terminal SI of the scanpath circuit 440-K are similar to those employed in the first embodiment.

If the initial set signal SR is of an L level, then the present embodiment shown in FIG. 15 is activated in a manner similar to the first embodiment. Namely, when the initial set signal SR is set to the L level, an H level signal is inputted to each of the first input terminal of the NAND 444 and the second input terminal of the NAND 446 through the inverter 442. Therefore, the NAND 444 receives a data signal D or a data signal SI transferred to the second input terminal thereof through the transfer gate 111 or the transfer gate 112 connected to the second input terminal thereof. The NAND 444 outputs a signal having a potential level obtained by inverting the potential level of the received data signal D or data signal SI. Namely, the NAND 444 is activated as an inverter. Similarly, the NAND 446 is also activated as an inverter.

Next, when the initial set signal SR is of an H level, an L level signal is inputted to each of the second input terminal of the NAND 444 and the second input terminal of the NAND 446 through the inverter 442. Therefore, the NANDs 444 and 446 output the H level signals regardless of the signals inputted to the other input terminals thereof respectively. While a test serial input operation (corresponding to a period T2 in FIG. 16) is being performed, the initial set signal SR is represented as the H level in FIG. 16. Therefore, the signal inputted to the scanpath circuit 440-K results in a signal fixed to the H level during the period T2. Thus, a first latch unit of the scanpath circuit 440-K, which comprises the NAND 444, the inverter 122 and the transfer gate 113 or a second latch unit thereof comprised of the NAND 446, the inverter 123 and the transfer gate 115 holds an L level signal inverted by an inverter 125 and outputs it from an output terminal Q.

Owing to the above construction, the sixth embodiment can bring about the following advantageous effect in addition to the advantageous effect obtained in the first embodiment. If the semiconductor integrated circuit equipped with the scanpath circuit 440-K is a DSP, a microprocessor or the like, then a control register or a flag register or the like can receive the output signal of the scanpath circuit 440-K when the initial set signal SR is of the H level. Thus, a predetermined initial value can be easily stored in the control register or the flag register or the like. Since the initial value is the data signal having the L level in the above description, a reset signal maybe used as the initial set signal SR. Since the initial value can be set to the scanpath circuit 440-K subsequent to a logic verifying operation, the scanpath circuit 440-K can be prevented from failing to function normally due to an unexpected data signal remaining in the scanpath circuit 440-K even if the unexpected data signal is left in the scanpath circuit 440-K. Further, the advantageous effect referred to above can be achieved by a simple improvement that one NAND and one inverter are simply added to the scanpath circuit. Thus, the semiconductor integrated circuit equipped with the scanpath circuits is no longer rendered large in size.

(Seventh Embodiment)

Figure 17:
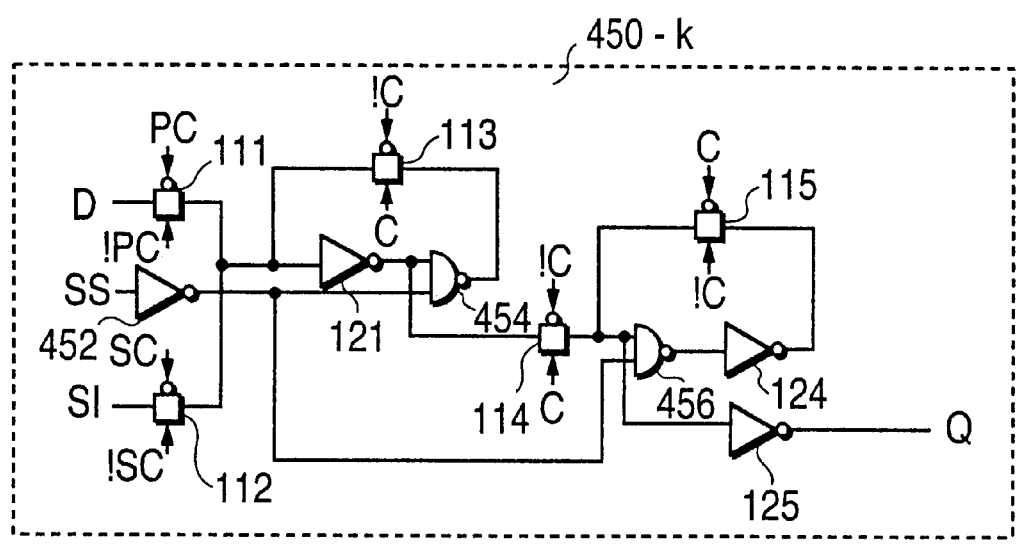
FIG. 17 is a diagram depicting a configuration of a scanpath circuit 450-K employed in a seventh embodiment of the present invention.

FIG. 17 is a diagram showing a circuit configuration of a scanpath circuit 450-K illustrated in a seventh embodiment of the present invention. The scanpath circuit 450-K is an improved one of the scanpath circuit 130 (or 140)-K shown in the first embodiment. Thus, the same elements of structure as those shown in the first embodiment are identified by the same reference numerals. Incidentally, the control signal generating circuit 150 shown in FIG. 2 is used in the seventh embodiment.

A NAND 454 is added to the scanpath circuit 450-K shown in FIG. 17 in place of the inverter 122 and a NAND 456 is added thereto in place of the inverter 123. Further, an inverter 452 is newly added to the scanpath circuit 450-K.

The scanpath circuit 450-K is identical in other configurations to the scanpath circuit 130 (or 140)-K shown in FIG. 3. The output of an inverter 121 is electrically connected to a first input terminal of the NAND 454. Further, the output of the inverter 452 is electrically connected to a second input terminal of the NAND 454. The output of the NAND 454 is electrically connected to an input terminal of the inverter 121 through a transfer gate 113. The output of the inverter 121 is electrically connected to a first input terminal of the NAND 456 through a transfer gate 114. The output of the inverter 452 is electrically connected to a second input terminal of the NAND 456. The output of the NAND 456 is electrically connected to the first input terminal of the NAND 456 through an inverter 124 and a transfer gate 115. An input terminal of the inverter 452 receives an initial set signal SS corresponding to a set signal used for initial setup or initialization.

Figure 18:
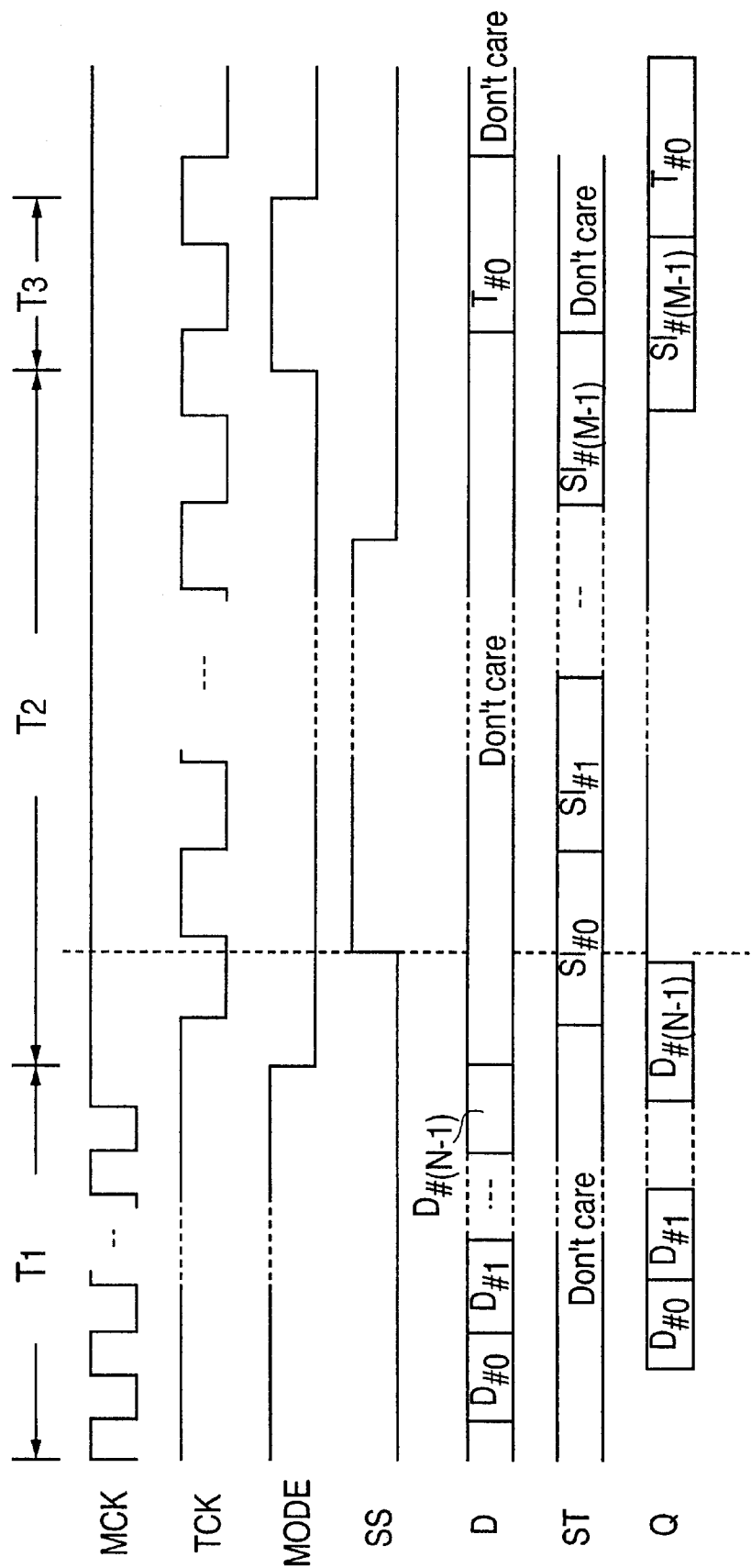
FIG. 18 is a timing chart for describing the operation of the seventh embodiment of the present invention.

The operation of the scanpath circuit 450-K constructed in this way will be explained below. FIG. 18 is a timing chart for describing the operation of a semiconductor integrated circuit according to the seventh embodiment.

Referring to FIG. 18, waveforms of a first clock signal MCK, a second clock signal TCK and a mode setting signal MODE and waveforms at a first input terminal D and a second input terminal SI of the scanpath circuit 450-K are similar to those employed in the first embodiment.

If the initial set signal SS is of an L level, then the present embodiment shown in FIG. 18 is activated in a manner similar to the first embodiment. Namely, when the initial set signal SS is set to the L level, an H level signal is inputted to each of the second input terminal of the NAND 454 and the second input terminal of the NAND 456 through the inverter 452. Therefore, the NAND 454 receives an inverse signal having a potential level obtained by inverting the potential level of a data signal D or a data signal SI transferred through the inverter 121 connected to the first input terminal thereof. The NAND 454 outputs a signal having a potential level similar to the potential level of the received data signal D or data signal SI. Namely, the NAND 454 is activated as an inverter. Similarly, the NAND 456 is also activated as an inverter.

Next, when the initial set signal SS is of an H level, an L level signal is inputted to each of the second input terminal of the NAND 454 and the second input terminal of the NAND 456 through the inverter 452. Therefore, the NANDs 454 and 456 output the H level signals regardless of the signals inputted to the other input terminals thereof respectively. While a test serial input operation (corresponding to a period T2 in FIG. 18) is being performed, the initial set signal SS is represented as the H level in FIG. 18. Therefore, the signal inputted to the scanpath circuit 450-K results in a signal fixed to the H level during the period T2. Thus, a first latch unit of the scanpath circuit 450-K, which comprises the NAND 454, the inverter 121 and the transfer gate 113 or a second latch unit thereof comprised of the NAND 456, the inverter 124 and the transfer gate 115 holds an H level signal inverted by an inverter 125 and outputs it from an output terminal Q.

Owing to this construction, the seventh embodiment can obtain the same advantageous effect as that obtained in the sixth embodiment. Since, however, the data signal having the H level is obtained as the signal Q outputted from the scanpath circuit 450-K, a set signal may be used as the initial set signal SS.

(Eighth Embodiment)

Figure 19:
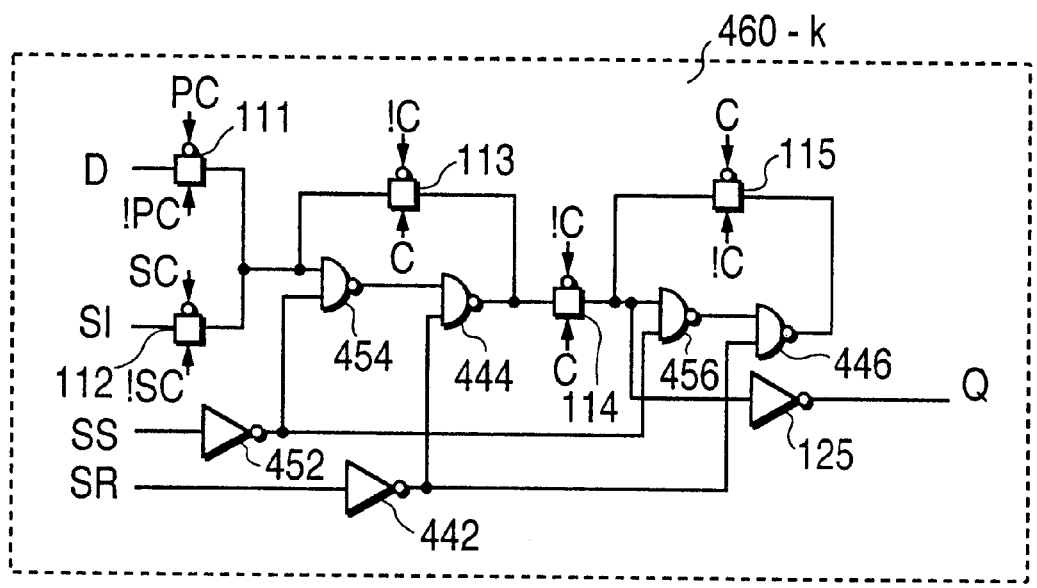
FIG. 19 is a diagram showing a configuration of a scanpath circuit 460-K employed in an eighth embodiment of the present invention.

FIG. 19 is a diagram showing a circuit configuration of a scanpath circuit 460-K shown in an eighth embodiment of the present invention. The scanpath circuit 460-K is made up of a combination of the scanpath circuits 440-K and 450-K shown in the sixth and seventh embodiment. Thus, the same elements of structure as those shown in the sixth and seventh embodiments are identified by the same reference numerals. Incidentally, the control signal generating circuit 150 shown in FIG. 2 is used in the eighth embodiment.

NANDs 444 and 454 are added to the scanpath circuit 460-K shown in FIG. 19 in place of the inverters 121 and 122, and NANDs 446 and 456 are added thereto in place of the inverters 123 and 124. Further, inverters 442 and 452 are newly added to the scanpath circuit 460-K. Namely, the scanpath circuit 460-K corresponds to one in which the scanpath circuits 440-K and 450-K shown in the sixth and seventh embodiments are utilized in combination. The scanpath circuit 460-K is similar in other configurations to the scanpath circuit 130 (or 140)-K shown in FIG. 3.

The outputs of transfer gates 111 and 112 are electrically connected to a first input terminal of the NAND 454. Further, the output of the inverter 452 is electrically connected to a second input terminal of the NAND 454.

The output of the NAND 454 is electrically connected to a first input terminal of the NAND 444. The output of the inverter 442 is electrically connected to a second input terminal of the NAND 444. The output of the NAND 444 is electrically connected to a first input terminal of the NAND 456 through a transfer gate 114. The output of the inverter 452 is electrically connected to a second input terminal of the NAND 456. The output of the NAND 456 is electrically connected to a first input terminal of the NAND 446. The output of the inverter 442 is electrically connected to a second input terminal of the NAND 446. The output of the NAND 456 is electrically connected to the first input terminal of the NAND 456 through a NAND 446 and a transfer gate 115. An input terminal of the inverter 452 receives an initial set signal SS corresponding to a set signal used for initial setup. An input terminal of the inverter 442 receives an initial set signal SR corresponding to a set signal used for initial setup. The output of the NAND 444 is electrically connected to an output terminal Q through the transfer gate 114 and the inverter 125.

Figure 20:
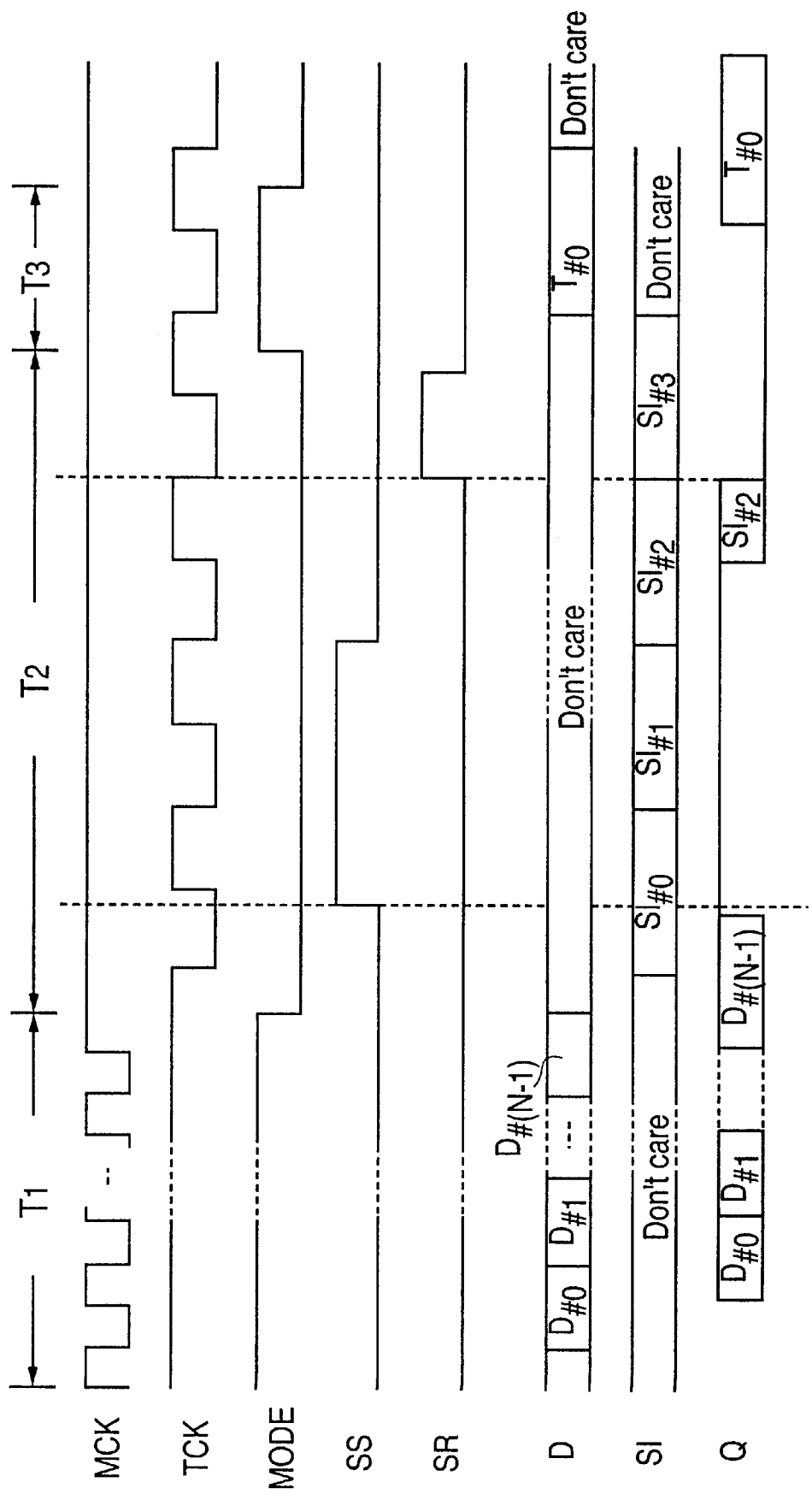
FIG. 20 is a timing chart for describing the operation of the eighth embodiment of the present invention.

The operation of the scanpath circuit 460-K constructed in this way will be described below. FIG. 20 is a timing chart for describing the operation of a semiconductor integrated circuit according to the eighth embodiment.

Referring to FIG. 20, waveforms of a first clock signal MCK, a second clock signal TCK and a mode setting signal MODE and waveforms at a first input terminal D and a second input terminal SI of the scanpath circuit 460-K are similar to those employed in the first embodiment.

If the initial set signals SS and SR are both L in level, then the present embodiment shown in FIG. 20 is activated in a manner similar to the first embodiment. Namely, when the initial set signals SS and SR are both set to the L level, an H level signal is inputted to the second input terminals of the NANDs 454, 444, 456 and 446 through the inverters 442 and 452. Therefore, the NANDs 454, 444, 456 and 446 respectively output signals having potential levels obtained by inverting potential levels of signals inputted to one input terminals thereof. Namely, the NANDs 454, 444, 456 and 446 are activated as inverters. Thus, the scanpath circuit 460-K takes a circuit configuration similar to that shown in the first embodiment.

Next, if the initial set signal SS is H in level and the initial set signal SR is L in level, an L level signal is inputted to each of the second input terminal of the NAND 454 and the second input terminal of the NAND 456 through the inverter 452. Therefore, the NANDs 454 and 456 output the H level signals regardless of the signals inputted to one input terminals thereof respectively. Further, an H level signal is inputted to each of the second input terminal of the NAND 444 and the second input terminal of the NAND 446. Therefore, the NANDs 444 and 446 are respectively activated as inverters for respectively outputting signals having potential levels obtained by inverting the potential levels of the signals inputted to the first input terminals. However, the first input terminals of the NANDs 444 and 446 respectively receive outputs produced from the NANDs 454 and 456 for outputting signals fixed to an H level. Thus, both the NANDs 444 and 446 output signals fixed to an L level. Accordingly, the signal having the H level obtained by inverting the potential level of the NAND 444 is outputted from the output terminal Q through a transfer gate 114 and an inverter 125.

Next, when the initial set signal SS is L in level and the initial set signal SR is H in level, an L level signal is inputted to each of the second input terminal of the NAND 444 and the second input terminal of the NAND 446. Therefore, the NANDs 444 and 446 output H level signals therefrom regardless of the signals inputted to the first input terminals thereof. Further, an H level signal is inputted to each of the second input terminal of the NAND 454 and the second input terminal of the NAND 456 through the inverter 452. Therefore, the NANDs 454 and 456 are activated as inverters for respectively outputting signals having potential levels obtained by inverting potential levels of signals inputted to the first input terminals thereof. However, the first input terminals of the NANDs 454 and 456 receive signals fixed to H levels, which are outputted from the NANDs 444 and 446. Thus, the NANDs 454 and 456 both output a signal fixed to an L level. Accordingly, a signal having an L level obtained by inverting the potential level of the NAND 444 is outputted from the output terminal Q through the inverter 125.

Referring to FIG. 20, the initial set signal SS is set to the H level while a test serial input operation (corresponding to a period T2 in FIG. 20) is being done. Therefore, the signal inputted to the scanpath circuit 460 K during the period T2 results in a signal fixed to an H level. Thus, a first latch unit of the scanpath circuit 460-K, which comprises the NAND 454, the NAND 444 and the transfer gate 113 or a second latch unit thereof comprised of the NAND 456, the NAND 446 and the transfer gate 115 holds an H level signal inverted by the inverter 125 and outputs it from the output terminal Q.

Referring to FIG. 20 as well, the initial set signal SR is set to the H level while a test parallel operation (corresponding to a period T3 in FIG. 20) is being done. Therefore, the signal inputted to the scanpath circuit 460-K during the period T3 results in a signal fixed to an L level. Thus, the first latch unit of the scanpath circuit 460-K, which comprises the NAND 454, the NAND 444 and the transfer gate 113 or the second latch unit thereof comprised of the NAND 456, the NAND 446 and the transfer gate 115 holds an L level signal inverted by the inverter 125 and outputs it from the output terminal Q.

Owing to the above construction, the eighth embodiment can obtain both advantageous effects obtained in the sixth and seventh embodiments.
(Ninth Embodiment)

Figure 21:
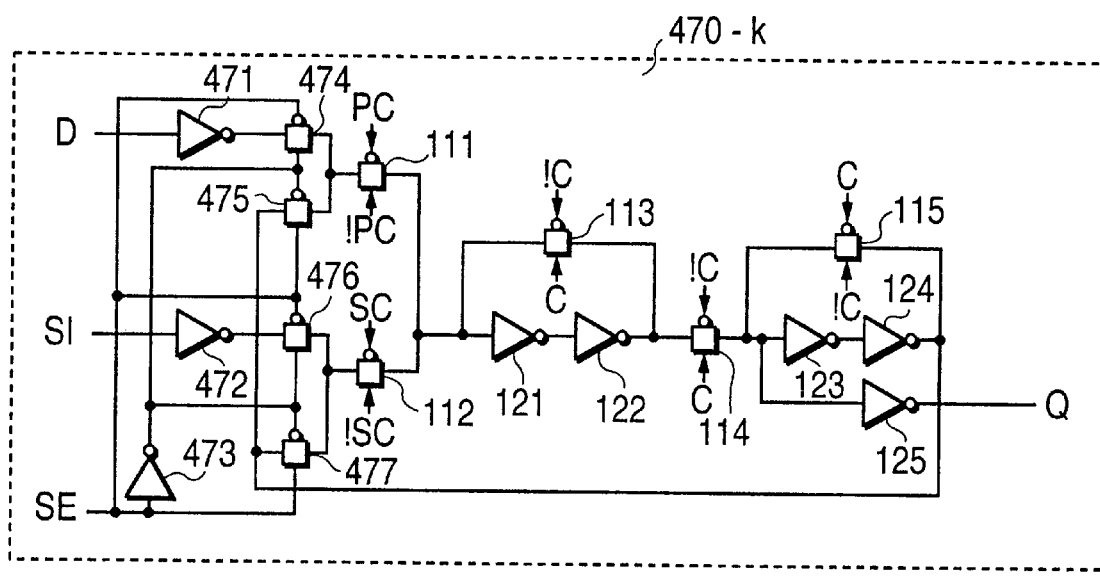
FIG. 21 is a diagram illustrating a configuration of a scanpath circuit 470-K employed in a ninth embodiment of the present invention.

FIG. 21 is a diagram showing a circuit configuration of a scanpath circuit 470-K illustrated in a ninth embodiment of the present invention. The scanpath circuit 470-K is an improved one of the scanpath circuit 130 (or 140)-K shown in the first embodiment. Thus, the same elements of structure as those shown in the first embodiment are identified by the same reference numerals. Incidentally, the control signal generating circuit 150 shown in FIG. 2 is used in the ninth embodiment.

Inverters 471, 472, 473 and transfer gates 474, 475, 476 and 477 are newly added to the scanpath circuit 470-K shown in FIG. 21. The scanpath circuit 470-K is identical in other configurations to the scanpath circuit 130 (or 140)-K shown in FIG. 5. A data signal D is inputted to an input terminal of the inverter 471. A data signal SI is inputted to an input terminal of the inverter 472. A holding signal SE is inputted to an input terminal of the inverter 473. The transfer gates 474 through 477 are respectively comprised of PMOSs and NMOSs connected in parallel. The holding signal SE is inputted to the gate of the PMOS of the transfer gate 474, the gate of the PMOS of the transfer gate 476, the gate of the NMOS of the transfer gate 475 and the gate of the NMOS of the transfer gate 477. The output of the inverter 473 is electrically connected to the gate of the NMOS of the transfer gate 474, the gate of the PMOS of the transfer gate 475, the gate of the NMOS of the transfer gate 476 and the gate of the PMOS of the transfer gate 477. An output produced from the inverter 471 is transferred to a transfer gate 111 through the transfer gate 474. An output produced from the inverter 472 is transferred to a transfer gate 112 through the transfer gate 476. An output produced from an inverter 124 is transferred to the transfer gates 111 and 112 through their corresponding transfer gates 475 and 477. The scanpath circuit 470-K is identical in other configurations to the scanpath circuit 130 (or 140)-K shown in FIG. 3.

Figure 22:
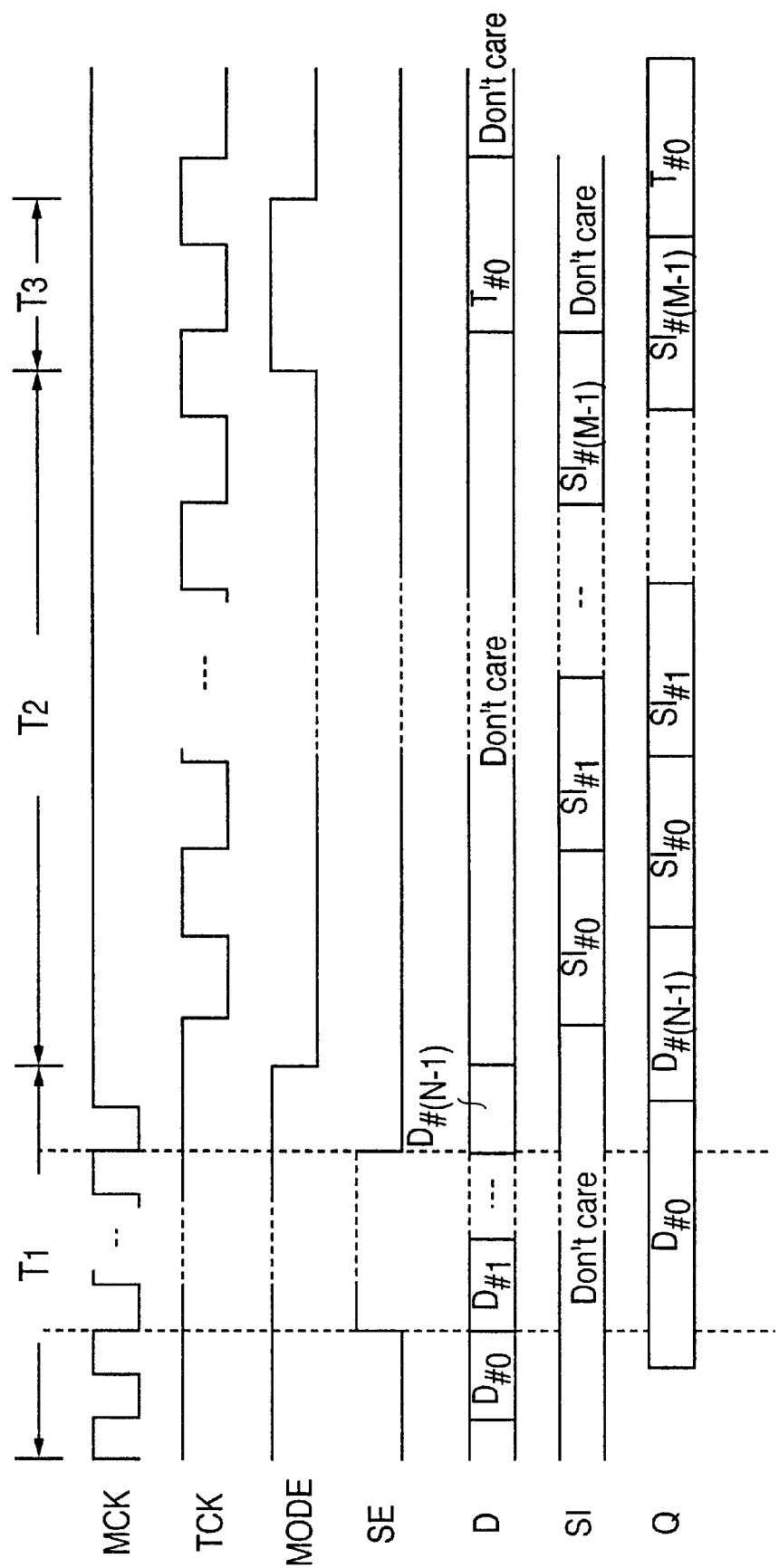
FIG. 22 is a timing chart for describing the operation of the ninth embodiment of the present invention.

The operation of the scanpath circuit 470-K constructed in this way will be explained below. FIG. 22 is a timing chart for describing the operation of a semiconductor integrated circuit according to the ninth embodiment.

Referring to FIG. 22, waveforms of a first clock signal MCK, a second clock signal TCK and a mode setting signal MODE and waveforms at a first input terminal D and a second input terminal SI of the scanpath circuit 470-K are similar to those employed in the first embodiment.

If the holding signal SE is of an L level in FIG. 22, then the scanpath circuit 470-K is activated in a manner similar to the first embodiment. Namely, when a control signal SE is set to the L level, the transfer gates 475 and 477 are turned off and the transfer gates 474 and 476 are turned on. Thus, the scanpath circuit 470-K is activated so as to capture the input data signal D or SI in response to control signals PC/!PC, SC/!SC and C/!C outputted from the control signal generating circuit 150.

Next, if the holding signal SE is of an H level, then the transfer gates 475 and 477 are turned on and the transfer gates 474 and 476 are turned off. Thus, the signal outputted from the inverter 124 is fed back to the transfer gates 111 and 112. Therefore, the data signal held in the scanpath circuit 470-K is stored in the scanpath circuit 470-K again according to the control signals PC/!PC, SC/!SC and C/!C outputted from the control signal generating circuit 150.

Upon a normal operation (indicative of a section indicated by a period Tl in FIG. 22) in FIG. 22, the scanpath circuit 470-K sets the holding signal SE to the H level after it has stored D#0 as the data signal D therein (before the next data signal D#1 is inputted). Therefore, the scanpath circuit 470-K continues to hold the data signal D#0 held in the scanpath circuit 470-K while the holding signal SE is of the H level.

Owing to the above-described construction, the ninth embodiment can bring about an advantageous effect that the data signal inputted as needed can be stored according to the holding signal SE, as well as the advantageous effect obtained in the first embodiment.

(Tenth Embodiment)

Figure 23:
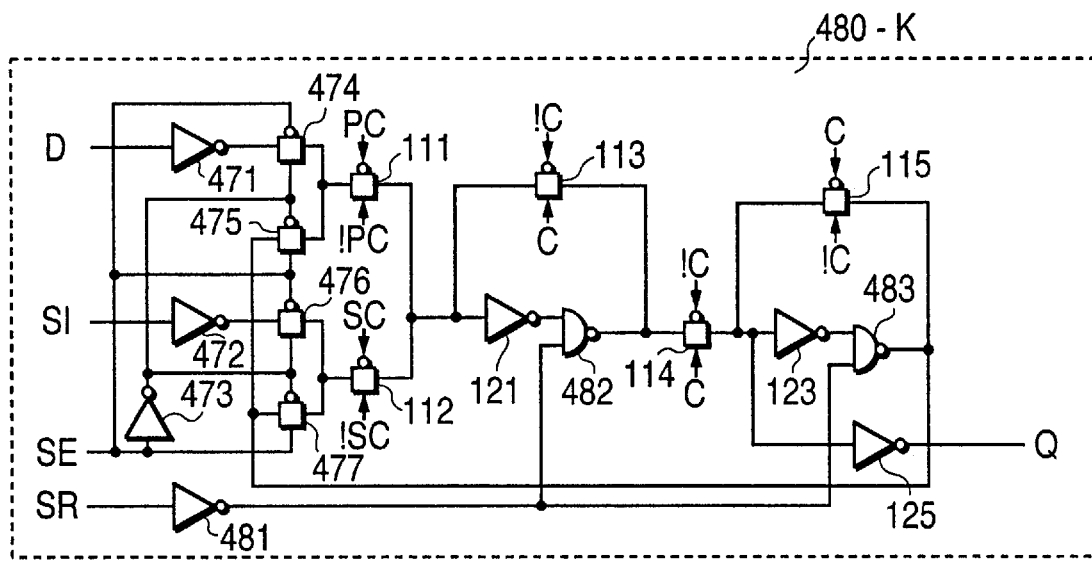
FIG. 23 is a diagram depicting a configuration of a scanpath circuit 480-K employed in a tenth embodiment of the present invention.

FIG. 23 is a diagram showing a circuit configuration of a scanpath circuit 480-K shown in a tenth embodiment of the present invention. The scanpath circuit 480-K comprises a combination of the scanpath circuit 470-K shown in the ninth embodiment and the scanpath circuit 440-K shown in the sixth embodiment. In the present embodiment, the same elements of structure as those shown in the ninth embodiment are identified by the same reference numerals. Incidentally, the control signal generating circuit 150 shown in FIG. 2 is utilized in the tenth embodiment.

A NAND 482 is added to the scanpath circuit 480-K shown in FIG. 23 in place of the inverter 122 and a NAND 483 is added thereto in place of the inverter 124. Further, an inverter 481 is newly added to the scanpath circuit 480-K. The scanpath circuit 480-K is identical in other configurations to the scanpath circuit 470-K shown in FIG. 21.

The NANDs 482 and 483 and the inverter 481 operate in a manner similar to the NANDs 444 and 446 and inverter 442 of the scanpath circuit 440-K shown in FIG. 15, respectively.

Owing to the above-described construction, the tenth embodiment has an advantageous effect of a combination of the advantageous effect obtained in the ninth embodiment and the advantageous effect obtained in the sixth embodiment.

(Eleventh Embodiment)

Figure 24:
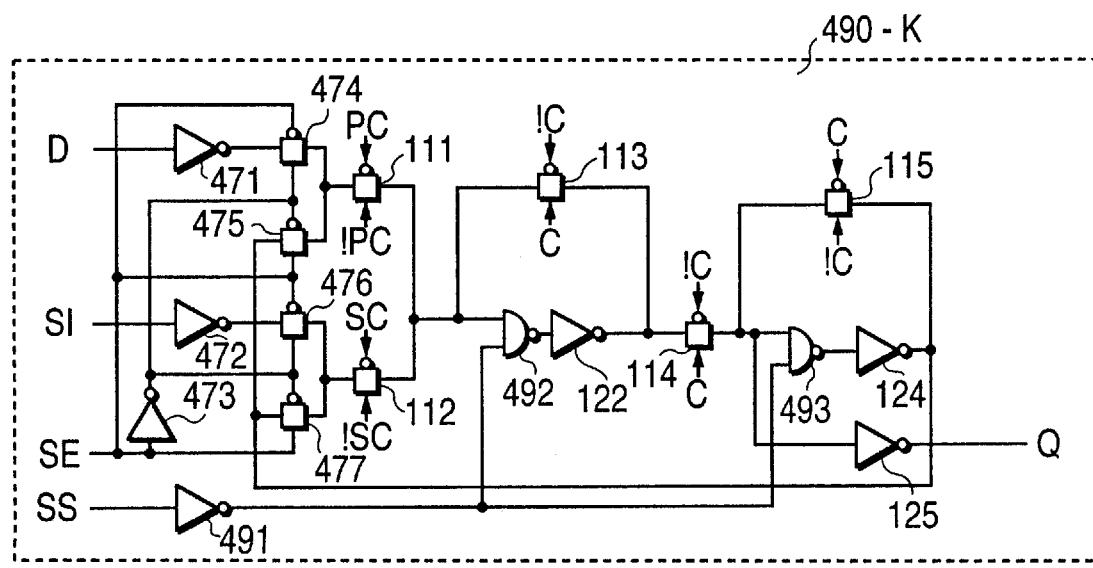
FIG. 24 is a diagram showing a configuration of a scanpath circuit 490-K employed in an eleventh embodiment of the present invention.

FIG. 24 is a diagram showing a circuit configuration of a scanpath circuit 490-K shown in an eleventh embodiment of the present invention. The scanpath circuit 490-K is made up of a combination of the scanpath circuit 470-K shown in the ninth embodiment and the scanpath circuit 450-K shown in the seventh embodiment. In the present embodiment, the same elements of structure as those shown in the ninth embodiment are identified by like reference numerals. Incidentally, the control signal generating circuit 150 shown in FIG. 2 is used in the eleventh embodiment.

A NAND 492 is added to the scanpath circuit 490-K shown in FIG. 24 in place of the inverter 121 and a NAND 493 is added thereto in place of the inverter 123. Further, an inverter 491 is newly added to the scanpath circuit 490-K. The scanpath circuit 490-K is similar in other configurations to the scanpath circuit 470-K shown in FIG. 21.

The NANDs 492 and 493 and the inverter 491 function in a manner similar to the NANDs 454 and 456 and inverter 452 of the scanpath circuit 450-K shown in FIG. 17, respectively.

Owing to the above-described construction, the eleventh embodiment has an advantageous effect of a combination of the advantageous effect obtained in the ninth embodiment and the advantageous effect obtained in the seventh embodiment.

(Twelfth Embodiment)

Figure 25:
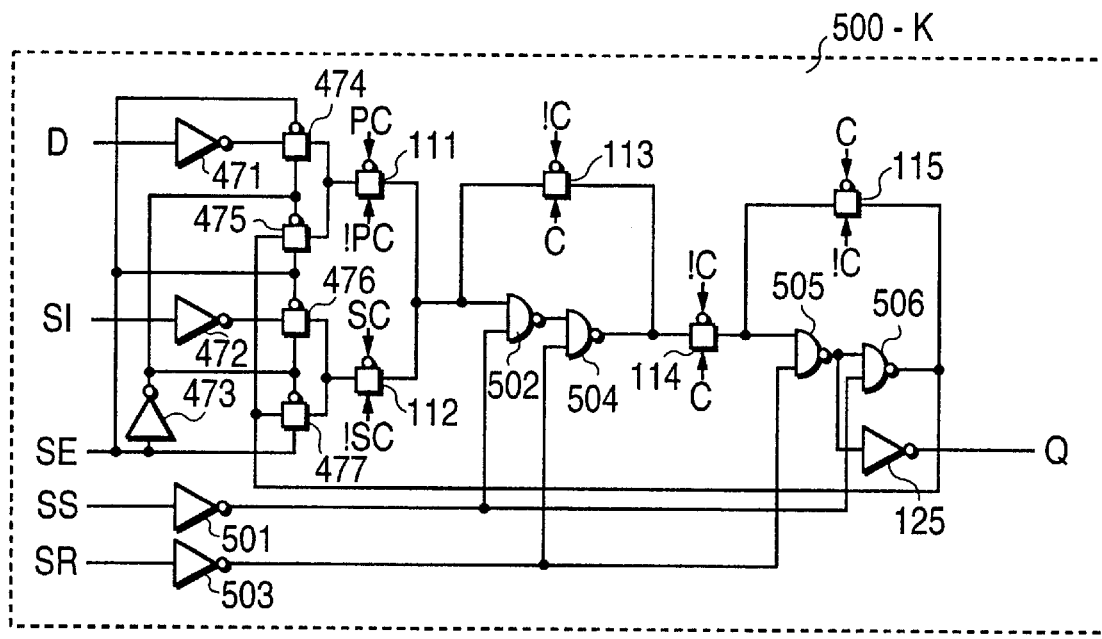
FIG. 25 is a diagram illustrating a configuration of a scanpath circuit 500-K employed in a twelfth embodiment of the present invention.

FIG. 25 is a diagram showing a circuit configuration of a scanpath circuit 500-K shown in a twelfth embodiment of the present invention. The scanpath circuit 500-K is made up of a combination of the scanpath circuit 470-K shown in the ninth embodiment and the scanpath circuit 460-K shown in the eighth embodiment. In the present embodiment, the same elements of structure as those shown in the ninth embodiment are identified by like reference numerals. Incidentally, the control signal generating circuit 150 shown in FIG. 2 is used in the twelfth embodiment.

A NAND 502 is added to the scanpath circuit 500-K shown in FIG. 25 in place of the inverter 121 and a NAND 504 is added thereto in place of the inverter 122. Further, a NAND 505 is added thereto in place of the inverter 123 and a NAND 506 is added thereto in place of the inverter 124. Moreover, inverters 501 and 503 are newly added to the scanpath circuit 500-K. The scanpath circuit 500-K is similar in other configurations to the scanpath circuit 470-K shown in FIG. 21.

The NANDs 502, 504, 505 and 506 and the inverters 501 and 503 function in a manner similar to the NANDs 454, 444, 456 and 446 and inverters 452 and 442 of the scanpath circuit 460-K shown in FIG. 19, respectively.

Owing to the above-described construction, the twelfth embodiment has an advantageous effect of a combination of the advantageous effect obtained in the ninth embodiment and the advantageous effect obtained in the eighth embodiment.

(Thirteenth Embodiment)

Figure 26:
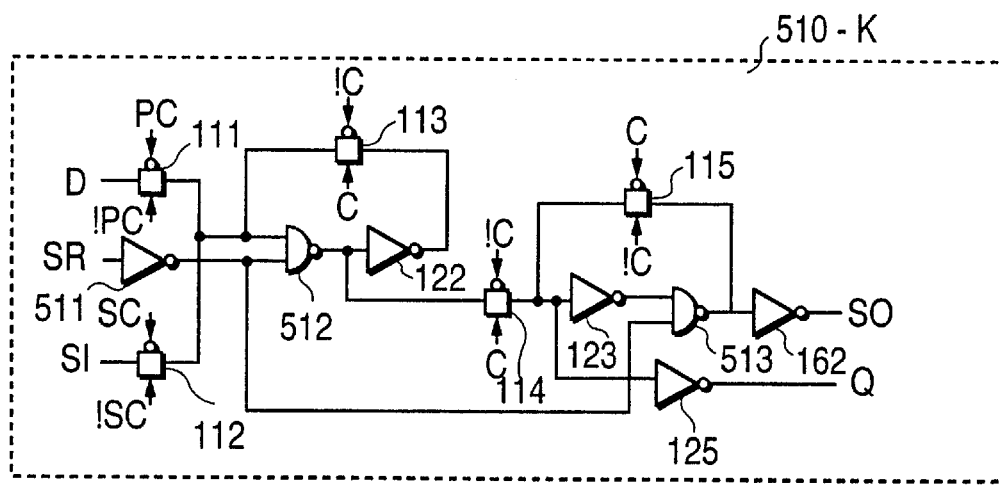
FIG. 26 is a diagram depicting a configuration of a scanpath circuit 510-K employed in a thirteenth embodiment of the present invention.

FIG. 26 is a diagram showing a circuit configuration of a scanpath circuit 510-K shown in a thirteenth embodiment of the present invention. The scanpath circuit 510-K comprises a combination of the scanpath circuit 160-K shown in the second embodiment and the scanpath circuit 440-K shown in the sixth embodiment. In the present embodiment, the same elements of structure as those shown in the second embodiment are identified by like reference numerals. Incidentally, the control signal generating circuit 150 shown in FIG. 2 is used in the thirteenth embodiment.

A NAND 512 is added to the scanpath circuit 510-K shown in FIG. 26 in place of the inverter 121 and a NAND 513 is added thereto in place of the inverter 124. Further, an inverter 511 is newly added to the scanpath circuit 510-K. The scanpath circuit 510-K is similar in other configurations to the scanpath circuit 160-K shown in FIG. 5.

The NANDs 512 and 513 and the inverter 511 operate in a manner similar to the NANDs 444 and 446 and inverter 442 of the scanpath circuit 440-K shown in FIG. 15, respectively.

Owing to the above-described construction, the thirteenth embodiment has an advantageous effect of a combination of the advantageous effect obtained in the sixth embodiment and the advantageous effect obtained in the second embodiment.

(Fourteenth Embodiment)

Figure 27:
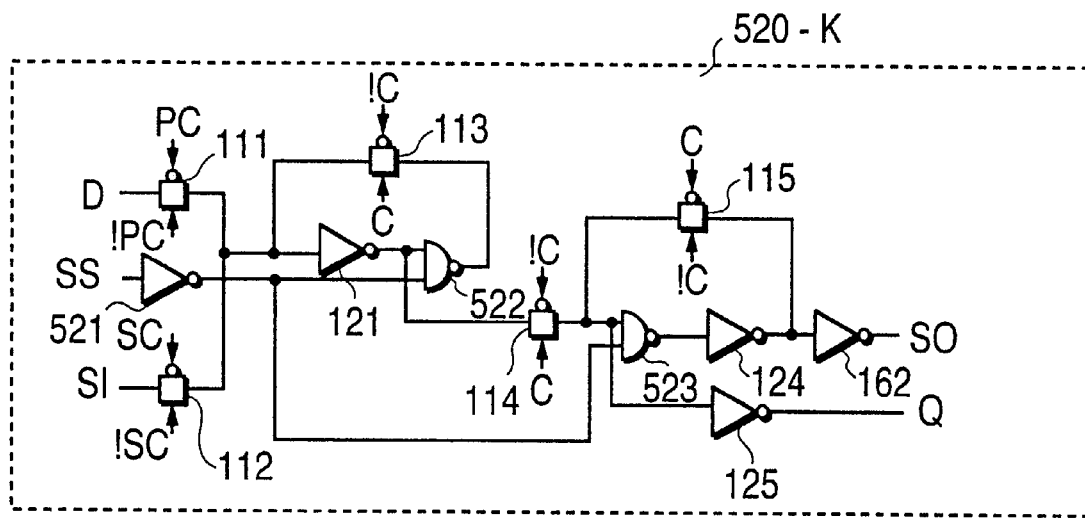
FIG. 27 is a diagram showing a configuration of a scanpath circuit 520-K employed in a fourteenth embodiment of the present invention.

FIG. 27 is a diagram showing a circuit configuration of a scanpath circuit 520-K shown in a fourteenth embodiment of the present invention. The scanpath circuit 520-K comprises a combination of the scanpath circuit 160-K shown in the second embodiment and the scanpath circuit 450-K shown in the seventh embodiment. In the present embodiment, the same elements of structure as those shown in the second embodiment are identified by like reference numerals. Incidentally, the control signal generating circuit 150 shown in FIG. 2 is used in the fourteenth embodiment.

A NAND 522 is added to the scanpath circuit 520-K shown in FIG. 27 in place of the inverter 122 and a NAND 523 is added thereto in place of the inverter 123. Further, an inverter 521 is newly added to the scanpath circuit 520-K. The scanpath circuit 520-K is similar in other configurations to the scanpath circuit 160-K shown in FIG. 5.

The NANDs 522 and 523 and the inverter 521 operate in a manner similar to the NANDs 454 and 456 and inverter 452 of the scanpath circuit 450-K shown in FIG. 17, respectively.

Owing to the above-described construction, the fourteenth embodiment has an advantageous effect of a combination of the advantageous effect obtained in the seventh embodiment and the advantageous effect obtained in the second embodiment.

(Fifteenth Embodiment)

Figure 28:
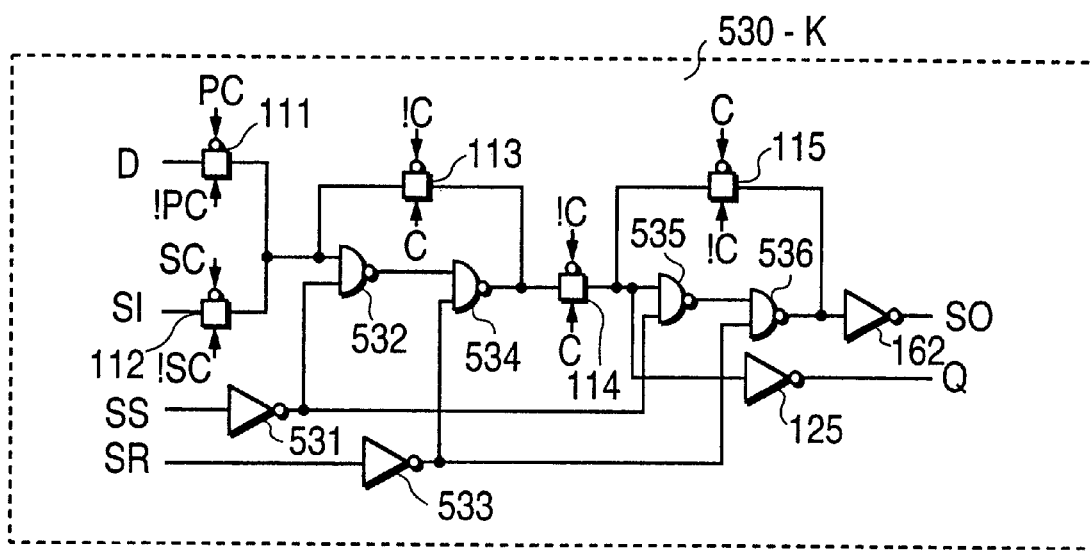
FIG. 28 is a diagram illustrating a configuration of a scanpath circuit 530-K employed in a fifteenth embodiment of the present invention.

FIG. 28 is a diagram showing a circuit configuration of a scanpath circuit 530-K shown in a fifteenth embodiment of the present invention. The scanpath circuit 530-K comprises a combination of the scanpath circuit 160-K shown in the second embodiment and the scanpath circuit 460-K shown in the eighth embodiment. In the present embodiment, the same elements of structure as those shown in the second embodiment are identified by the same reference numerals. Incidentally, the control signal generating circuit 150 shown in FIG. 2 is used in the fifteenth embodiment.

A NAND 532 is added to the scanpath circuit 530-K shown in FIG. 28 in place of the inverter 121 and a NAND 534 is added thereto in place of the inverter 122. Further, a NAND 535 is added thereto in place of the inverter 123 and a NAND 536 is added thereto in place of the inverter 124. Moreover, inverters 531 and 533 are newly added to the scanpath circuit 530-K. The scanpath circuit 530-K is similar in other configurations to the scanpath circuit 160-K shown in FIG. 5.

The NANDs 532, 534, 535 and 536 and the inverters 531 and 533 operate in a manner similar to the NANDs 454, 444, 456 and 446 and inverters 452 and 442 of the scanpath circuit 460-K shown in FIG. 19, respectively.

Owing to the above-described construction, the fifteenth embodiment has an advantageous effect of a combination of the advantageous effect obtained in the eighth embodiment and the advantageous effect obtained in the second embodiment.

(Sixteenth Embodiment)

Figure 29:
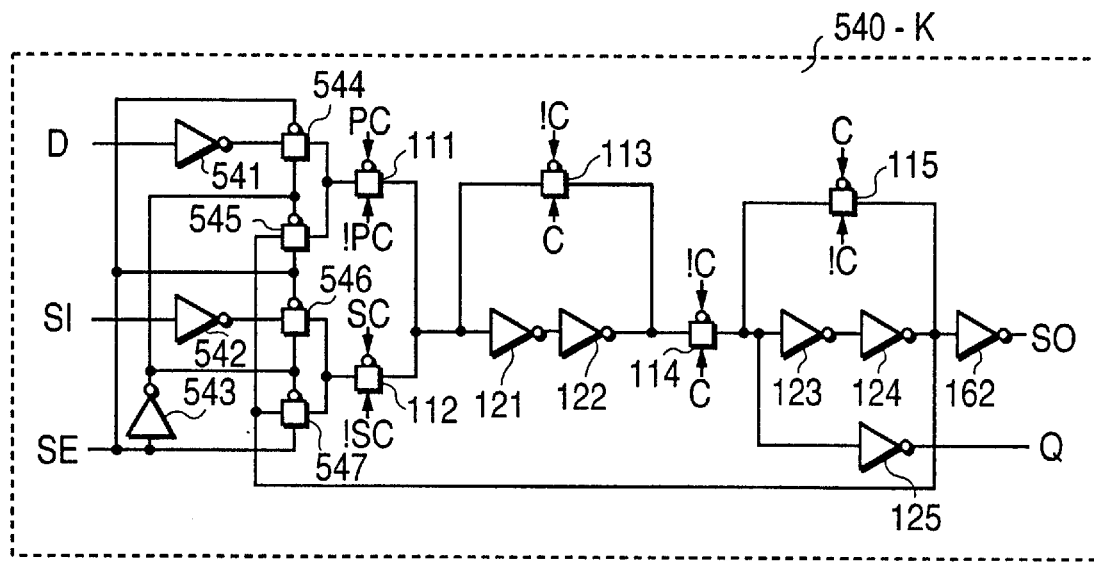
FIG. 29 is a diagram depicting a configuration of a scanpath circuit 540-K employed in a sixteenth embodiment of the present invention.

FIG. 29 is a diagram showing a circuit configuration of a scanpath circuit 540-K shown in a sixteenth embodiment of the present invention. The scanpath circuit 540-K comprises a combination of the scanpath circuit 160-K shown in the second embodiment and the scanpath circuit 470-K shown in the ninth embodiment. In the present embodiment, the same elements of structure as those shown in the second embodiment are identified by the same reference numerals. Incidentally, the control signal generating circuit 150 shown in FIG. 2 is used in the sixteenth embodiment.

Inverters 541, 542 and 543 and transfer gates 544, 545, 546 and 547 are newly added to the scanpath circuit 540-K shown in FIG. 29. The scanpath circuit 540-K is identical in other configurations to the scanpath circuit 160-K shown in FIG. 5.

The transfer gates 544, 545, 546 and 547 and the inverters 541, 542 and 543 function in a manner similar to the transfer gates 474, 475, 476 and 477 and inverters 471, 472 and 473 of the scanpath circuit 470-K shown in FIG. 21, respectively.

Owing to the above-described construction, the sixteenth embodiment has an advantageous effect of a combination of the advantageous effect obtained in the ninth embodiment and the advantageous effect obtained in the second embodiment.

(Seventeenth Embodiment)

Figure 30:
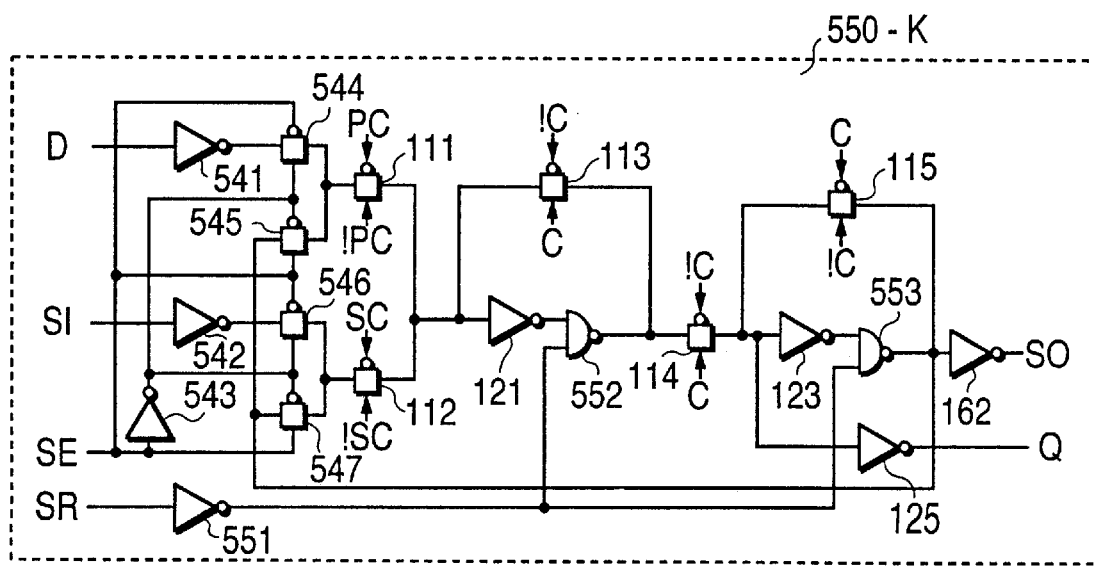
FIG. 30 is a diagram showing a configuration of a scanpath circuit 550-K employed in a seventeenth embodiment of the present invention.

FIG. 30 is a diagram showing a circuit configuration of a scanpath circuit 550-K shown in a seventeenth embodiment of the present invention. The scanpath circuit 550-K comprises a combination of the scanpath circuit 440-K shown in the sixth embodiment and the scanpath circuit 540-K shown in the sixteenth embodiment. In the present embodiment, the same elements of structure as those shown in the sixteenth embodiment are identified by the same reference numerals. Incidentally, the control signal generating circuit 150 shown in FIG. 2 is used in the seventeenth embodiment.

A NAND 552 is added to the scanpath circuit 550-K shown in FIG. 30 in place of the inverter 122 and a NAND 553 is added thereto in place of the inverter 124. An inverter 551 is newly added to the scanpath circuit 550-K. The scanpath circuit 550-K is identical in other configurations to the scanpath circuit 540-K shown in FIG. 29.

The NANDs 552, 553 and the inverter 551 function in a manner similar to the NANDs 444, 446 and inverter 442 of the scanpath circuit 440-K shown in FIG. 15, respectively.

Owing to the above-described construction, the seventeenth embodiment has an advantageous effect of a combination of the advantageous effect obtained in the sixth embodiment and the advantageous effect obtained in the sixteenth embodiment.

(Eighteenth Embodiment)

Figure 31:
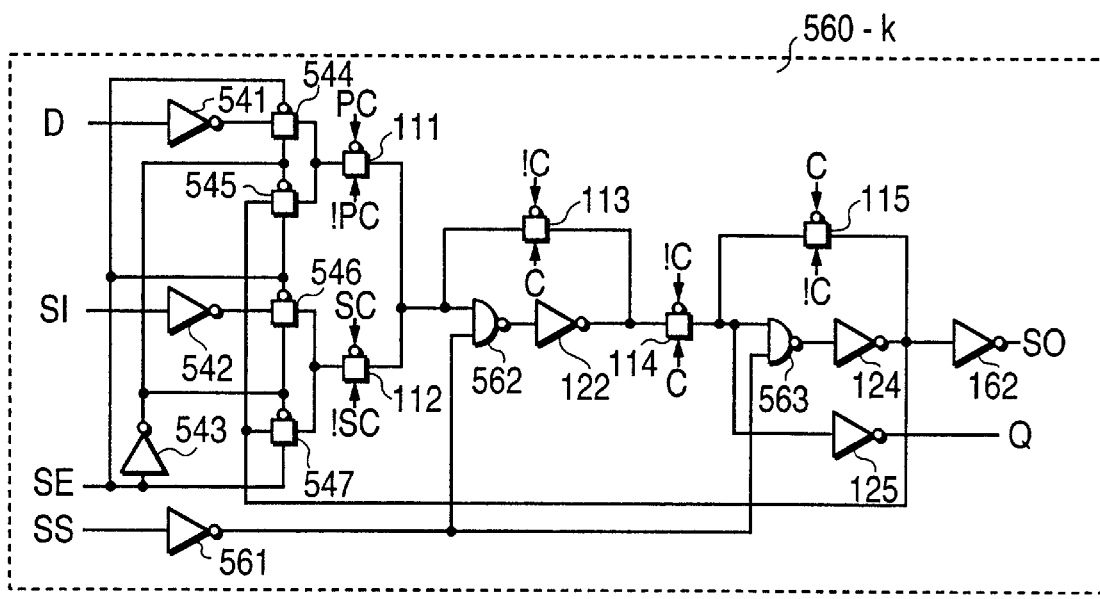
FIG. 31 is a diagram illustrating a configuration of a scanpath circuit 560-K employed in an eighteenth embodiment of the present invention.

FIG. 31 is a diagram showing a circuit configuration of a scanpath circuit 560-K shown in an eighteenth embodiment of the present invention. The scanpath circuit 560-K comprises a combination of the scanpath circuit 450-K shown in the seventh embodiment and the scanpath circuit 540-K shown in the sixteenth embodiment. In the present embodiment, the same elements of structure as those shown in the sixteenth embodiment are identified by the same reference numerals. Incidentally, the control signal generating circuit 150 shown in FIG. 2 is used in the eighteenth embodiment.

A NAND 562 is added to the scanpath circuit 560-K shown in FIG. 31 in place of the inverter 121 and a NAND 563 is added thereto in place of the inverter 123. An inverter 561 is newly added to the scanpath circuit 560-K. The scanpath circuit 560-K is identical in other configurations to the scanpath circuit 540-K shown in FIG. 29.

The NANDs 562, 563 and the inverter 561 function in a manner similar to the NANDs 454, 456 and inverter 452 of the scanpath circuit 450-K shown in FIG. 17, respectively.

Owing to the above-described construction, the eighteenth embodiment has an advantageous effect of a combination of the advantageous effect obtained in the seventh embodiment and the advantageous effect obtained in the sixteenth embodiment.

(Nineteenth Embodiment)

Figure 32:
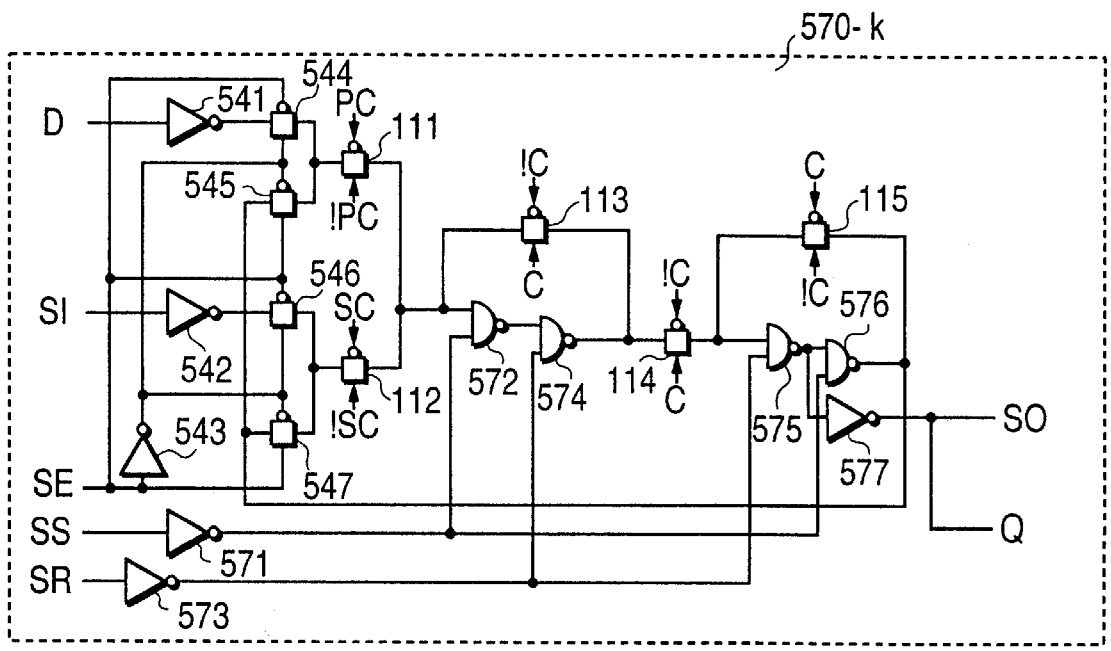
FIG. 32 is a diagram depicting a configuration of a scanpath circuit 570-K employed in a nineteenth embodiment of the present invention.

FIG. 32 is a diagram showing a circuit configuration of a scanpath circuit 570-K shown in a nineteenth embodiment of the present invention. The scanpath circuit 570-K comprises a combination of the scanpath circuit 460-K shown in the eighth embodiment and the scanpath circuit 540-K shown in the sixteenth embodiment. In the present embodiment, the same elements of structure as those shown in the sixteenth embodiment are identified by the same reference numerals. Incidentally, the control signal generating circuit 150 shown in FIG. 2 is used in the nineteenth embodiment.

A NAND 572 is added to the scanpath circuit 570-K shown in FIG. 32 in place of the inverter 121. A NAND 574 is added thereto in place of the inverter 122. A NAND 575 is added thereto in place of the inverter 123. A NAND 576 is added thereto in place of the inverter 124. Further, inverters 571 and 573 are newly added to the scanpath circuit 570-K. Moreover, an inverter 577 is additionally provided in place of the inverters 125 and 162. The scanpath circuit 570-K is identical in other configurations to the scanpath circuit 540-K illustrated in FIG. 29.

The NANDs 572, 574, 575 and 576 and the inverters 571 and 573 operate in a manner similar to the NANDs 454, 444, 456 and 446 and inverters 452 and 442 of the scanpath circuit 460 K shown in FIG. 19, respectively. When an input terminal of the inverter 577 is electrically connected to the output of the NAND 575, the inverter 577 functions in a manner similar to each of the inverters 125 and 162.

Owing to the above-described construction, the nineteenth embodiment has an advantageous effect of a combination of the advantageous effect obtained in the eighth embodiment and the advantageous effect obtained in the sixteenth embodiment. Since one inverter can be substituted for the inverters 125 and 162, the present embodiment can bring about the effect of reducing the size of a semiconductor integrated circuit by decreasing the number of devices.

(Twentieth Embodiment)

Figure 33:
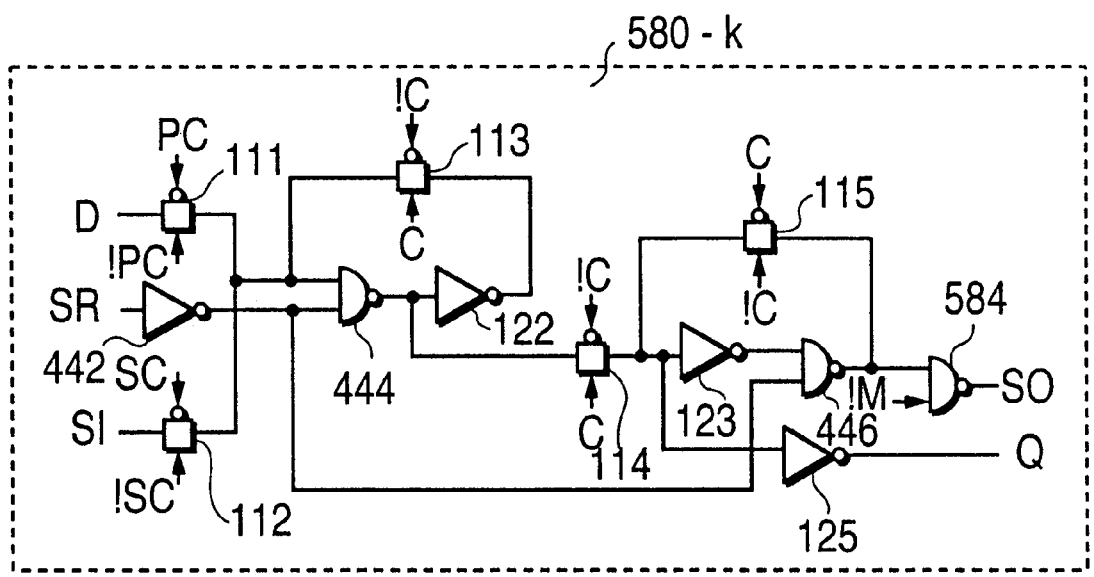
FIG. 33 is a diagram showing a configuration of a scanpath circuit 580-K employed in a twentieth embodiment of the present invention.

FIG. 33 is a diagram showing a circuit configuration of a scanpath circuit 580-K shown in a twentieth embodiment of the present invention. The scanpath circuit 580-K comprises a combination of the scanpath circuit 230-K shown in the third embodiment and the scanpath circuit 440-K shown in the sixth embodiment. In the present embodiment, the same elements of structure as those shown in the sixth embodiment are identified by the same reference numerals. Incidentally, the control signal generating circuit 250 shown in FIG. 6 is used in the twentieth embodiment.

A NAND 584 is newly added to the scanpath circuit 580-K shown in FIG. 33. The scanpath circuit 580-K is identical in other configurations to the scanpath circuit 440-K shown in FIG. 15.

The NAND 584 functions in a manner similar to the NAND 232 of the scanpath circuit 230-K shown in FIG. 7.

Owing to the above-described construction, the twentieth embodiment has an advantageous effect of a combination of the advantageous effect obtained in the third embodiment and the advantageous effect obtained in the sixth embodiment.

(Twenty-First Embodiment)

Figure 34:
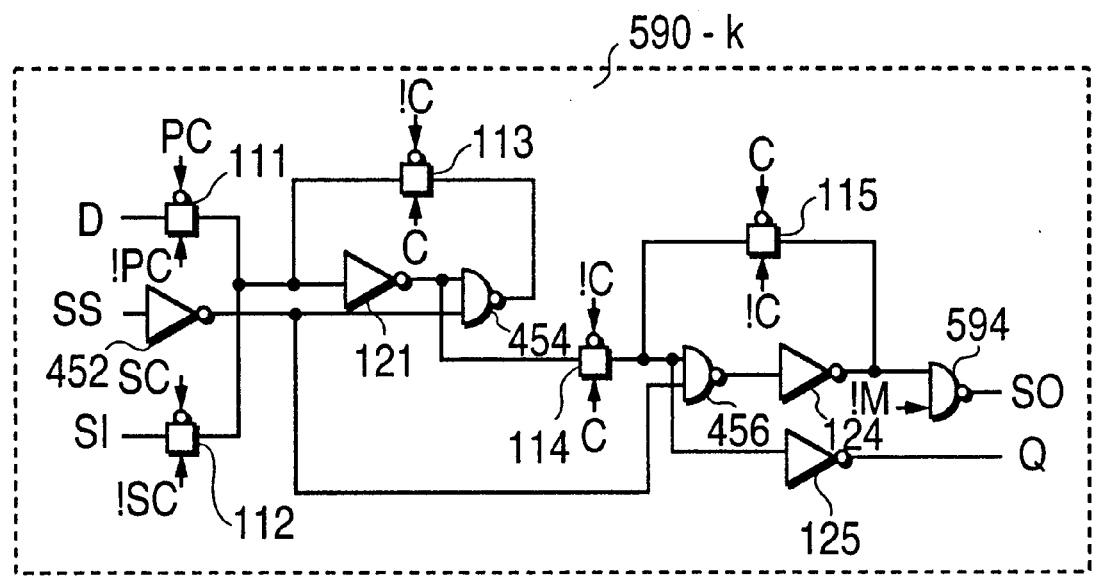
FIG. 34 is a diagram illustrating a configuration of a scanpath circuit 590-K employed in a twenty-first embodiment of the present invention.

FIG. 34 is a diagram showing a circuit configuration of a scanpath circuit 590-K shown in a twenty-first embodiment of the present invention. The scanpath circuit 590-K comprises a combination of the scanpath circuit 230-K shown in the third embodiment and the scanpath circuit 450-K shown in the seventh embodiment. In the present embodiment, the same elements of structure as those shown in the seventh embodiment are identified by the same reference numerals. Incidentally, the control signal generating circuit 250 shown in FIG. 6 is used in the twenty-first embodiment.

A NAND 594 is newly added to the scanpath circuit 590-K shown in FIG. 34. The scanpath circuit 590-K is identical in other configurations to the scanpath circuit 450-K shown in FIG. 17.

The NAND 594 operates in a manner similar to the NAND 232 of the scanpath circuit 230-K shown in FIG. 7.

Owing to the above-described construction, the twenty-first embodiment has an advantageous effect of a combination of the advantageous effect obtained in the third embodiment and the advantageous effect obtained in the seventh embodiment.

(Twenty-Second Embodiment)

Figure 35:
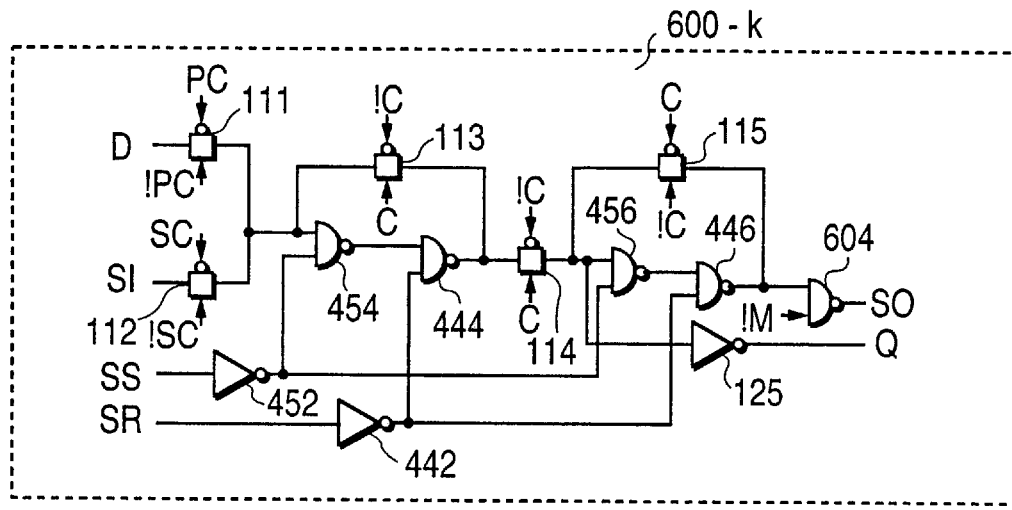
FIG. 35 is a diagram depicting a configuration of a scanpath circuit 600-K employed in a twenty-second embodiment of the present invention.

FIG. 35 is a diagram showing a circuit configuration of a scanpath circuit 600-K shown in a twenty-second embodiment of the present invention. The scanpath circuit 600-K comprises a combination of the scanpath circuit 230-K shown in the third embodiment and the scanpath circuit 460-K shown in the eighth embodiment. In the present embodiment, the same elements of structure as those shown in the eighth embodiment are identified by the same reference numerals. Incidentally, the control signal generating circuit 250 shown in FIG. 6 is used in the twenty-second embodiment.

A NAND 604 is newly added to the scanpath circuit 600-K shown in FIG. 35. The scanpath circuit 600-K is identical in other configurations to the scanpath circuit 460-K shown in FIG. 19.

The NAND 604 operates in a manner similar to the NAND 232 of the scanpath circuit 230-K shown in FIG. 7.

Owing to the above-described construction, the twenty-second embodiment has an advantageous effect of a combination of the advantageous effect obtained in the third embodiment and the advantageous effect obtained in the eighth embodiment.

(Twenty-Third Embodiment)

Figure 36:
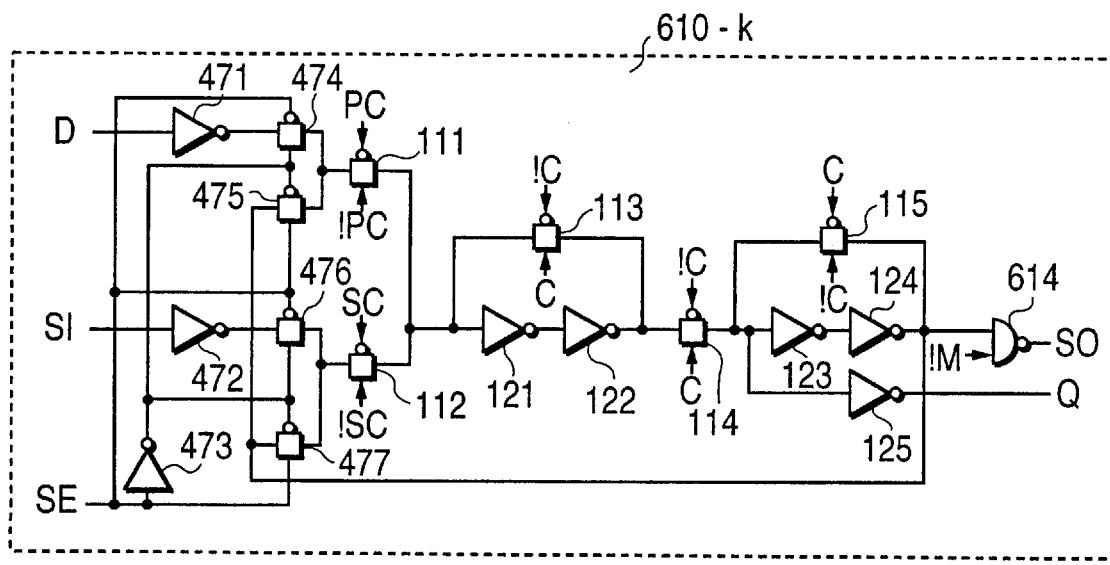
FIG. 36 is a diagram showing a configuration of a scanpath circuit 610-K employed in a twenty-third embodiment of the present invention.

FIG. 36 is a diagram showing a circuit configuration of a scanpath circuit 610-K shown in a twenty-third embodiment of the present invention. The scanpath circuit 610-K comprises a combination of the scanpath circuit 230-K shown in the third embodiment and the scanpath circuit 470-K shown in the ninth embodiment. In the present embodiment, the same elements of structure as those shown in the ninth embodiment are identified by the same reference numerals. Incidentally, the control signal generating circuit 250 shown in FIG. 6 is used in the twenty-third embodiment.

A NAND 614 is newly added to the scanpath circuit 610-K shown in FIG. 36. The scanpath circuit 610-K is identical in other configurations to the scanpath circuit 470-K shown in FIG. 21.

The NAND 614 operates in a manner similar to the NAND 232 of the scanpath circuit 230-K shown in FIG. 7.

Owing to the above-described construction, the twenty-third embodiment has an advantageous effect of a combination of the advantageous effect obtained in the third embodiment and the advantageous effect obtained in the ninth embodiment.

(Twenty-Fourth Embodiment)

Figure 37:
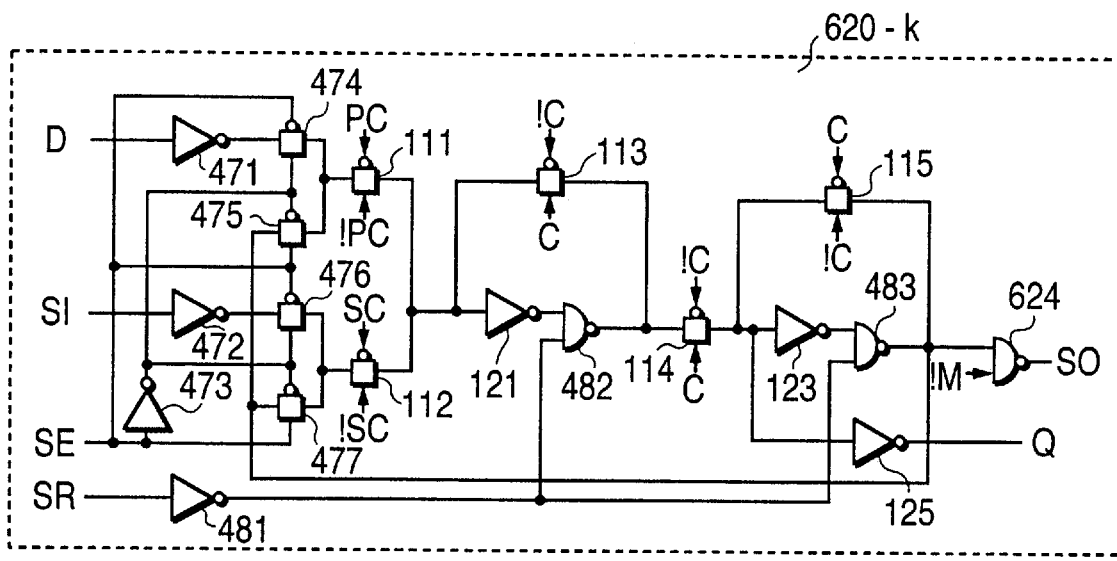
FIG. 37 is a diagram illustrating a configuration of a scanpath circuit 620-K employed in a twenty-fourth embodiment of the present invention.

FIG. 37 is a diagram showing a circuit configuration of a scanpath circuit 620-K shown in a twenty-fourth embodiment of the present invention. The scanpath circuit 620-K comprises a combination of the scanpath circuit 230-K shown in the third embodiment and the scanpath circuit 480-K shown in the tenth embodiment. In the present embodiment, the same elements of structure as those shown in the tenth embodiment are identified by the same reference numerals. Incidentally, the control signal generating circuit 250 shown in FIG. 6 is used in the twenty-fourth embodiment.

A NAND 624 is newly added to the scanpath circuit 620-K shown in FIG. 37. The scanpath circuit 620-K is identical in other configurations to the scanpath circuit 480-K shown in FIG. 23.

The NAND 624 operates in a manner similar to the NAND 232 of the scanpath circuit 230-K shown in FIG. 7.

Owing to the above-described construction, the twenty-fourth embodiment has an advantageous effect of a combination of the advantageous effect obtained in the third embodiment and the advantageous effect obtained in the tenth embodiment.

(Twenty-Fifth Embodiment)

Figure 38:
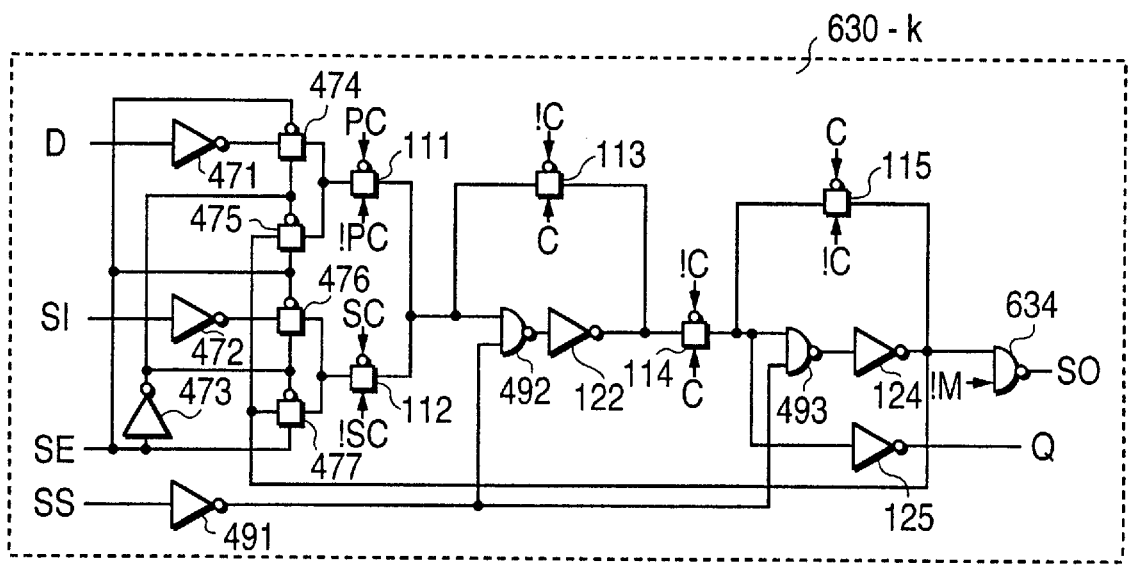
FIG. 38 is a diagram depicting a configuration of a scanpath circuit 630-K employed in a twenty-fifth embodiment of the present invention.

FIG. 38 is a diagram showing a circuit configuration of a scanpath circuit 630-K shown in a twenty-fifth embodiment of the present invention. The scanpath circuit 630-K comprises a combination of the scanpath circuit 230-K shown in the third embodiment and the scanpath circuit 490-K shown in the eleventh embodiment. In the present embodiment, the same elements of structure as those shown in the eleventh embodiment are identified by the same reference numerals. Incidentally, the control signal generating circuit 250 shown in FIG. 6 is used in the twenty-fifth embodiment.

A NAND 634 is newly added to the scanpath circuit 630-K shown in FIG. 38. The scanpath circuit 630-K is identical in other configurations to the scanpath circuit 490-K shown in FIG. 24.

The NAND 634 operates in a manner similar to the NAND 232 of the scanpath circuit 230-K shown in FIG. 7.

Owing to the above-described construction, the twenty-fifth embodiment has an advantageous effect of a combination of the advantageous effect obtained in the third embodiment and the advantageous effect obtained in the eleventh embodiment.

(Twenty-Sixth Embodiment)

Figure 39:
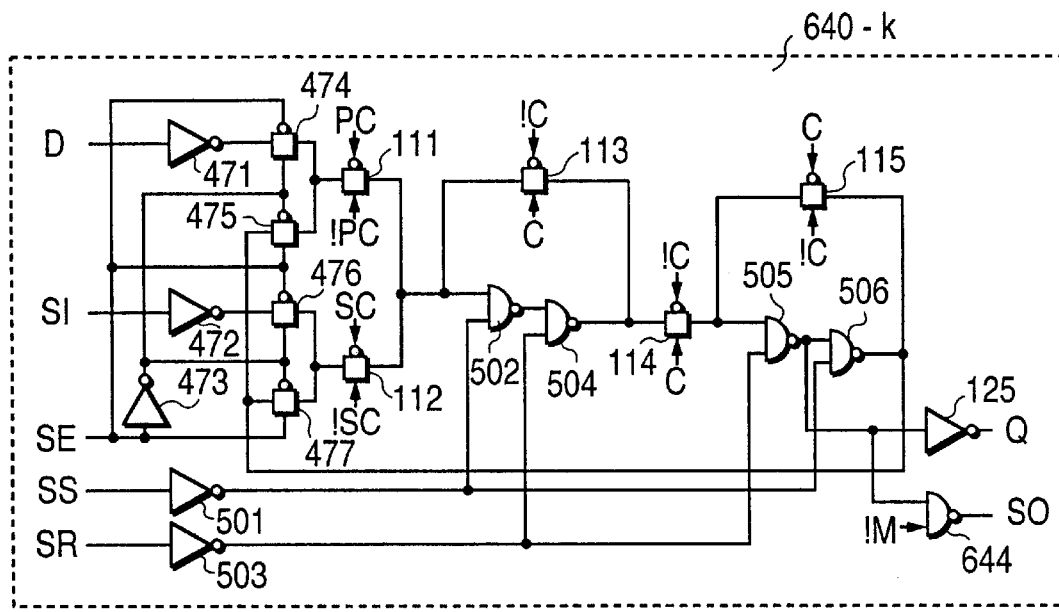
FIG. 39 is a diagram showing a configuration of a scanpath circuit 640-K employed in a twenty-sixth embodiment of the present invention.

FIG. 39 is a diagram showing a circuit configuration of a scanpath circuit 640-K shown in a twenty-sixth embodiment of the present invention. The scanpath circuit 640-K comprises a combination of the scanpath circuit 230-K shown in the third embodiment and the scanpath circuit 500-K shown in the twelfth embodiment. In the present embodiment, the same elements of structure as those shown in the twelfth embodiment are identified by the same reference numerals. Incidentally, the control signal generating circuit 250 shown in FIG. 6 is used in the twenty-sixth embodiment.

A NAND 644 is newly added to the scanpath circuit 640-K shown in FIG. 39. The scanpath circuit 640-K is identical in other configurations to the scanpath circuit 500-K shown in FIG. 25.

The NAND 644 operates in a manner similar to the NAND 232 of the scanpath circuit 230-K shown in FIG. 7.

Owing to the above-described construction, the twenty-sixth embodiment has an advantageous effect of a combination of the advantageous effect obtained in the third embodiment and the advantageous effect obtained in the twelfth embodiment.

(Twenty-Seventh Embodiment)

Figure 40:
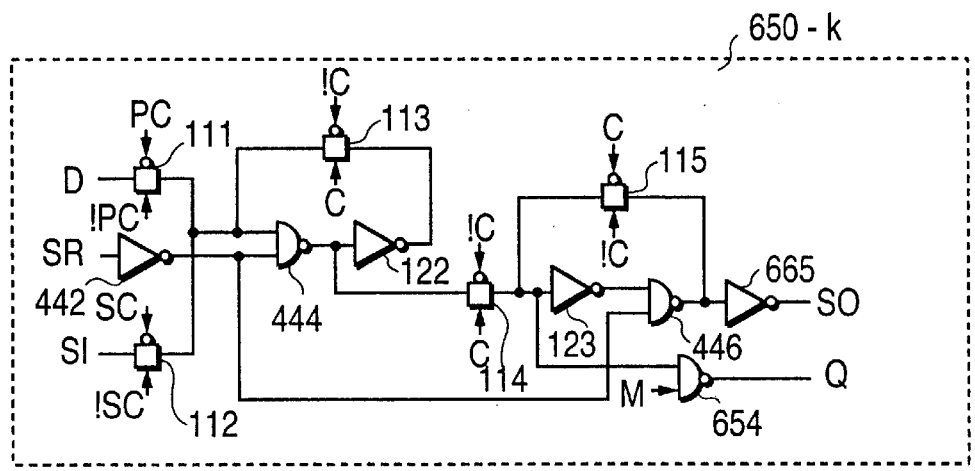
FIG. 40 is a diagram illustrating a configuration of a scanpath circuit 650-K employed in a twenty-seventh embodiment of the present invention.

FIG. 40 is a diagram showing a circuit configuration of a scanpath circuit 650-K shown in a twenty-seventh embodiment of the present invention. The scanpath circuit 650-K comprises a combination of the scanpath circuit 330-K shown in the fourth embodiment and the scanpath circuit 440-K shown in the sixth embodiment. In the present embodiment, the same elements of structure as those shown in the sixth embodiment are identified by the same reference numerals. Incidentally, the control signal generating circuit 350 shown in FIG. 9 is used in the twenty-seventh embodiment.

A NAND 654 is added to the scanpath circuit 650-K shown in FIG. 40 in place of the inverter 125 and an inverter 655 is newly added thereto. The scanpath circuit 650-K is identical in other configurations to the scanpath circuit 440-K shown in FIG. 15.

The NAND 654 and the inverter 655 operate in a manner similar to the NAND 332 and inverter 162 of the scanpath circuit 330-K shown in FIG. 10, respectively.

Owing to the above-described construction, the twenty-seventh embodiment has an advantageous effect of a combination of the advantageous effect obtained in the fourth embodiment and the advantageous effect obtained in the sixth embodiment.

(Twenty-Eighth Embodiment)

Figure 41:
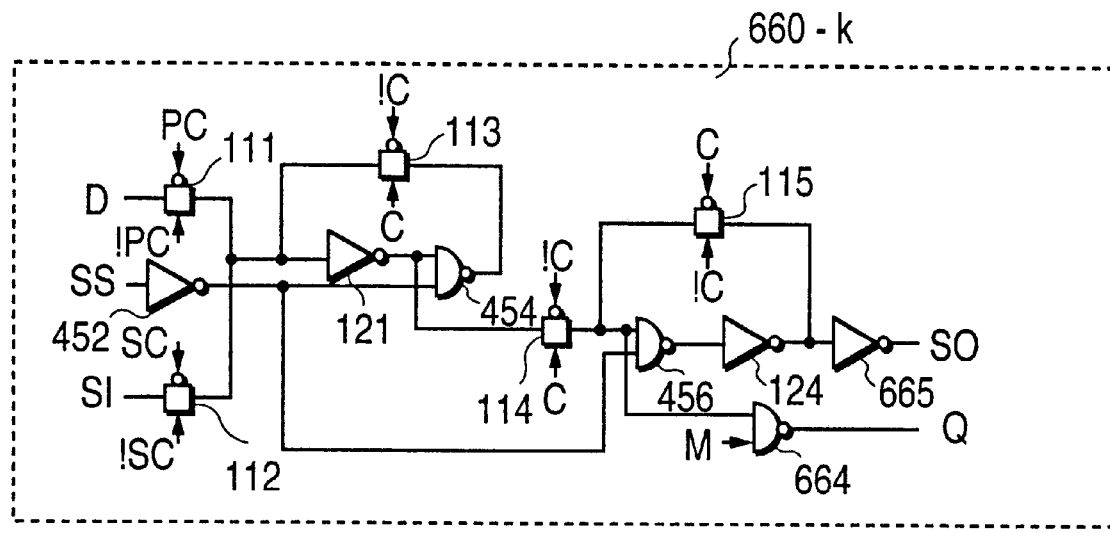
FIG. 41 is a diagram depicting a configuration of a scanpath circuit 660-K employed in a twenty-eighth embodiment of the present invention.

FIG. 41 is a diagram showing a circuit configuration of a scanpath circuit 660-K shown in a twenty-eighth embodiment of the present invention. The scanpath circuit 660-K comprises a combination of the scanpath circuit 330-K shown in the fourth embodiment and the scanpath circuit 450-K shown in the seventh embodiment. In the present embodiment, the same elements of structure as those shown in the seventh embodiment are identified by the same reference numerals. Incidentally, the control signal generating circuit 350 shown in FIG. 9 is used in the twenty-eighth embodiment.

A NAND 664 is added to the scanpath circuit 660-K shown in FIG. 41 in place of the inverter 125 and an inverter 665 is newly added thereto. The scanpath circuit 660-K is identical in other configurations to the scanpath circuit 450-K shown in FIG. 17.

The NAND 664 and the inverter 665 operate in a manner similar to the NAND 332 and inverter 162 of the scanpath circuit 330-K shown in FIG. 10, respectively.

Owing to the above-described construction, the twenty-eighth embodiment has an advantageous effect of a combination of the advantageous effect obtained in the fourth embodiment and the advantageous effect obtained in the seventh embodiment.

(Twenty-Ninth Embodiment)

Figure 42:
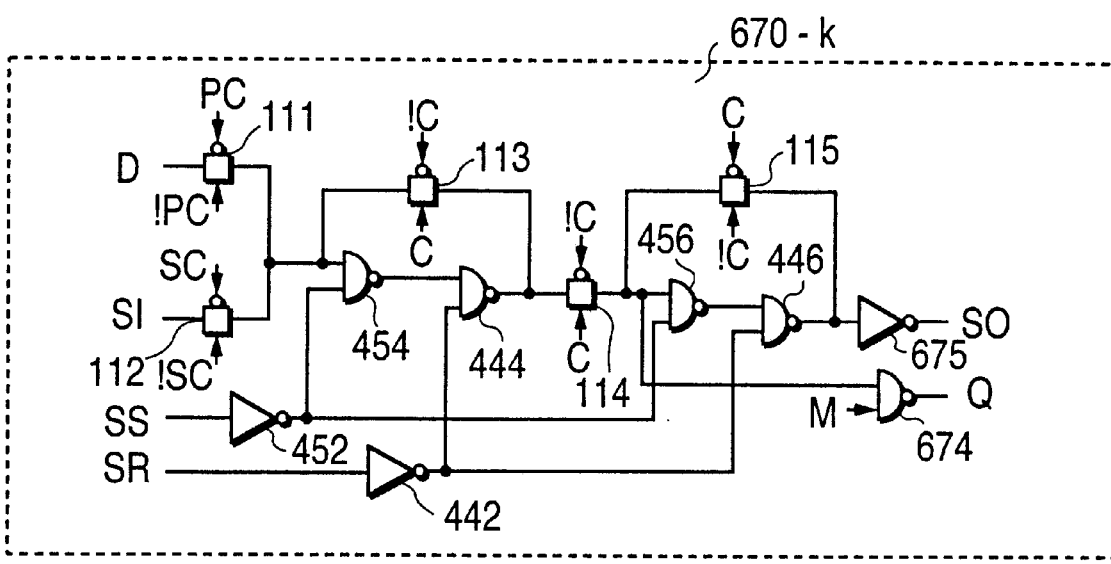
FIG. 42 is a diagram showing a configuration of a scanpath circuit 670-K employed in a twenty-ninth embodiment of the present invention.

FIG. 42 is a diagram showing a circuit configuration of a scanpath circuit 670-K shown in a twenty-ninth embodiment of the present invention. The scanpath circuit 670-K comprises a combination of the scanpath circuit 330-K shown in the fourth embodiment and the scanpath circuit 460-K shown in the eighth embodiment. In the present embodiment, the same elements of structure as those shown in the eighth embodiment are identified by the same reference numerals. Incidentally, the control signal generating circuit 350 shown in FIG. 9 is used in the twenty-ninth embodiment.

A NAND 674 is added to the scanpath circuit 670-K shown in FIG. 42 in place of the inverter 125 and an inverter 675 is newly added thereto. The scanpath circuit 670-K is identical in other configurations to the scanpath circuit 460-K shown in FIG. 19.

The NAND 674 and the inverter 675 operate in a manner similar to the NAND 332 and inverter 162 of the scanpath circuit 330-K shown in FIG. 10, respectively.

Owing to the above-described construction, the twenty-ninth embodiment has an advantageous effect of a combination of the advantageous effect obtained in the fourth embodiment and the advantageous effect obtained in the eighth embodiment.

(Thirtieth Embodiment)

Figure 43:
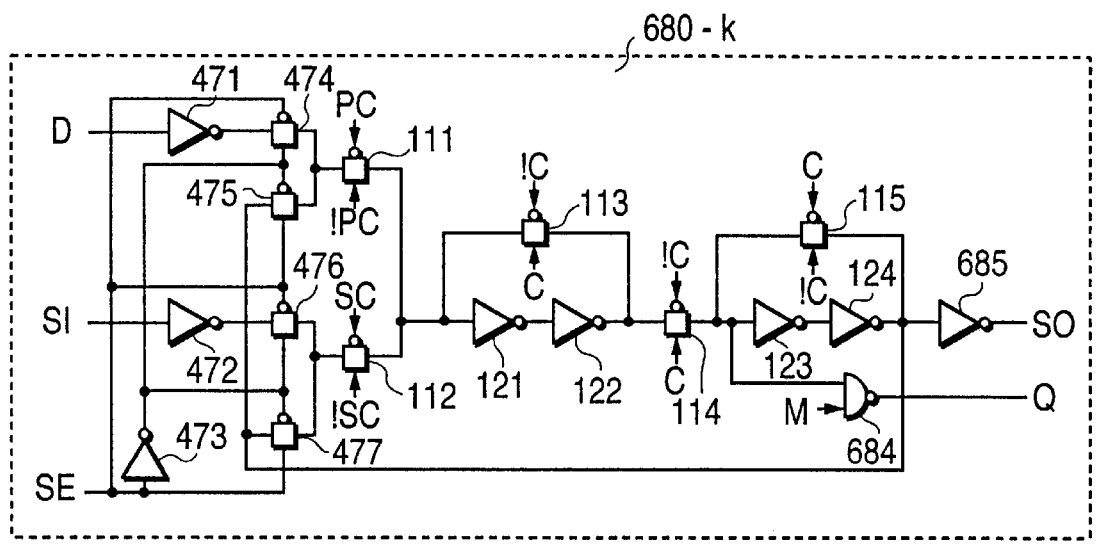
FIG. 43 is a diagram illustrating a configuration of a scanpath circuit 680-K employed in a thirtieth embodiment of the present invention.

FIG. 43 is a diagram showing a circuit configuration of a scanpath circuit 680-K shown in a thirtieth embodiment of the present invention. The scanpath circuit 680-K comprises a combination of the scanpath circuit 330-K shown in the fourth embodiment and the scanpath circuit 470-K shown in the ninth embodiment. In the present embodiment, the same elements of structure as those shown in the ninth embodiment are identified by the same reference numerals. Incidentally, the control signal generating circuit 350 shown in FIG. 9 is used in the thirtieth embodiment.

A NAND 684 is added to the scanpath circuit 680-K shown in FIG. 43 in place of the inverter 125 and an inverter 685 is newly added thereto. The scanpath circuit 680-K is identical in other configurations to the scanpath circuit 470-K shown in FIG. 21.

The NAND 684 and the inverter 685 operate in a manner similar to the NAND 332 and inverter 162 of the scanpath circuit 330-K shown in FIG. 10, respectively.

Owing to the above-described construction, the thirtieth embodiment has an advantageous effect of a combination of the advantageous effect obtained in the fourth embodiment and the advantageous effect obtained in the ninth embodiment.

(Thirty-First Embodiment)

Figure 44:
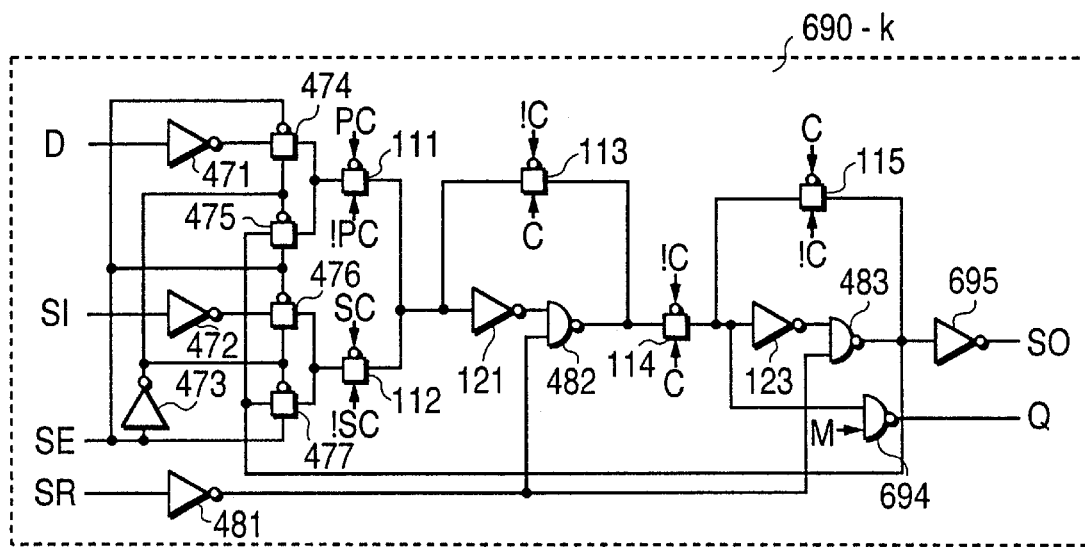
FIG. 44 is a diagram depicting a configuration of a scanpath circuit 690-K employed in a thirty-first embodiment of the present invention.

FIG. 44 is a diagram showing a circuit configuration of a scanpath circuit 690-K shown in a thirty-first embodiment of the present invention. The scanpath circuit 690-K comprises a combination of the scanpath circuit 330-K shown in the fourth embodiment and the scanpath circuit 480-K shown in the tenth embodiment. In the present embodiment, the same elements of structure as those shown in the tenth embodiment are identified by the same reference numerals. Incidentally, the control signal generating circuit 350 shown in FIG. 9 is used in the thirty-first embodiment.

A NAND 694 is added to the scanpath circuit 690-K shown in FIG. 44 in place of the inverter 125 and an inverter 695 is newly added thereto. The scanpath circuit 690-K is identical in other configurations to the scanpath circuit 480-K shown in FIG. 23.

The NAND 694 and the inverter 695 operate in a manner similar to the NAND 332 and inverter 162 of the scanpath circuit 330-K shown in FIG. 10, respectively.

Owing to the above-described construction, the thirty-first embodiment has an advantageous effect of a combination of the advantageous effect obtained in the fourth embodiment and the advantageous effect obtained in the tenth embodiment.

(Thirty-Second Embodiment)

Figure 45:
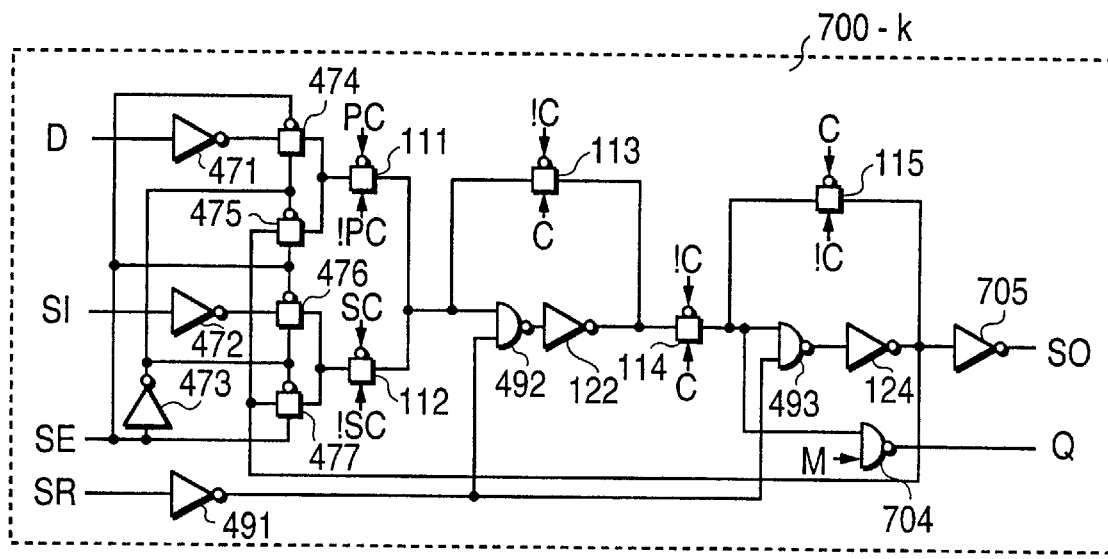
FIG. 45 is a diagram showing a configuration of a scanpath circuit 700-K employed in a thirty-second embodiment of the present invention.

FIG. 45 is a diagram showing a circuit configuration of a scanpath circuit 700-K shown in a thirty-second embodiment of t he present invention. The scanpath circuit 700-K comprises a combination of the scanpath circuit 330-K shown in the fourth embodiment and the scanpath circuit 490-K shown in the eleventh embodiment. In the present embodiment, the same elements of structure as those shown in the eleventh embodiment are identified by the same reference numerals. Incidentally, the control signal generating circuit 350 shown in FIG. 9 is used in the thirty-second embodiment.

A NAND 704 is added to the scanpath circuit 700-K shown in FIG. 45 in place of the inverter 125 and an inverter 705 is newly added thereto. The scanpath circuit 700-K is identical in other configurations to the scanpath circuit 490-K shown in FIG. 24.

The NAND 704 and the inverter 705 operate in a manner similar to the NAND 332 and inverter 162 of the scanpath circuit 330-K shown in FIG. 10, respectively.

Owing to the above-described construction, the thirty-second embodiment has an advantageous effect of a combination of the advantageous effect obtained in the fourth embodiment and the advantageous effect obtained in the eleventh embodiment.

(Thirty-Third Embodiment)

Figure 46:
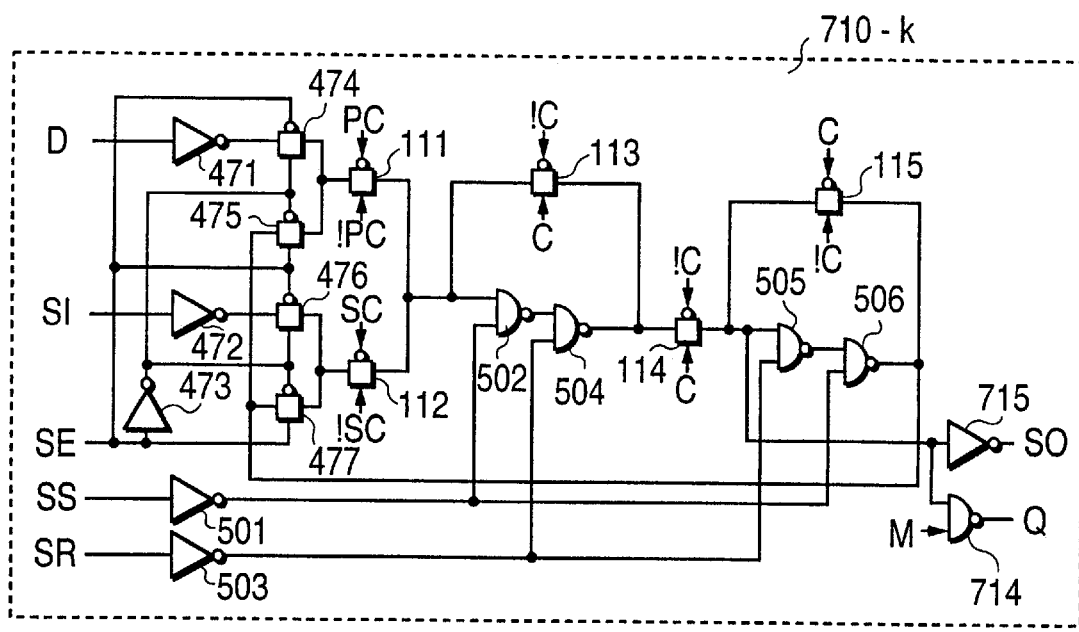
FIG. 46 is a diagram illustrating a configuration of a scanpath circuit 710-K employed in a thirty-third embodiment of the present invention.

FIG. 46 is a diagram showing a circuit configuration of a scanpath circuit 710-K shown in a thirty-third embodiment of the present invention. The scanpath circuit 710-K comprises a combination of the scanpath circuit 330-K shown in the fourth embodiment and the scanpath circuit 500-K shown in the twelfth embodiment. In the present embodiment, the same elements of structure as those shown in the twelfth embodiment are identified by the same reference numerals. Incidentally, the control signal generating circuit 350 shown in FIG. 9 is used in the thirty-third embodiment.

A NAND 714 is added to the scanpath circuit 710-K shown in FIG. 46 in place of the inverter 125 and an inverter 715 is newly added thereto. The scanpath circuit 710-K is identical in other configurations to the scanpath circuit 500-K shown in FIG. 25.

The NAND 714 and the inverter 715 operate in a manner similar to the NAND 332 and inverter 162 of the scanpath circuit 330-K shown in FIG. 10, respectively.

Owing to the above-described construction, the thirty-third embodiment has an advantageous effect of a combination of the advantageous effect obtained in the fourth embodiment and the advantageous effect obtained in the twelfth embodiment.

(Thirty-Fourth Embodiment)

Figure 47:
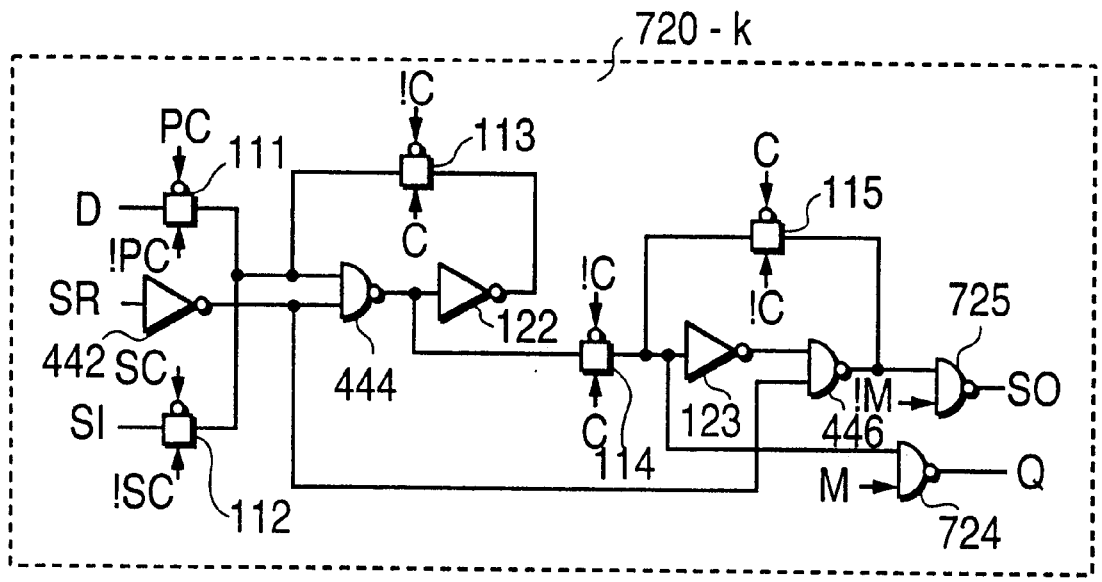
FIG. 47 is a diagram depicting a configuration of a scanpath circuit 720-K employed in a thirty-fourth embodiment of the present invention.

FIG. 47 is a diagram showing a circuit configuration of a scanpath circuit 720-K shown in a thirty-fourth embodiment of the present invention. The scanpath circuit 720-K comprises a combination of the scanpath circuit 430-K shown in the fifth embodiment and the scanpath circuit 440-K shown in the sixth embodiment. In the present embodiment, the same elements of structure as those shown in the sixth embodiment are identified by the same reference numerals. Incidentally, the control signal generating circuit 450 shown in FIG. 12 is used in the thirty-fourth embodiment.

A NAND 724 is added to the scanpath circuit 720-K shown in FIG. 47 in place of the inverter 125 and a NAND 725 is newly added thereto. The scanpath circuit 720-K is identical in other configurations to the scanpath circuit 440-K shown in FIG. 15.

The NANDs 724 and 725 operate in a manner similar to the NANDs 332 and 232 of the scanpath circuit 430-K shown in FIG. 13, respectively.

Owing to the above-described construction, the thirty-fourth embodiment has an advantageous effect of a combination of the advantageous effect obtained in the fifth embodiment and the advantageous effect obtained in the sixth embodiment.

(Thirty-Fifth Embodiment)

Figure 48:
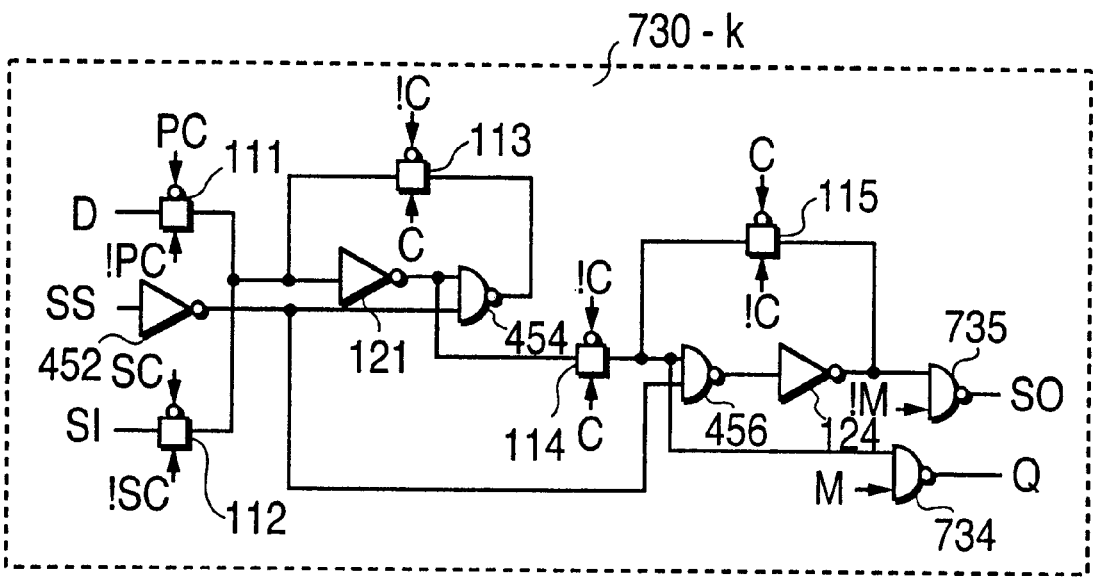
FIG. 48 is a diagram showing a configuration of a scanpath circuit 730-K employed in a thirty-fifth embodiment of the present invention.

FIG. 48 is a diagram showing a circuit configuration of a scanpath circuit 730-K shown in a thirty-fifth embodiment of the present invention. The scanpath circuit 730-K comprises a combination of the scanpath circuit 430-K shown in the fifth embodiment and the scanpath circuit 450-K shown in the seventh embodiment. In the present embodiment, the same elements of structure as those shown in the seventh embodiment are identified by the same reference numerals. Incidentally, the control signal generating circuit 450 shown in FIG. 12 is used in the thirty-fifth embodiment.

A NAND 734 is added to the scanpath circuit 730-K shown in FIG. 48 in place of the inverter 125 and a NAND 735 is newly added thereto. The scanpath circuit 730-K is identical in other configurations to the scanpath circuit 450-K shown in FIG. 17.

The NANDs 734 and 735 operate in a manner similar to the NANDs 332 and 232 of the scanpath circuit 430-K shown in FIG. 13, respectively.

Owing to the above-described construction, the thirty-fifth embodiment has an advantageous effect of a combination of the advantageous effect obtained in the fifth embodiment and the advantageous effect obtained in the seventh embodiment.

(Thirty-Sixth Embodiment)

Figure 49:
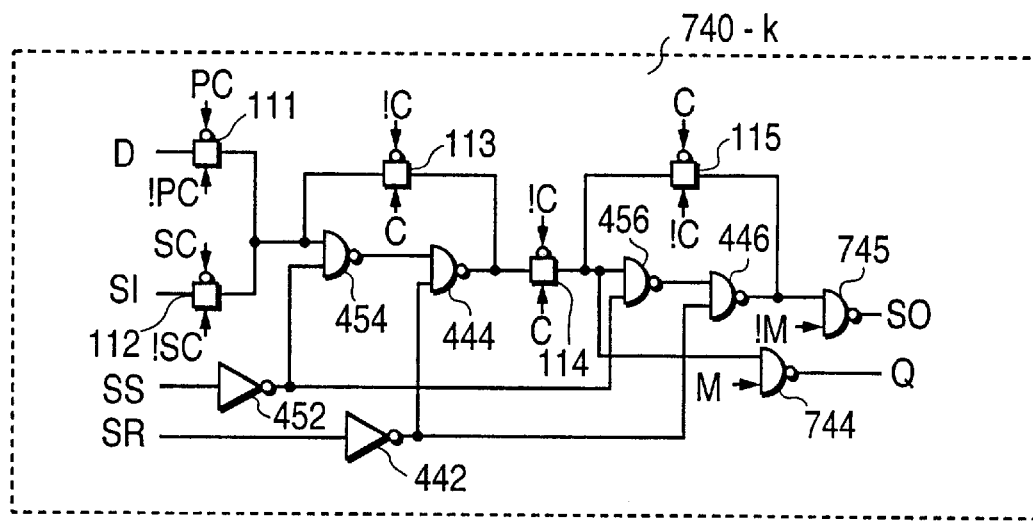
FIG. 49 is a diagram illustrating a configuration of a scanpath circuit 740-K employed in a thirty-sixth embodiment of the present invention.

FIG. 49 is a diagram showing a circuit configuration of a scanpath circuit 740-K shown in a thirty-sixth embodiment of the present invention. The scanpath circuit 740-K comprises a combination of the scanpath circuit 430-K shown in the fifth embodiment and the scanpath circuit 460-K shown in the eighth embodiment. In the present embodiment, the same elements of structure as those shown in the eighth embodiment are identified by the same reference numerals. Incidentally, the control signal generating circuit 450 shown in FIG. 12 is used in the thirty-sixth embodiment.

A NAND 744 is added to the scanpath circuit 740-K shown in FIG. 49 in place of the inverter 125 and a NAND 745 is newly added thereto. The scanpath circuit 740-K is identical in other configurations to the scanpath circuit 460-K shown in FIG. 19.

The NANDs 744 and 745 operate in a manner similar to the NANDs 332 and 232 of the scanpath circuit 430-K shown in FIG. 13, respectively.

Owing to the above-described construction, the thirty-sixth embodiment has an advantageous effect of a combination of the advantageous effect obtained in the fifth embodiment and the advantageous effect obtained in the eighth embodiment.

(Thirty-Seventh Embodiment)

Figure 50:
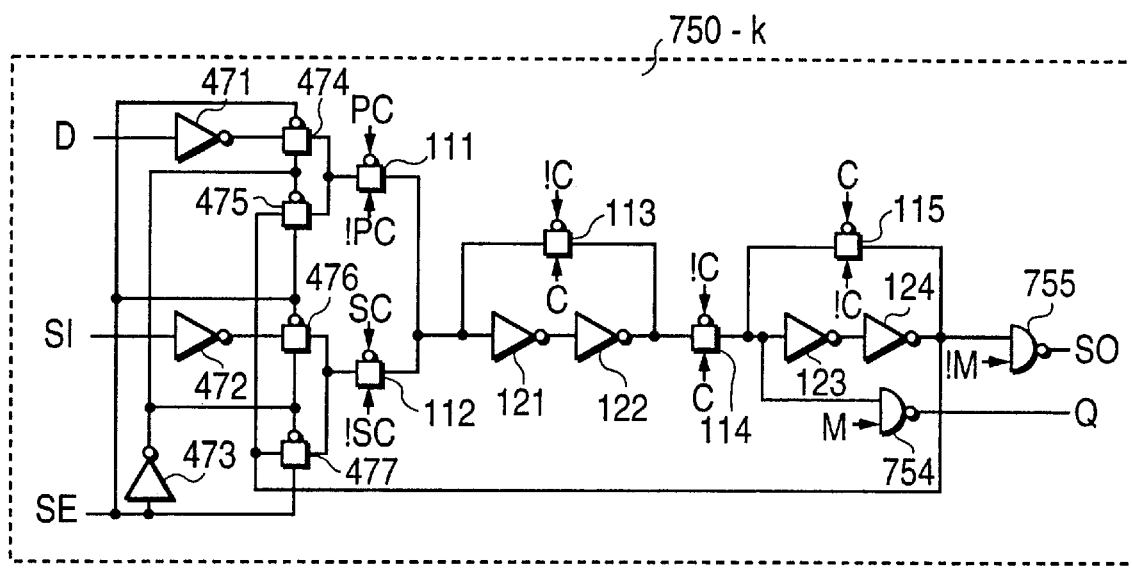
FIG. 50 is a diagram depicting a configuration of a scanpath circuit 750-K employed in a thirty-seventh embodiment of the present invention.

FIG. 50 is a diagram showing a circuit configuration of a scanpath circuit 750-K shown in a thirty-seventh embodiment of the present invention. The scanpath circuit 750-K comprises a combination of the scanpath circuit 430-K shown in the fifth embodiment and the scanpath circuit 470-K shown in the ninth embodiment. In the present embodiment, the same elements of structure as those shown in the ninth embodiment are identified by the same reference numerals. Incidentally, the control signal generating circuit 450 shown in FIG. 12 is used in the thirty-seventh embodiment.

A NAND 754 is added to the scanpath circuit 750-K shown in FIG. 50 in place of the inverter 125 and a NAND 755 is newly added thereto. The scanpath circuit 750-K is identical in other configurations to the scanpath circuit 470-K shown in FIG. 21.

The NANDs 754 and 755 operate in a manner similar to the NANDs 332 and 232 of the scanpath circuit 430-K shown in FIG. 13, respectively.

Owing to the above-described construction, the thirty-seventh embodiment has an advantageous effect of a combination of the advantageous effect obtained in the fifth embodiment and the advantageous effect obtained in the ninth embodiment.

(Thirty-Eighth Embodiment)

Figure 51:
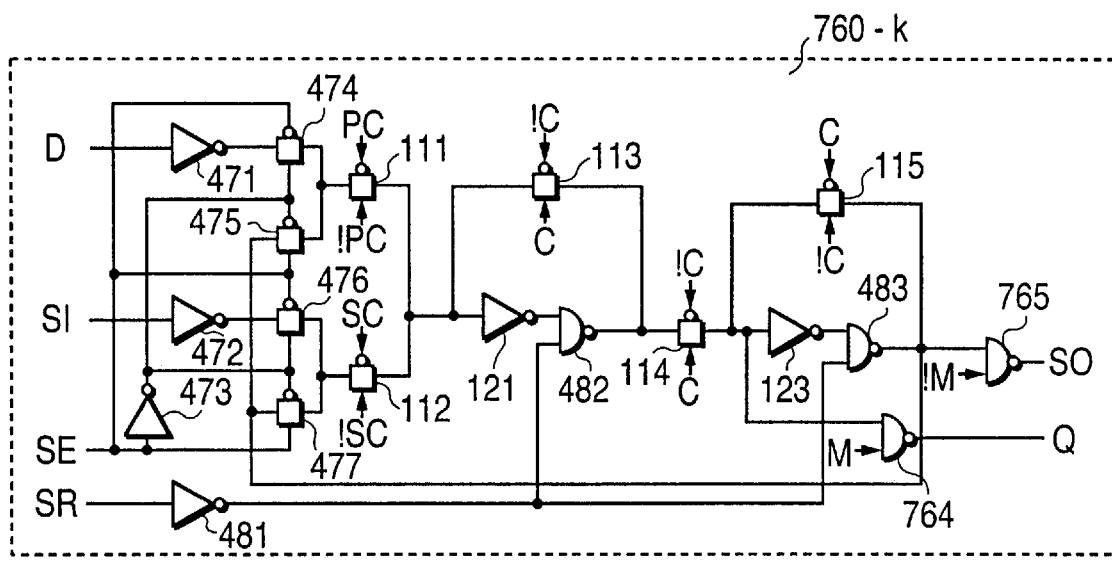
FIG. 51 is a diagram showing a configuration of a scanpath circuit 760-K employed in a thirty-eighth embodiment of the present invention.

FIG. 51 is a diagram showing a circuit configuration of a scanpath circuit 760-K shown in a thirty-eighth embodiment of the present invention. The scanpath circuit 760-K comprises a combination of the scanpath circuit 430-K shown in the fifth embodiment and the scanpath circuit 480-K shown in the tenth embodiment. In the present embodiment, the same elements of structure as those shown in the tenth embodiment are identified by the same reference numerals. Incidentally, the control signal generating circuit 450 shown in FIG. 12 is used in the thirty-eighth embodiment.

A NAND 764 is added to the scanpath circuit 760-K shown in FIG. 51 in place of the inverter 125 and a NAND 765 is newly added thereto. The scanpath circuit 760-K is identical in other configurations to the scanpath circuit 480-K shown in FIG. 23.

The NANDs 764 and 765 operate in a manner similar to the NANDs 332 and 232 of the scanpath circuit 430-K shown in FIG. 13, respectively.

Owing to the above-described construction, the thirty-eighth embodiment has an advantageous effect of a combination of the advantageous effect obtained in the fifth embodiment and the advantageous effect obtained in the tenth embodiment.

(Thirty-Ninth Embodiment)

Figure 52:
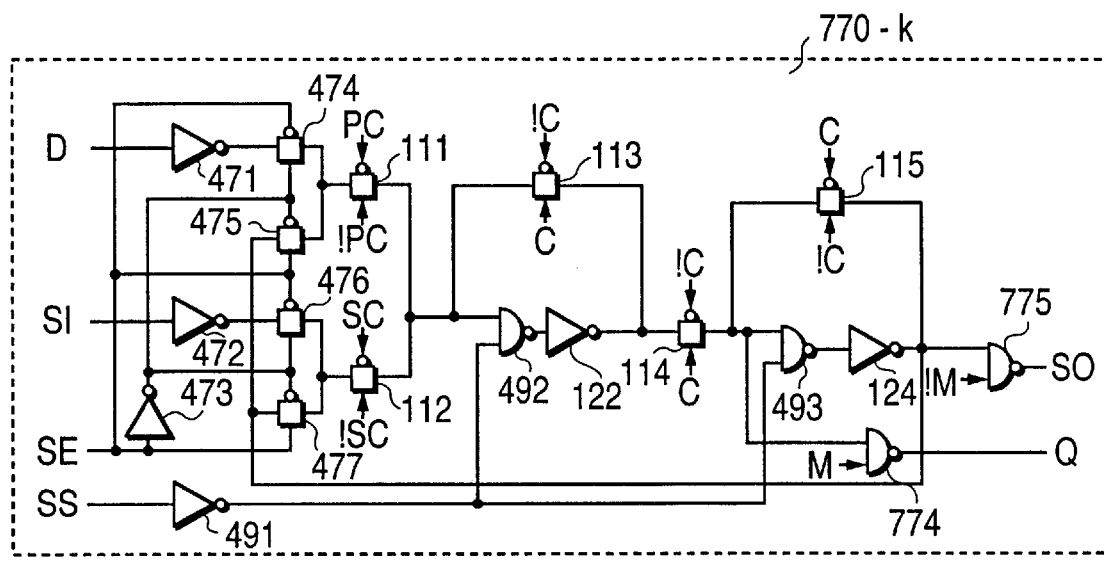
FIG. 52 is a diagram illustrating a configuration of a scanpath circuit 770-K employed in a thirty-ninth embodiment of the present invention.

FIG. 52 is a diagram showing a circuit configuration of a scanpath circuit 770-K shown in a thirty-ninth embodiment of the present invention. The scanpath circuit 770-K comprises a combination of the scanpath circuit 430-K shown in the fifth embodiment and the scanpath circuit 490-K shown in the eleventh embodiment. In the present embodiment, the same elements of structure as those shown in the eleventh embodiment are identified by the same reference numerals. Incidentally, the control signal generating circuit 450 shown in FIG. 12 is used in the thirty-ninth embodiment.

A NAND 774 is added to the scanpath circuit 770-K shown in FIG. 52 in place of the inverter 125 and a NAND 775 is newly added thereto. The scanpath circuit 770-K is identical in other configurations to the scanpath circuit 490-K shown in FIG. 24.

The NANDs 774 and 775 operate in a manner similar to the NANDs 332 and 232 of the scanpath circuit 430-K shown in FIG. 13, respectively.

Owing to the above-described construction, the thirty-ninth embodiment has an advantageous effect of a combination of the advantageous effect obtained in the fifth embodiment and the advantageous effect obtained in the eleventh embodiment.

(Fortieth Embodiment)

Figure 53:
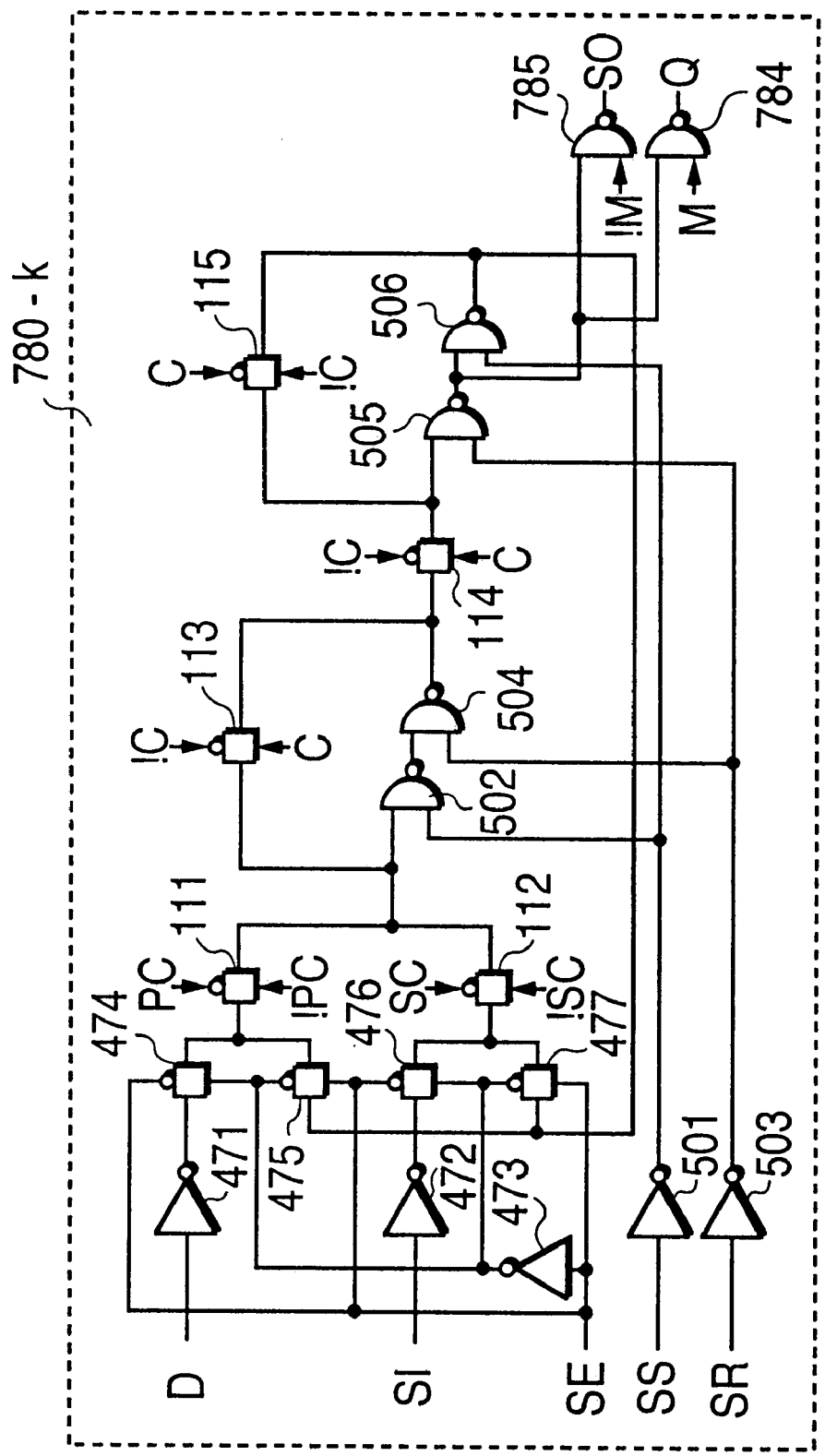
FIG. 53 is a diagram showing a configuration of a scanpath circuit 780-K employed in a fortieth embodiment of the present invention.

FIG. 53 is a diagram showing a circuit configuration of a scanpath circuit 780-K shown in a fortieth embodiment of the present invention. The scanpath circuit 780-K comprises a combination of the scanpath circuit 430-K shown in the fifth embodiment and the scanpath circuit 500-K shown in the twelfth embodiment. In the present embodiment, the same elements of structure as those shown in the twelfth embodiment are identified by the same reference numerals. Incidentally, the control signal generating circuit 450 shown in FIG. 12 is used in the fortieth embodiment.

A NAND 784 is added to the scanpath circuit 780-K shown in FIG. 53 in place of the inverter 125 and a NAND 785 is newly added thereto. The scanpath circuit 780-K is identical in other configurations to the scanpath circuit 500-K shown in FIG. 25.

The NANDs 784 and 785 operate in a manner similar to the NANDs 332 and 232 of the scanpath circuit 430-K shown in FIG. 13, respectively.

Owing to the above-described construction, the fortieth embodiment has an advantageous effect of a combination of the advantageous effect obtained in the fifth embodiment and the advantageous effect obtained in the twelfth embodiment.

Although the invention of the present application has been described above in detail, the invention is not necessarily limited to the configurations of the above-described embodiments. If the same operations as described above can be implemented, for example, then various changes in circuit configuration are taken into consideration. For example, the PMOS and NMOS may be used in reverse in the aforementioned embodiments. Alternatively, the NAND and NOR may be replaced by other logic circuits. Further, the PMOS andNMOS maybe other gate means. While the control signal generating circuits 150, 250, 350 and 450 are respectively shared between the plurality of scanpath circuits, they may be provided within the scanpath circuits respectively.

As described above, the invention of the present application can bring a semiconductor integrated circuit into less size.

The invention of the present application can also provide a reduction in power consumption.

Further, the invention of the present application allows a reduction in clock skew (timing shift of a clock signal).

Moreover, the invention of the present application allows a predetermined initial value to be stored in a control register, a flag register or the like upon resetting of hardware if a semiconductor integrated circuit is a DSP, a microprocessor or the like.

Still further, the invention of the present application permits the usual supply of a clock signal to a scanpath register and the storage of a data signal inputted as needed therein in this condition.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit comprising:
    a plurality of processing circuits that respectively execute necessary processes;
    a plurality of data holding circuits respectively provided so as to correspond to said plurality of processing circuits, said plurality of data holding circuits being respectively activated independently in a first operating mode and activated as shift registers by being cascade-connected in a second operating mode;
    each of said data holding circuits including
        a first data input terminal supplied with first data output from a corresponding processing circuit,
        a second data input terminal supplied with second data output from another data holding circuit,
        a first output terminal,
        a clock input terminal supplied with a clock signal,
        a gate circuit electrically connected with said first and second data input terminals, said gate circuit outputs the first data as third data based on a first control signal and outputs the second data as the third data based on a second control signal, and
        a latch circuit electrically connected with said gate circuit, said first output terminal, and said clock input terminal, said latch circuit latches the third data in accordance with the clock signal and outputs the latched data from said first output terminal; and
    a control signal generating circuit electrically connected with said data holding circuits, said control signal generating circuit having input terminals respectively receiving a mode signal indicative of the first operating mode or the second operating mode, a first clock signal and a second clock signal, said control signal generating circuit generates and outputs the first control signal, the second control signal, and the clock signal based on states of the signals input thereto.

2. The semiconductor integrated circuit according to claim 1, wherein each of said data holding circuits has a second output terminal separated from said first output terminal, that outputs a signal having a logic level similar to a logic level of a signal output from said first output terminal.

3. The semiconductor integrated circuit according to claim 2, wherein each of said data holding circuits has a prohibiting circuit that prohibits output of a signal from said first output terminal or said second output terminal in response to an operating mode setting signal.

4. The semiconductor integrated circuit according to claim 3, wherein the operating mode setting signal is generated from the mode signal.

5. The semiconductor integrated circuit according to claim 3, wherein each of said data holding circuits has a setting circuit capable of setting an initial value according to a setting signal.

6. The semiconductor integrated circuit according to claim 3, wherein each of said data holding circuits has a data holding control circuit that prohibits input of the data from said first and second data input terminals and that holds the latched data according to a holding signal.

7. The semiconductor integrated circuit according to claim 2, wherein each of said data holding circuits has a setting circuit capable of setting an initial value according to a setting signal.

8. The semiconductor integrated circuit according to claim 2, wherein each of said data holding circuits has a data holding control circuit that prohibits input of the data from said first and second data input terminals and that holds the latched data according to a holding signal.

9. The semiconductor integrated circuit according to claim 1, wherein each of said data holding circuits has a setting circuit capable of setting an initial value according to a setting signal.

10. The semiconductor integrated circuit according to claim 1, wherein each of said data holding circuits has a data holding control circuit that prohibits input of the data from said first and second data input terminals and that holds the latched data according to a holding signal.

11. The semiconductor integrated circuit according to claim 1, wherein a logic level of the first control signal changes based on the first clock signal, and a logic level of the second control signal changes based on the second clock signal.

12. The semiconductor integrated circuit according to claim 11, wherein a logic level of the clock signal changes based on the first or second clock signals.

13. The semiconductor integrated circuit according to claim 1, wherein a logic level of the clock signal changes based on the first or second clock signals.

14. The semiconductor integrated circuit according to claim 1, wherein the first clock signal is different from the second clock signal.

15. A semiconductor integrated circuit comprising:
    a plurality of processing circuits that respectively execute corresponding processes;
    a plurality of data holding circuits that are respectively coupled to corresponding pairs of said plurality of processing circuits, said plurality of data holding circuits each being operable in a first mode to pass processed data between the corresponding pairs of said plurality of processing circuits and in a second mode as shift registers cascade-connected to pass test data through said plurality of data holding circuits;
    a scanpath input terminal that receives and provides the test data directly to a test input terminal of a first data holding circuit of said plurality of data holding circuits; and
    a control signal generating circuit that receives first and second clock signals and a mode signal, and that generates a system clock signal that directly controls timing of said plurality of data holding circuits and that generates control signals that control said plurality of data holding circuits to selectively latch the corresponding test data or the corresponding processed data at each of said data holding circuits.

16. The semiconductor integrated circuit of claim 15, further comprising a scanpath output terminal that is coupled to an output of a last data holding circuit of said plurality of data holding circuits and that outputs the test data passed through said plurality of data holding circuits.

17. The semiconductor integrated circuit of claim 15, wherein each of said plurality of data holding circuits has a setting circuit that sets on initial value in accordance with a setting signal.

18. The semiconductor integrated circuit of claim 15, wherein each of said plurality of data holding circuits has a data holding control circuit that prohibits input of the corresponding test data and the corresponding processed data thereto.

* * * * *